US012408487B2

(12) United States Patent
Min et al.

(10) Patent No.: US 12,408,487 B2
(45) Date of Patent: Sep. 2, 2025

(54) LIGHT-EMITTING ELEMENT AND DISPLAY DEVICE INCLUDING SAME

(71) Applicant: Samsung Display Co., Ltd., Yongin-si (KR)

(72) Inventors: Jung Hong Min, Yongin-si (KR); Dae Hyun Kim, Yongin-si (KR); Dong Uk Kim, Yongin-si (KR); Hyun Min Cho, Yongin-si (KR); Se Young Kim, Yongin-si (KR); Seung A Lee, Yongin-si (KR); Hyung Rae Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 529 days.

(21) Appl. No.: 17/310,745

(22) PCT Filed: Aug. 20, 2019

(86) PCT No.: PCT/KR2019/010600
§ 371 (c)(1),
(2) Date: Aug. 20, 2021

(87) PCT Pub. No.: WO2020/171322
PCT Pub. Date: Aug. 27, 2020

(65) Prior Publication Data
US 2022/0140186 A1    May 5, 2022

(30) Foreign Application Priority Data
Feb. 21, 2019    (KR) .................. 10-2019-0020727

(51) Int. Cl.
*H10H 20/821*    (2025.01)
*H10H 20/831*    (2025.01)
(Continued)

(52) U.S. Cl.
CPC ...... *H10H 20/821* (2025.01); *H10H 20/8312* (2025.01); *H10H 20/857* (2025.01); *H10H 29/142* (2025.01)

(58) Field of Classification Search
CPC ......... H01L 33/24; H01L 33/38; H01L 33/42; H01L 27/156; H10H 20/821; H10H 20/831; H10D 86/451
See application file for complete search history.

(56) References Cited

U.S. PATENT DOCUMENTS 8,872,214 B2    10/2014    Negishi et al.
8,895,955 B2    11/2014    Kim et al.
(Continued)

FOREIGN PATENT DOCUMENTS

CN    103283045 A    9/2013
CN    107610602 A    1/2018
(Continued)

OTHER PUBLICATIONS

KR20120122160A machine translation (Year: 2023).*
(Continued)

*Primary Examiner* — Vincent Wall
(74) *Attorney, Agent, or Firm* — Womble Bond Dickinson (US) LLP

(57) ABSTRACT

A light emitting element may include an emission stacked pattern including a first conductive semiconductor layer, an active layer, and a second conductive semiconductor layer that are stacked in a longitudinal direction of the emission stacked pattern. The active layer may include a first surface that is in contact with the first conductive semiconductor layer in the longitudinal direction of the emission stacked pattern, and a second surface that is opposite the first surface and is in contact with the second conductive semiconductor layer. The first conductive semiconductor layer may include
(Continued)

at least one n-type semiconductor layer, and the second conductive semiconductor layer may include at least one p-type semiconductor layer. Further, the first surface of the active layer may be located at a point corresponding to −20% to +20% of half of a total length of the emission stacked pattern in the longitudinal direction of the emission stacked pattern.

18 Claims, 23 Drawing Sheets

(51) Int. Cl.
 *H10H 20/857* (2025.01)
 *H10H 29/14* (2025.01)

(56) References Cited

U.S. PATENT DOCUMENTS

| | | | |
|---|---|---|---|
| 9,112,112 | B2 | 8/2015 | Do et al. |
| 9,136,432 | B2 | 9/2015 | Yun et al. |
| 9,978,725 | B2 | 5/2018 | Do |
| 10,249,603 | B2 | 4/2019 | Cho et al. |
| 10,340,419 | B2 | 7/2019 | Kim et al. |
| 10,461,123 | B2 | 10/2019 | Kim et al. |
| 10,672,946 | B2 | 6/2020 | Cho et al. |
| 10,818,647 | B2 | 10/2020 | Kim et al. |
| 2006/0043392 | A1 | 3/2006 | Kurahashi et al. |
| 2012/0223289 | A1 | 9/2012 | Gwo et al. |
| 2013/0240348 | A1 | 9/2013 | Mi et al. |
| 2016/0027961 | A1 | 1/2016 | Mi et al. |
| 2018/0012876 | A1* | 1/2018 | Kim ................ H01L 33/387 |
| 2018/0287010 | A1* | 10/2018 | Sung ................ B82B 3/0066 |

FOREIGN PATENT DOCUMENTS

| | | | |
|---|---|---|---|
| KR | 10-2012-0122160 A | | 11/2012 |
| KR | 20120122160 A | * | 11/2012 |
| KR | 10-1244926 B1 | | 3/2013 |
| KR | 10-1289602 B1 | | 7/2013 |
| KR | 10-1429095 B1 | | 8/2014 |
| KR | 10-1496151 B1 | | 2/2015 |
| KR | 10-2016-0059569 A | | 5/2016 |
| KR | 10-2016-0059574 A | | 5/2016 |
| KR | 10-2016-0059576 A | | 5/2016 |
| KR | 10-2018-0007025 A | | 1/2018 |
| KR | 10-2018-0007376 A | | 1/2018 |
| KR | 10-2018-0009014 A | | 1/2018 |
| KR | 10-2018-0072909 A | | 7/2018 |
| KR | 10-1987196 B1 | | 6/2019 |

OTHER PUBLICATIONS

International Search Report for corresponding Application No. PCT/KR2019/010600 dated Nov. 28, 2019, 4pp.
Written Opinion for corresponding Application No. PCT/KR2019/010600 dated Nov. 28, 2019, 10pp.
Notice of Allowance dated Aug. 25, 2024 issued in corresponding Korean Patent Application No. 10-2019-0020727 (7 pages).

* cited by examiner

LIGHT-EMITTING ELEMENT AND DISPLAY DEVICE INCLUDING SAME

CROSS-REFERENCE TO RELATED APPLICATIONS

This application is a U.S. National Phase Patent Application of International Patent Application Number PCT/KR2019/010600, filed on Aug. 20, 2019, which claims priority to Korean Patent Application Number 10-2019-0020727, filed on Feb. 21, 2019, the entire contents of all of which are incorporated herein by reference.

BACKGROUND

1. Field

Various embodiments of the present disclosure relate to a light emitting element, and more particularly, to a subminiature light emitting element and a display device having the same.

DESCRIPTION OF THE RELATED ART

A light emitting diode (LED) may have relatively satisfactory durability even under poor environmental conditions, and have excellent performances in terms of lifetime and luminance. Recently, research on the technology of applying such LEDs to various display devices has become appreciably more active.

As a part of such research, technologies of fabricating a LED having a very small size corresponding to a range from a micrometer scale to a nanometer scale using an inorganic crystalline structure, e.g., a structure obtained by growing a nitride-based semiconductor are being developed. The LEDs may be fabricated in a small size enough to form a pixel of a display panel, etc. After the LEDs are independently grown on a substrate, the grown LEDs may be separated and used to manufacture the display panel.

SUMMARY

One or more aspects and features of embodiments of the present disclosure are to provide a light emitting element that places an active layer interposed between two semiconductor layers having different conductivity in a center in a longitudinal direction, thus improving light emission efficiency.

Furthermore, one or more other aspects and features pf embodiments of the present disclosure are to provide a display device having the above-described light emitting element.

Technical Solution

According to an embodiment of the present disclosure, a light emitting element may include an emission stacked pattern including a first conductive semiconductor layer, an active layer, and a second conductive semiconductor layer that are sequentially stacked in a longitudinal direction of the emission stacked pattern. The active layer may include a first surface that is in contact with the first conductive semiconductor layer in the longitudinal direction of the emission stacked pattern, and a second surface that is opposite the first surface and is in contact with the second conductive semiconductor layer.

In an embodiment of the present disclosure, the first conductive semiconductor layer may include at least one n-type semiconductor layer, and the second conductive semiconductor layer may include at least one p-type semiconductor layer.

In an embodiment of the present disclosure, the first surface of the active layer may be located at a point corresponding to −20% to +20% of half of a total length of the emission stacked pattern in the longitudinal direction of the emission stacked pattern.

In an embodiment of the present disclosure, a point corresponding to half of the total length of the emission stacked pattern may be located between the first and second surfaces of the active layer.

In an embodiment of the present disclosure, in a sectional view, a distance from the first surface of the active layer to an upper surface of the second conductive semiconductor layer may be different from a distance from a lower surface of the first conductive semiconductor layer to an upper surface of the first conductive semiconductor layer that is in contact with the first surface of the active layer.

In an embodiment of the present disclosure, in a sectional view, a distance from the first surface of the active layer to an upper surface of the second conductive semiconductor layer may be the same as a distance from a lower surface of the first conductive semiconductor layer to an upper surface of the first conductive semiconductor layer that is in contact with the first surface of the active layer.

In an embodiment of the present disclosure, the emission stacked pattern may have a shape of a cylinder, wherein the first conductive semiconductor layer are sequentially stacked, the active layer, and the second conductive semiconductor layer in the longitudinal direction of the emission stacked pattern.

In an embodiment of the present disclosure, in a sectional view, a ratio of a distance from the second surface of the active layer to the upper surface of the second conductive semiconductor layer to the total length of the emission stacked pattern may be 0.5 or less.

In an embodiment of the present disclosure, the emission stacked pattern may further include an electrode layer located on the second conductive semiconductor layer. In a sectional view, a ratio of a distance from the second surface of the active layer to an upper surface of the electrode layer to the total length of the emission stacked pattern may be 0.5 or less.

In an embodiment of the present disclosure, the electrode layer may be thicker than the second conductive semiconductor layer in the longitudinal direction of the emission stacked pattern, and the electrode layer may be thinner than the first conductive semiconductor layer, in the longitudinal direction of the emission stacked pattern.

In an embodiment of the present disclosure, in the sectional view, a distance from the first surface of the active layer to the upper surface of the electrode layer may be different from a distance from a lower surface of the first conductive semiconductor layer to the upper surface of the first conductive semiconductor layer that is in contact with the first surface of the active layer.

In an embodiment of the present disclosure, the electrode layer may include a transparent metal oxide, and may have a thickness of 0.5 μm to 1 μm in the longitudinal direction of the emission stacked pattern.

In an embodiment of the present disclosure, the light emitting element may further include an insulating film enclosing an outer periphery of the emission stacked pattern.

According to an aspect of the present disclosure, a display device may include a substrate including a display area and a non-display area; and a plurality of pixels in the display area of the substrate, and including a plurality of sub-pixels, respectively. Each of the sub-pixels may include a pixel circuit layer including at least one transistor, and a display element layer including at least one light emitting element that emits light.

In an embodiment of the present disclosure, the display element layer may include a first electrode and a second electrode that are spaced from each other in a longitudinal direction of the at least one light emitting element, and the at least one light emitting element having a first end and a second end in the longitudinal direction and connected to each of the first and second electrodes.

In an embodiment of the present disclosure, the at least one light emitting element may include an emission stacked pattern including a first conductive semiconductor layer, an active layer, and a second conductive semiconductor layer that are sequentially stacked in the longitudinal direction, the emission stacked pattern being located on the pixel circuit layer; and an insulating film configured to enclose an outer periphery of the emission stacked pattern. The active layer may include a first surface that is in contact with the first conductive semiconductor layer in the longitudinal direction, and a second surface that is opposite the first surface and is in contact with the second conductive semiconductor layer.

In an embodiment of the present disclosure, the first conductive semiconductor layer may include at least one n-type semiconductor layer, and the second conductive semiconductor layer may include at least one p-type semiconductor layer.

In an embodiment of the present disclosure, the first surface of the active layer may be located at a point corresponding to −20% to +20% of half of a total length of the emission stacked pattern in the longitudinal direction.

In an embodiment of the present disclosure, in a sectional view, a distance from the first surface of the active layer to an upper surface of the second conductive semiconductor layer may be different from a distance from a lower surface of the first conductive semiconductor layer to an upper surface of the first conductive semiconductor layer that is in contact with the first surface of the active layer.

In an embodiment of the present disclosure, in a sectional view, a ratio of a distance from the second surface of the active layer to an upper surface of the second conductive semiconductor layer to the total length of the emission stacked pattern is 0.5 or less.

In an embodiment of the present disclosure, the emission stacked pattern may further include an electrode layer on the second conductive semiconductor layer. The electrode layer may include a transparent metal oxide, and may have a thickness of 0.5 µm to 1 µm in the longitudinal direction of the emission stacked pattern.

In an embodiment of the present disclosure, in a sectional view, a ratio of a distance from the second surface of the active layer to an upper surface of the electrode layer to the total length of the emission stacked pattern may be 0.5 or less.

In an embodiment of the present disclosure, in a sectional view, a distance from the first surface of the active layer to an upper surface of the electrode layer may be different from a distance from a lower surface of the first conductive semiconductor layer to an upper surface of the first conductive semiconductor layer coming into contact with the first surface of the active layer.

In an embodiment of the present disclosure, the display element layer may further include an insulating layer on the light emitting element to expose the first and second ends of the light emitting element. The insulating layer may have a width that is equal to or smaller than a distance from a lower surface of the first conductive semiconductor layer to an upper surface of the first conductive semiconductor layer in the longitudinal direction of the light emitting element.

In an embodiment of the present disclosure, the display element layer may further include a first contact electrode electrically connecting one of the first and second ends of the light emitting element to the first electrode; and a second contact electrode electrically connecting a remaining one of the first and second ends of the light emitting element to the second electrode.

In an embodiment of the present disclosure, the first contact electrode and the second contact electrode may be on the insulating layer.

According to an embodiment of the present disclosure, an active layer of an emission stacked pattern grown on a substrate can be located at a center (or middle) of the emission stacked pattern in a longitudinal direction of the emission stacked pattern, thus emitting light of uniform intensity from both ends and thereby improving light emission efficiency.

Furthermore, an embodiment of the present disclosure may provide a display device including the above-described light emitting element.

The aspects and features of embodiments of the present disclosure are not limited by the foregoing, and other various aspects and features are anticipated herein.

DETAILED DESCRIPTION

Figure 1A:
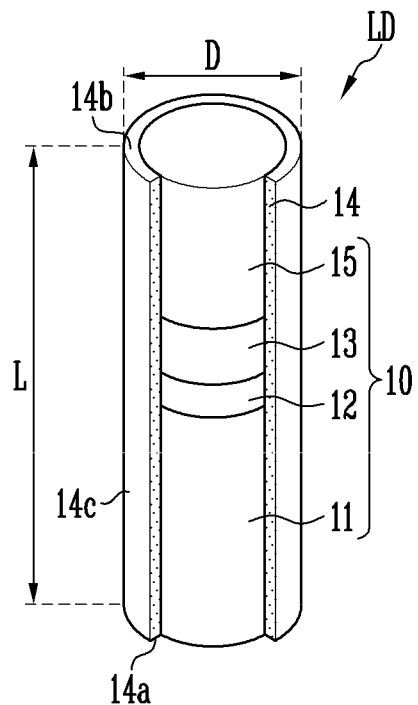
FIG. 1A is a perspective cutaway view schematically illustrating a light emitting element in accordance with an embodiment of the present disclosure.

As the present disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, an area, or a plate is disposed on a second part, the first part may be not only directly on the second part but a third part may intervene between them. In addition, when it is expressed that a first part such as a layer, a film, an area, or a plate is formed on a second part, the surface of the second part on which the first part is formed is not limited to an upper surface of the second part but may include other surfaces such as a side surface or a lower surface of the second part. To the contrary, when a first part such as a layer, a film, an area, or a plate is under a second part, the first part may be not only directly under the second part but a third part may intervene between them.

Embodiments and corresponding details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

Figure 1B:
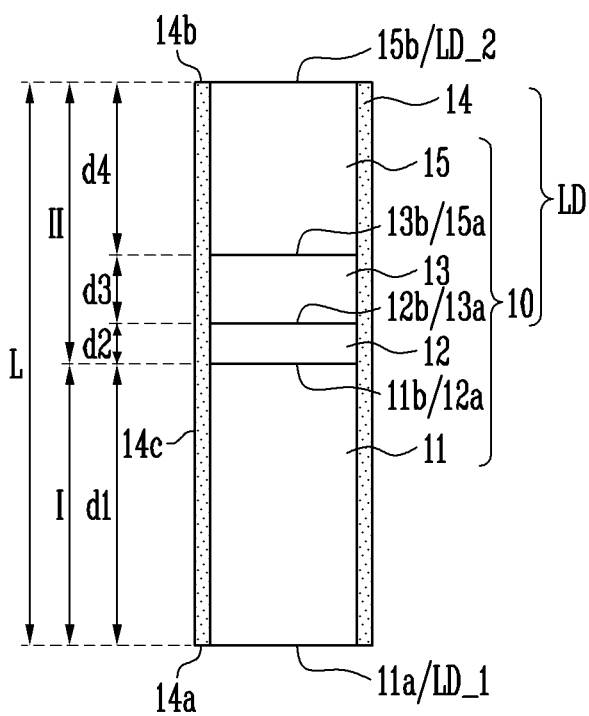
FIG. 1B is a sectional view illustrating the light emitting element of FIG. 1A.

FIG. 1A is a perspective cutaway view schematically illustrating a light emitting element in accordance with an embodiment of the present disclosure, and FIG. 1B is a sectional view illustrating the light emitting element of FIG. 1A.

Although FIGS. 1A and 1B illustrate a cylindrical light emitting element for the convenience of illustration, the type and/or shape of the light emitting element in accordance with an embodiment of the present disclosure are not limited thereto.

Referring to FIGS. 1A and 1B, the light emitting element LD in accordance with an embodiment of the present disclosure may include a first semiconductor layer (or first conductive semiconductor layer) 11, a second semiconductor layer (or second conductive semiconductor layer) 13, and an active layer 12 interposed between the first and second conductive semiconductor layers 11 and 13.

In an embodiment of the present disclosure, the light emitting element LD may be implemented as an emission stacked pattern 10 formed by successively stacking the first conductive semiconductor layer 11, the active layer 12, and the second conductive semiconductor layer 13 in this order. In other words, the emission stacked pattern 10 may include the first conductive semiconductor layer 11, the active layer 12 disposed on a surface of the first conductive semiconductor layer 11, and the second conductive semiconductor layer 13 disposed on a surface of the active layer 12. In an embodiment, the emission stacked pattern 10 may further include an electrode layer 15 provided on a surface of the second conductive semiconductor layer 13.

In an embodiment of the present disclosure, the light emitting element LD may be formed in the shape of a rod extending in one direction. If the direction in which the light emitting element LD extends is defined as a longitudinal direction L, the light emitting element LD may have a first end (or a lower end) and a second end (or an upper end) in the extending direction. One of the first and second conductive semiconductor layers 11 and 13 may be disposed in the first end (or the lower end), and the other one of the first and second conductive semiconductor layers 11 and 13 may be disposed in the second end (or the upper end).

In an embodiment of the present disclosure, the light emitting element LD may be provided in a cylindrical shape. However, without being limited thereto, the light emitting element may be provided in a polygonal prism shape, a triangular prism shape, or the like. The light emitting element LD may have a rod-like shape or a bar-like shape extending in the longitudinal direction L (i.e., to have an aspect ratio greater than 1). For example, a length L of the light emitting element LD in the longitudinal direction L may be greater than a diameter D thereof (or a width of the cross-section thereof). The light emitting element LD may include a light emitting diode fabricated to have a small size, e.g., with a length L and/or a diameter D corresponding to a size ranging from a micrometer scale to a nanometer scale.

In an embodiment of the present disclosure, the diameter D of the light emitting element LD may range from about 0.5 μm to 6 μm, and the length L thereof may range from about 1 μm to 10 μm. However, the size of the light emitting element LD is not limited to this, and the size of the light emitting element LD may be changed to meet the requirements of a lighting device or a self-emissive display device to which the light emitting element LD is applied.

The first conductive semiconductor layer 11 may include, for example, at least one n-type semiconductor layer. For instance, the first conductive semiconductor layer 11 may include an n-type semiconductor layer that includes any one semiconductor material of InAlGaN, GaN, AlGaN, InGaN, AlN, and InN, and is doped with a first conductive dopant such as Si, Ge, or Sn. However, the material forming the first conductive semiconductor layer 11 is not limited to this, and the first conductive semiconductor layer 11 may be formed of various other materials.

The active layer 12 may be disposed on the first conductive semiconductor layer 11 and have a single or multiple quantum well structure. In an embodiment, a cladding layer doped with a conductive dopant may be formed above and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a suitable voltage (e.g., a predetermined voltage) or more is applied between the opposite ends of the light emitting element LD, the light emitting element LD emits light by coupling electron-hole pairs in the active layer 12. Because light emission of the light emitting element LD may be controlled based on the foregoing principle, the light emitting element LD may be used as a light source of various light emitting devices as well as a pixel of the display device.

The active layer 12 includes a first surface 12a that is in contact with an upper surface 11b of the first conductive semiconductor layer 11, and a second surface 12b that is in contact with a lower surface 13a of the second conductive semiconductor layer 13. The first surface 12a and the second surface 12b may face each other in the longitudinal direction L of the light emitting element LD.

The second conductive semiconductor layer 13 may be disposed on the second surface 12b of the active layer 12, and may include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer that includes at least one semiconductor material of InAlGaN, GaN, AlGaN, InGaN, AlN, and InN, and is doped with a second conductive dopant such as Mg. However, the material forming the second conductive semiconductor layer 13 is not limited to this, and the second conductive semiconductor layer 13 may be formed of various other materials.

In an embodiment of the present disclosure, the emission stacked pattern 10 may include an electrode layer 15 disposed on an upper surface 13b of the second conductive semiconductor layer 13. Thus, the emission stacked pattern 10 may include a stacked structure formed by successively stacking the first conductive semiconductor layer 11, the active layer 12, the second conductive semiconductor layer 13, and the electrode layer 15 in this order.

The emission stacked pattern 10 may be provided and/or formed in a shape corresponding to that of the light emitting element LD. For example, when the light emitting element LD is provided and/or formed in a cylindrical shape, the emission stacked pattern 10 may also be provided in a cylindrical shape. Furthermore, when the emission stacked pattern 10 is provided and/or formed in a cylindrical shape, each of the first conductive semiconductor layer 11, the active layer 12, the second conductive semiconductor layer 13, and the electrode layer 15 included in the emission stacked pattern 10, may have a cylindrical shape.

The first conductive semiconductor layer 11 may be disposed in the first end (or the lower end) of the light emitting element LD, and the electrode layer 15 may be disposed in the second end (or the upper end) of the light emitting element LD. The light emitting element LD may include a lower surface 11a of the first conductive semiconductor layer 11 and an upper surface 15b of the electrode layer 15 that are positioned on the opposite ends of the light emitting element LD and are exposed to the outside. The lower surface 11a of the first conductive semiconductor layer 11 and the upper surface 15b of the electrode layer 15 may be surfaces which are in contact with an external conductive material to be electrically connected thereto. In an embodiment of the present disclosure, the lower surface 11a of the first conductive semiconductor layer 11 may be a lower surface LD_1 of the light emitting element LD, and the upper surface 15b of the electrode layer 15 may be an upper surface LD_2 of the light emitting element LD.

When the light emitting element LD has the cylindrical shape, the first conductive semiconductor layer 11 may be disposed in a lower portion of the cylinder and the electrode layer 15 may be disposed on an upper portion of the cylinder. When the light emitting element LD has the cylindrical shape, each of the lower surface 11a or LD_1 of the first conductive semiconductor layer 11 and the upper surface 15b or LD_2 of the electrode layer 15 may have a circular shape. In an embodiment, when the light emitting element LD has the shape of an elliptical cylinder, each of the lower surface 11a or LD_1 of the first conductive semiconductor layer 11 and the upper surface 15b or LD_2 of the electrode layer 15 may have an elliptical shape. Furthermore, in another embodiment, when the light emitting element LD has the shape of a polygonal pyramid, each of the lower surface 11a or LD_1 of the first conductive semiconductor layer 11 and the upper surface 15b or LD_2 of the electrode layer 15 may have a polygonal shape.

When the emission stacked pattern 10 is provided in a shape corresponding to that of the light emitting element LD, the emission stacked pattern 10 may have a length which is substantially similar or equal to the length L of the light emitting element LD. For example, when the light emitting element LD has the length L of about 3.5 μm, the emission stacked pattern 10 may also have the length L of about 3.5 μm. In the following embodiments, description will be made on the premise that the length of the emission stacked pattern 10 is the same as the length L of the light emitting element LD. The length of the emission stacked pattern 10 is denoted by the same reference character as the length L of the light emitting element LD.

The electrode layer 15 may be an ohmic contact electrode electrically connected to the second conductive semiconductor layer 13, but the present disclosure is not limited thereto. The electrode layer 15 may include metal or a metal oxide. For example, Cr, Ti, Al, Au, Ni, ITO, IZO, ITZO, and an oxide or alloy thereof may be used alone or in combination with each other. Furthermore, the electrode layer 15 may be substantially transparent or translucent. Thereby, light generated from the active layer 12 may be emitted to the outside of the light emitting element LD after passing through the electrode layer 15.

In an embodiment of the present disclosure, the electrode layer 15 may be selectively made of a transparent metal oxide such as indium tin oxide (ITO) or an opaque metal according to the color of light that is finally emitted from the active layer 12. For example, when the active layer 12 emits blue-based and/or green-based light in a wavelength range of 400 nm to 580 nm, the electrode layer 15 may be made of a transparent metal oxide such as indium tin oxide (ITO). Furthermore, when the active layer 12 emits red-based and/or infrared-based light in the wavelength range of 580 nm to 900 nm, the electrode layer 15 may be made of an opaque metal such as Cr, Ti, or Ni. However, the present disclosure is not limited thereto. In an embodiment, the electrode layer 15 may be formed of a transparent metal oxide to secure light transmissivity when the active layer 12 emits red- or infrared-based light in the wavelength range of 580 nm to 900 nm.

In the above-described embodiment, although the electrode layer 15 has been described and illustrated as a single conductive layer made of a transparent metal oxide and/or a single conductive layer made of an opaque metal, the present disclosure is not limited thereto. In an embodiment, the electrode layer 15 may be a multilayer structure formed by stacking a conductive layer made of at least one transparent metal oxide and a conductive layer made of at least one opaque metal.

Furthermore, in an embodiment, the light emitting element LD may further include an insulating film 14 provided on an outer surface (e.g., an outer peripheral or circumferential surface) (or a surface) of the emission stacked pattern 10. The insulating film 14 may include transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

The insulating film 14 may prevent the active layer 12 from short-circuiting due to making contact with a conductive material except for the first conductive semiconductor layer 11 and the second conductive semiconductor layer 13 of the same light emitting element LD. Because of the insulating film 14, occurrence of a defect on the surface of the light emitting element LD may be reduced or minimized, whereby the lifetime and efficiency of the light emitting element may be improved. In the case where a plurality of light emitting elements LD are disposed in close contact with each other, the insulating film 14 may prevent an undesired short-circuit from occurring between the adjacent light emitting elements LD. Whether the insulating film 14 is provided is not limited so long as the active layer 12 may be prevented from short-circuiting with external conductive materials.

The insulating film 14 may be formed and/or provided on the surface (or the outer circumference or outer periphery) of the emission stacked pattern 10 to enclose an outer surface (e.g., an outer circumferential or peripheral surface) of at least the active layer 12. In addition, the insulating film may further enclose an area of each of the first and second conductive semiconductor layers 11 and 13 and an outer surface (e.g., an outer circumferential or peripheral surface) of the electrode layer 15. In an embodiment of the present disclosure, the insulating film 14 may completely enclose the outer surface (e.g., an outer circumferential or peripheral surface) of both ends of the light emitting element LD having different polarities, but the present disclosure is not limited thereto. In an embodiment, the insulating film 14 may enclose a portion of the outer surface (e.g., an outer circumferential or peripheral surface) of the first conductive semiconductor layer 11 and/or a portion of the outer surface (e.g., an outer circumferential or peripheral surface) of the electrode layer 15.

The insulating film 14 may include a lower surface 14a that is parallel to the lower surface 11a of the first conductive semiconductor layer 11 in a direction intersecting with the longitudinal direction L of the light emitting element LD, an upper surface 14b that faces the lower surface 14a in the longitudinal direction L, and a side surface 14c that encloses the surface (or the outer circumferential or peripheral surface) of the emission stacked pattern 10. The lower surface 14a of the insulating film 14, the upper surface 14b of the insulating film 14, and the side surface 14c of the insulating film 14 may be continuously connected to each other or may be integrally formed. Here, the upper surface 14b of the insulating film 14 may be defined as an imaginary surface including a periphery of an upper end of the insulating film 14, and the lower surface 14a of the insulating film 14 may be defined as an imaginary surface including a periphery of a lower end of the insulating film 14.

In an embodiment of the present disclosure, the insulating film 14 may entirely enclose the outer surface (e.g., an outer circumferential or peripheral surface) of the electrode layer 15. In this case, the upper surface 14b of the insulating film 14 and the upper surface 15b of the electrode layer 15 may be provided and/or formed at the same surface (or the same line). However, the present disclosure is not limited thereto. In an embodiment, when the insulating film 14 partially encloses or does not enclose the outer surface (e.g., an outer circumferential or peripheral surface) of the electrode layer 15, the upper surface 14b of the insulating film 14 and the upper surface 15b or LD_2 of the electrode layer 15 may be provided and/or formed on different surfaces (or different lines).

In an embodiment of the present disclosure, the insulating film 14 may entirely enclose the outer surface (e.g., an outer circumferential or peripheral surface) of the first conductive semiconductor layer 11. In this case, the lower surface 14a of the insulating film 14 and the lower surface 11a or LD_1 of the first conductive semiconductor layer 11 may be provided and/or formed at the same surface (or the same line). However, the present disclosure is not limited thereto. In an embodiment, when the insulating film 14 partially encloses or does not enclose the outer surface (e.g., an outer circumferential or peripheral surface) of the first conductive semiconductor layer 11, the lower surface 14a of the insulating film 14 and the lower surface 11a or LD_1 of the first conductive semiconductor layer 11 may be provided and/or formed on different surfaces (or different lines).

In an embodiment of the present disclosure, the length of the side surface 14c of the insulating film 14 with respect to the longitudinal direction L of the light emitting element LD may be equal to the length L of the emission stacked pattern 10 including the first conductive semiconductor layer 11, the active layer 12, the second conductive semiconductor layer 13, and the electrode layer 15, but the present disclosure is not limited thereto. In an embodiment, the length of the side surface 14c of the insulating film 14 may be shorter or longer than the length L of the emission stacked pattern 10 with respect to the longitudinal direction L of the light emitting element LD.

The lower surface 14a of the insulating film 14 may be positioned at the same surface (or the same line) as the lower surface 11a or LD_1 of the first conductive semiconductor layer 11, and the upper surface 14b of the insulating film 14 may be positioned at the same surface (or the same line) as the upper surface 15b or LD_2 of the electrode layer 15. The lower surface 14a of the insulating film 14 and the lower surface 11a or LD_1 of the first conductive semiconductor layer 11 may not be necessarily positioned at the same surface (or the same line). In an embodiment, they may be positioned on different surfaces (or different lines). Similarly, the upper surface 14b of the insulating film 14 and the upper surface 15b or LD_2 of the electrode layer 15 may not be necessarily positioned at the same surface (or the same line). In an embodiment, they may be positioned on different surfaces (or different lines).

In an embodiment of the present disclosure, the first conductive semiconductor layer 11, the active layer 12, the second conductive semiconductor layer 13, and the electrode layer 15, which are successively stacked in the longitudinal direction L of the light emitting element LD, may have different thicknesses. For example, a thickness d1 of the first conductive semiconductor layer 11, a thickness d2 of the active layer 12, a thickness d3 of the second conductive semiconductor layer 13, and a thickness d4 of the electrode layer 15 in the longitudinal direction L of the light emitting element LD may be different from each other.

In an embodiment of the present disclosure, the thickness d1 of the first conductive semiconductor layer 11 may represent a distance between the lower surface 11a or LD_1 of the first conductive semiconductor layer 11 and the upper surface 11b thereof in the longitudinal direction L of the light emitting element LD. The first conductive semiconductor layer 11 may have the thickness d1 of about 1 μm to 5 μm, but the present disclosure is not limited thereto.

The thickness d2 of the active layer 12 may represent a distance between the lower surface 12a of the active layer 12 and the upper surface 12b thereof in the longitudinal direction L of the light emitting element LD. Here, the lower surface 12a of the active layer 12 may come into contact with the upper surface 11b of the first conductive semiconductor layer 11. The active layer 12 may have the thickness d2 of about 0.05 μm to 0.5 μm, but the present disclosure is not limited thereto.

The thickness d3 of the second conductive semiconductor layer 13 may represent a distance between the lower surface 13a of the second conductive semiconductor layer 13 and the upper surface 13b thereof in the longitudinal direction L of the light emitting element LD. Here, the lower surface 13a of the second conductive semiconductor layer 13 may come into contact with the upper surface 12b of the active layer 12. The second conductive semiconductor layer 13 may have the thickness d3 of about 0.08 μm to 2 μm, but the present disclosure is not limited thereto.

The thickness d4 of the electrode layer 15 may represent a distance between the lower surface 15a of the electrode layer 15 and the upper surface 15b thereof in the longitudinal direction L of the light emitting element LD. Here, the lower surface 15a of the electrode layer 15 may come into contact with the upper surface 13b of the second conductive semiconductor layer 13. The electrode layer 15 may have the thickness d4 of about 0.5 μm to 1 μm, but the present disclosure is not limited thereto.

In an embodiment of the present disclosure, the thickness d1 of the first conductive semiconductor layer 11 may be greater than each of the thickness d2 of the active layer 12, the thickness d3 of the second conductive semiconductor layer 13, and the thickness d4 of the electrode layer 15. Furthermore, the thickness d1 of the first conductive semiconductor layer 11 may be equal or similar to a sum of the thickness d2 of the active layer 12, the thickness d3 of the second conductive semiconductor layer 13, and the thickness d4 of the electrode layer 15, but the present disclosure is not limited thereto. In an embodiment, the thickness d1 of the first conductive semiconductor layer 11 may be less than or greater than the sum of the thickness d2 of the active layer 12, the thickness d3 of the second conductive semiconductor layer 13, and the thickness d4 of the electrode layer 15. In an embodiment of the present disclosure, the thickness d1 of the first conductive semiconductor layer 11 may be substantially equal or similar to the sum of the thickness d2 of the active layer 12, the thickness d3 of the second conductive semiconductor layer 13, and the thickness d4 of the electrode layer 15.

The light emitting element LD may include a first area I and a second area II. The first area I and the second area II may be divided based on the lower surface 12a of the active layer 12 that is in contact with the upper surface 11b of the first conductive semiconductor layer 11 in the longitudinal direction L of the light emitting element LD, but the present disclosure is not limited thereto. In an embodiment, the light emitting element LD may be divided into the first area I and the second area II based on the upper surface 12b of the active layer 12, the lower surface 13a of the second conductive semiconductor layer 13, and the upper surface 13b of the second conductive semiconductor layer 13. Furthermore, the light emitting element LD may not be divided into the first area I and the second area II. For the convenience of description, the light emitting element has been described as being divided into the first area I and the second area II.

In an embodiment of the present disclosure, the first area I may represent an area extending from the lower surface 11a of the first conductive semiconductor layer 11 to the lower surface 12a of the active layer 12 in the longitudinal direction L of the light emitting element LD. In other words, the first area I may represent an area extending from the lower surface LD_1 of the light emitting element LD to the lower surface 12a of the active layer 12. The first conductive semiconductor layer 11 may be positioned in the first area I. The second area II may represent an area extending from the lower surface 12a of the active layer 12 to the upper surface 15b of the electrode layer 15 in the longitudinal direction L of the light emitting element LD. In other words, the second area II may represent an area extending from the lower surface 12a of the active layer 12 to the upper surface LD_2 of the light emitting element LD. The active layer 12, the second conductive semiconductor layer 13, and the electrode layer 15 may be positioned in the second area II.

As described above, because the first conductive semiconductor layer 11 is positioned in the first area I, the width of the first area I in the longitudinal direction L of the light emitting element LD may be substantially equal to the thickness d1 of the first conductive semiconductor layer 11. Furthermore, because components other than the first conductive semiconductor layer 11, for example, the active layer 12, the second conductive semiconductor layer 13, and the electrode layer 15 are positioned in the second area II, the width of the second area II in the longitudinal direction L of the light emitting element LD may be substantially the same as the sum of the thickness d2 of the active layer 12, the thickness d3 of the second conductive semiconductor layer 13, and the thickness d4 of the electrode layer 15.

In an embodiment of the present disclosure, the first area I and the second area II may have substantially the same or similar width. In this case, the active layer 12 may be closer to the upper surface 15b of the electrode layer 15 than the lower surface 11a of the first conductive semiconductor layer 11 in the longitudinal direction L of the light emitting element LD and/or the emission stacked pattern 10.

In an embodiment of the present disclosure, the active layer 12 may be positioned in the middle (or the center) of the light emitting element LD or may be positioned adjacent to the middle (or the center) of the light emitting element LD in the longitudinal direction L of the light emitting element LD. When seen in a sectional view, the upper surface 12b of the active layer 12 may not be positioned at a point corresponding to a half of the length L of the light emitting element LD. For example, when the length L of the light emitting element LD is 3 μm, the upper surface 12b of the active layer 12 may not be positioned at a point corresponding to 1.5 μm that is a half of the length L of the light emitting element LD from the lower surface 11a of the first conductive semiconductor layer 11 in the longitudinal direction L of the light emitting element LD. Similarly, when seen in a sectional view, the upper surface 12b of the active layer 12 may not be positioned at a point corresponding to a half of the length L of the emission stacked pattern 10.

When seen in a sectional view, a ratio of a distance from the upper surface 12b of the active layer 12 to the upper surface 15b of the electrode layer 15 to the length L of each of the light emitting element LD and/or the emission stacked pattern 10 may be 0.5 or less. In other words, when seen in a sectional view, a sum of the thickness d3 of the second conductive semiconductor layer 13 and the thickness d4 of the electrode layer 15 in the longitudinal direction L of the light emitting element LD may be equal to or less than a half of the length L of each of the light emitting element LD and/or the emission stacked pattern 10. For example, when the length L of each of the light emitting element LD and/or the emission stacked pattern 10 is 3 μm, the sum of the thickness d3 of the second conductive semiconductor layer 13 and the thickness d4 of the electrode layer 15 may be equal to or less than 1.5 μm.

In an embodiment of the present disclosure, a point corresponding to the half of the length L of each of the light emitting element LD and/or the emission stacked pattern 10 may be positioned between the lower surface 12a of the active layer 12 and the upper surface 12b of the active layer 12. However, the present disclosure is not limited to this. In an embodiment, a point corresponding to the half of the length L of each of the light emitting element LD and/or the emission stacked pattern 10 may correspond to the lower surface 12a of the active layer 12 or the upper surface 12b of the active layer 12. Furthermore, in an embodiment, a point corresponding to the half (e.g., a halfway point) of the length L of each of the light emitting element LD and/or the emission stacked pattern 10 may be positioned between the lower surface 12a of the active layer 12 and the first conductive semiconductor layer 11 or be positioned between the upper surface 12b of the active layer 12 and the second conductive semiconductor layer 13.

In an embodiment of the present disclosure, when seen in a sectional view, a distance from the lower surface 12a of the active layer 12 to the upper surface 15b of the electrode layer 15, i.e. the sum of the thickness d2 of the active layer 12, the thickness d3 of the second conductive semiconductor layer 13, and the thickness d4 of the electrode layer 15 may be equal to or less than the thickness d1 (or the distance) from the lower surface 11a of the first conductive semiconductor layer 11 to the upper surface 11b thereof.

As described above, when seen in a sectional view, when the sum of the thickness d3 of the second conductive semiconductor layer 13 and the thickness d4 of the electrode layer 15 is equal to or less than the half of the length L of each of the light emitting element LD and/or the emission stacked pattern 10, the active layer 12 may be positioned in the middle (or center) of the emission stacked pattern 10 or be adjacent to the middle (or center) of the emission stacked pattern 10 in the longitudinal direction L of the light emitting element LD. However, the present disclosure is not limited to this. In an embodiment, the active layer 12 may deviate from the middle (or the center) of the light emitting element LD and/or the emission stacked pattern 10 in the longitudinal direction L of the light emitting element LD, and may be provided and/or formed more adjacent to the upper surface LD_2 of the light emitting element LD. Furthermore, in an embodiment, the active layer 12 may deviate from the middle (or the center) of the light emitting element LD and/or the emission stacked pattern 10 in the longitudinal direction L of the light emitting element LD, and may be provided and/or formed more adjacent to the lower surface LD_1 of the light emitting element LD.

For example, in an embodiment of the present disclosure, the electrode layer 15 provided and/or formed on the second conductive semiconductor layer 13 may have a thickness d4 (e.g., a thickness of a predetermined level) or more. The electrode layer 15 may be provided and/or formed on the second conductive semiconductor layer 13 through a conventional deposition method. In this case, the electrode layer 15 having the thickness d4 (e.g., a thickness of a predetermined level) or more may be formed on the second conductive semiconductor layer 13 by controlling a deposition time. When the electrode layer 15 has the thickness d4 of a predetermined level or more, for example, the thickness of about 1 μm, the length L of the light emitting element LD and/or the emission stacked pattern 10 may be increased by about 0.9 μm compared to the existing electrode layer 15 having the thickness of about 0.1 μm. Thus, the active layer 12 may be positioned substantially in the middle (or center) of the light emitting element LD and/or the emission stacked pattern 10 in the longitudinal direction L of the light emitting element LD, or be positioned adjacent to the middle (or center) of the light emitting element LD and/or the emission stacked pattern 10.

For example, when the light emitting element LD has the length L of about 3 μm, the lower surface 12a of the active layer 12 may come into contact with the middle (or the center) of the light emitting element LD corresponding to the point of 1.5 μm that is the half of the length L of the light emitting element LD from the lower surface 11a of the first conductive semiconductor layer 11 in the longitudinal direction L of the light emitting element LD. In an embodiment, when the light emitting element LD has the length L of about 3 μm, the lower surface 12a of the active layer 12 may come into contact with an area adjacent to the middle (or the center) of the light emitting element LD that is within a range of −20% to +20% from the point of 1.5 μm that is the half of the length L of the light emitting element LD from the lower surface 11a of the first conductive semiconductor layer 11 in the longitudinal direction L of the light emitting element LD. In other words, when the light emitting element LD and/or the emission stacked pattern 10 has the length L of 3 μm, the lower surface 12a of the active layer 12 may be positioned at a point of 1.2 µm to 1.8 µm in the longitudinal direction L within the light emitting element LD and/or the emission stacked pattern 10.

However, an area where the active layer 12 is positioned in the longitudinal direction L of the light emitting element LD in the light emitting element LD and/or the emission stacked pattern 10 is not limited to the above-described embodiments. The location of the active layer 12 may be changed in various ways depending on the design condition, size and/or length L of the light emitting element LD, and the requirements of an electronic device to which the light emitting element LD is applied.

As described above, when the active layer 12 is positioned in the middle (or the center) of the light emitting element LD and/or the emission stacked pattern 10 in the longitudinal direction L of the light emitting element LD or is adjacent to the middle (or the center) of the light emitting element LD and/or the emission stacked pattern 10, light emitted from the active layer 12 may uniformly (or evenly) travel to both ends of the light emitting element LD and/or the emission stacked pattern 10 without being biased in one direction. Thus, the intensity of the light emitted from both ends of the light emitting element LD and/or the emission stacked pattern 10 becomes uniform, so that the light efficiency of the light emitting element LD and/or the emission stacked pattern 10 may be improved.

If the active layer 12 is disposed adjacent to one of both ends instead of being positioned in the middle (or the center) of the light emitting element LD and/or the emission stacked pattern 10, light emitted from the active layer 12 may concentrate on one of both ends. In this case, light emitted from the light emitting element LD and/or the emission stacked pattern 10 may be focused on one direction, so that the light of the light emitting element LD may be asymmetrically output. Thus, in an embodiment of the present disclosure, the electrode layer 15 is formed to have the thickness d4 (e.g., a thickness of a predetermined level) or more, and then the active layer 12 is positioned in the middle (or the center) of the light emitting element LD and/or the emission stacked pattern 10 or is positioned adjacent to the middle (or the center) of the light emitting element LD and/or the emission stacked pattern 10, thus allowing the light emitted from the active layer 12 to evenly (or uniformly) travel to both ends (e.g., LD_1 and LD_2) of the light emitting element LD and/or the emission stacked pattern 10. Consequently, according to an embodiment of the present disclosure, the light emission efficiency of the light emitting element LD may be improved.

The light emitting element LD may be employed as a light source for various display devices. The light emitting element LD may be fabricated through a surface treatment process. For example, the light emitting element LD may be surface-treated so that, when a plurality of light emitting elements LD are mixed with a fluidic solution (or solvent) and then supplied to each emission area (e.g., an emission area of each sub-pixel), the light emitting elements LD may be evenly distributed rather than unevenly aggregating in the solution.

A light emitting device including the light emitting element LD described above may be used in various devices including a display device that requires a light source. For instance, in the case where a plurality of light emitting elements LD is disposed in the emission area of each sub-pixel of a display panel, the light emitting elements LD may be used as a light source of each sub-pixel. However, the application field of the light emitting element LD is not limited to the above-mentioned examples. For example, the light emitting element LD may also be used in various devices such as a lighting device, which requires a light source.

In an embodiment of the present disclosure, the light emitting element LD may further include additional components as well as the first conductive semiconductor layer 11, the active layer 12, the second conductive semiconductor layer 13, the electrode layer 15, and the insulating film 14 that have been described above. For instance, the emission stacked pattern 10 of the light emitting element LD may further include one or more electrode layers and/or fluorescent layers disposed on one side of each of the first conductive semiconductor layer 11 and/or the active layer 12. Although not shown directly in the drawing, the light emitting element LD may further include at least one electrode layer disposed on one side of the first conductive semiconductor layer 11. The above-described electrode layer may be an ohmic contact electrode. However, without being limited thereto, the electrode layer may include material equal to or different from that of the electrode layer 15 disposed on one side of the second conductive semiconductor layer 13.

FIGS. 2A to 2J are sectional views sequentially illustrating a method of manufacturing the light emitting element of FIGS. 1A and 1B.

Figure 2A:
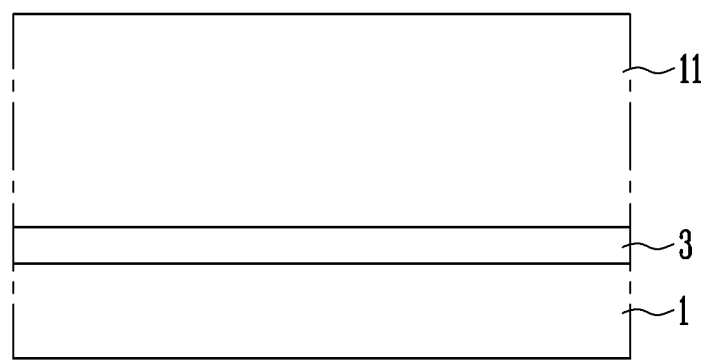
FIGS. 2A to 2J are sectional views sequentially illustrating a method of manufacturing the light emitting element of FIGS. 1A and 1B.
Figure 2B:
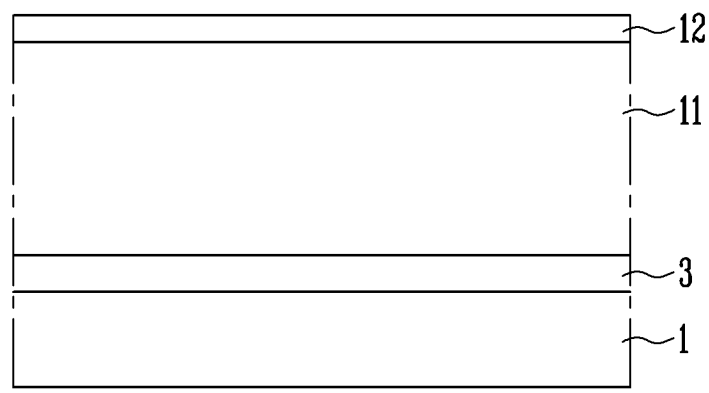
Figure 2C:
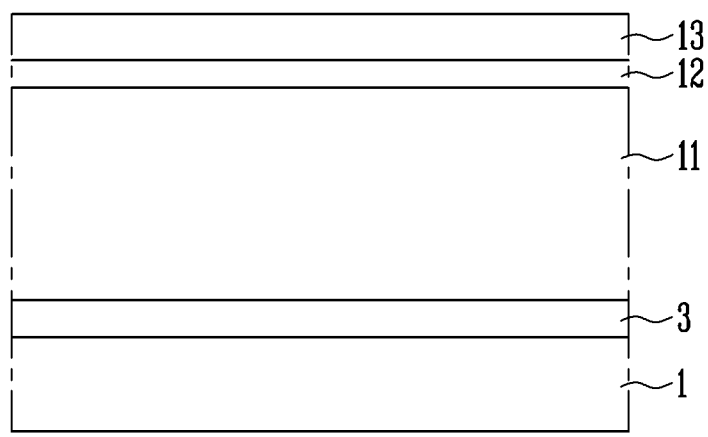
Figure 2D:
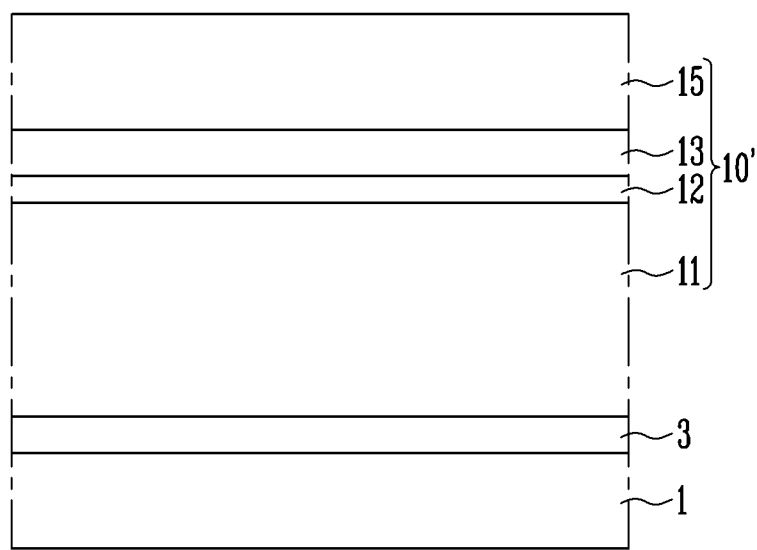
Figure 2E:
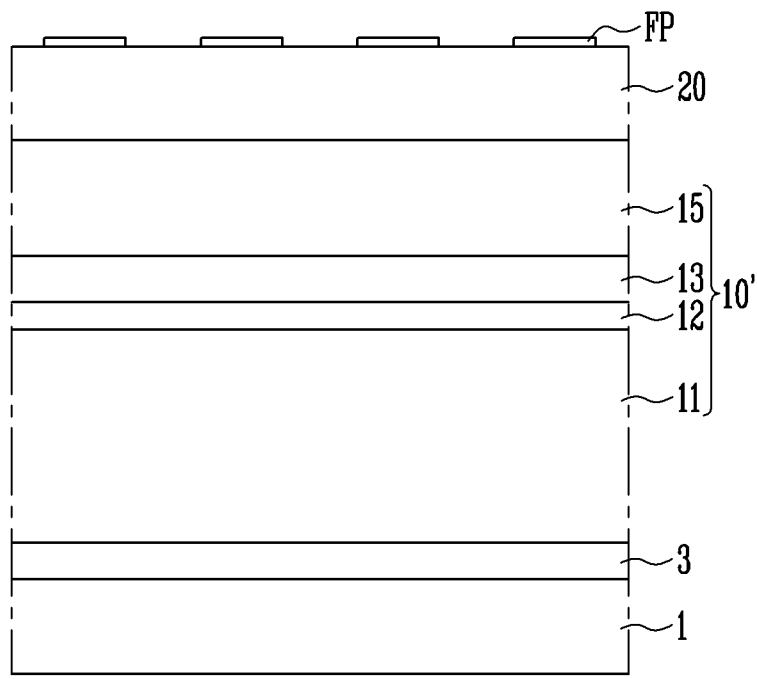
Figure 2F:
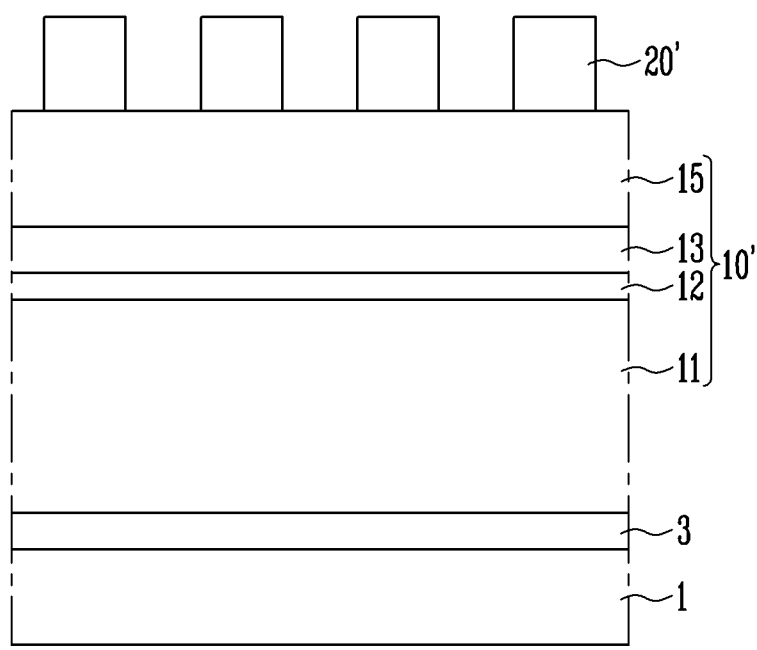
Figure 2G:
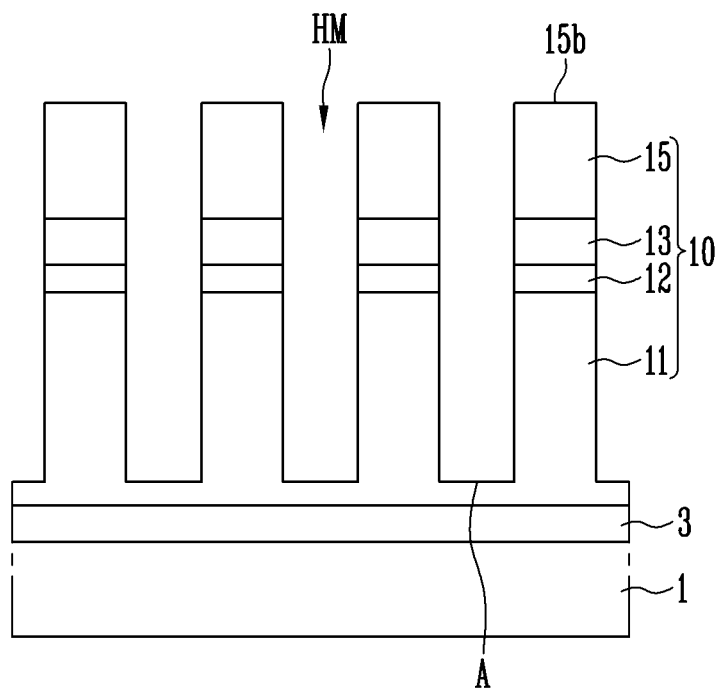
Figure 2H:
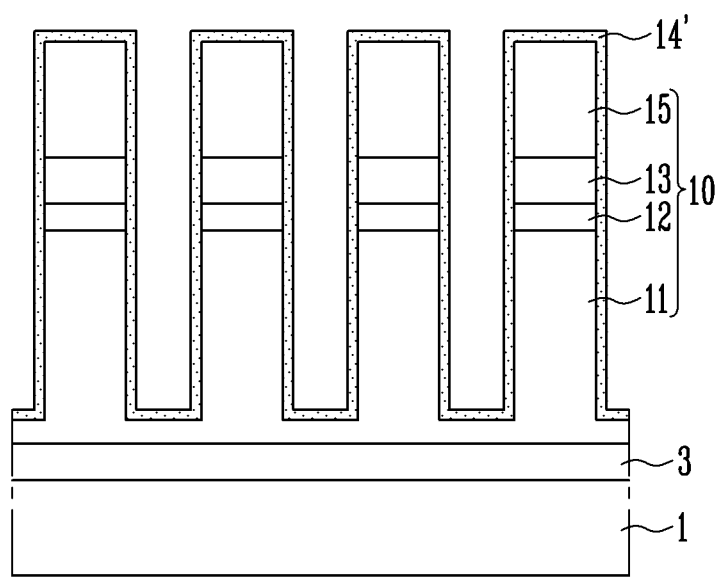
Figure 2I:
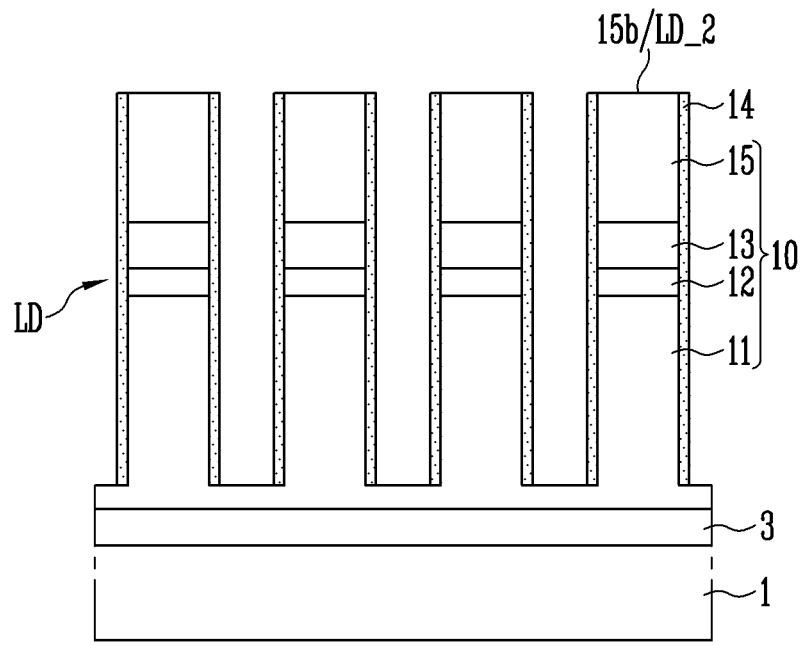
Figure 2J:
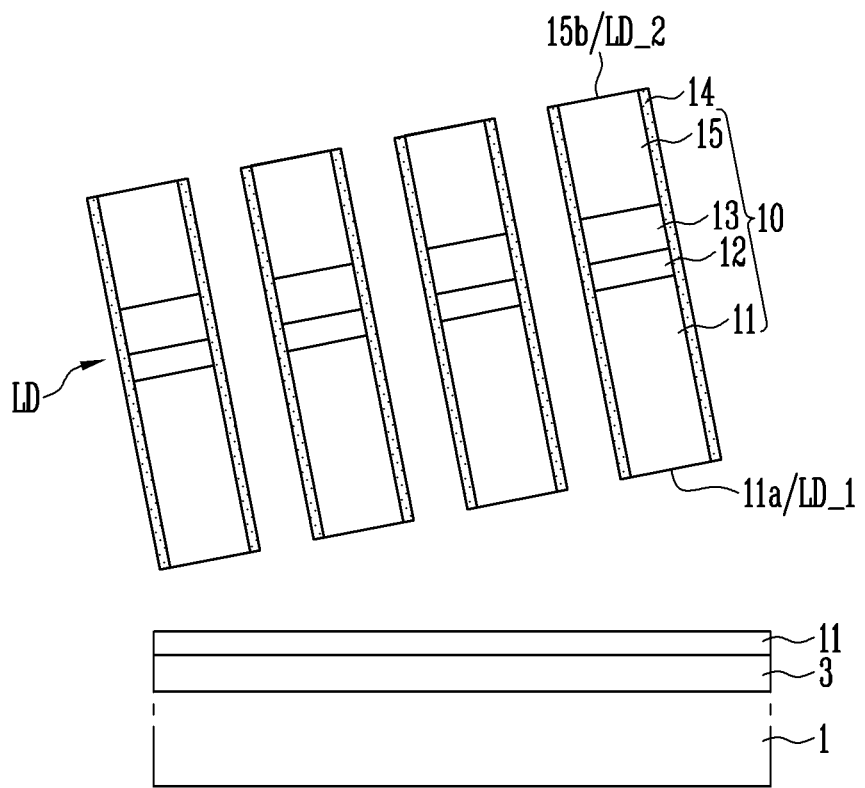

Referring to FIGS. 1A, 1B, and 2A, a substrate 1 configured to support the light emitting element LD is prepared.

The substrate 1 may be a GaAs, GaP, or InP substrate. The substrate 1 may be a wafer for epitaxial growth. The substrate 1 may include a ZnO substrate having a GaAs layer on a surface. Furthermore, the Ge substrate having the GaAs layer on the surface and a Si substrate having the GaAs layer on a Si wafer with a buffer layer being interposed therebetween may also be applied.

A commercially available mono-crystal substrate manufactured by a known manufacturing method may be used as the substrate 1. When a selection ratio for manufacturing the light emitting element LD is satisfied and the epitaxial growth is smoothly performed, the material of the substrate 1 is not limited thereto.

It is desirable that the surface of the substrate 1 to be epitaxially grown is smooth. The size and diameter of the substrate 1 may vary depending on a product to which the substrate 1 is applied, and may be manufactured in a form capable of reducing bending caused by a stacked structure due to epitaxial growth. The shape of the substrate 1 is not limited to a circular shape, and may have a polygonal shape such as a rectangle.

Subsequently, a sacrificial layer 3 is formed on the substrate 1. The sacrificial layer 3 may be positioned between the light emitting element LD and the substrate 1 in the process of manufacturing the light emitting element LD on the substrate 1 to physically separate the light emitting element LD from the substrate 1.

The sacrificial layer 3 may have various structures, i.e. a single layer structure or a multilayer structure. The sacrificial layer 3 may be a layer that is removed in a final manufacturing process of the light emitting element LD. When the sacrificial layer 3 is removed, interlayer separation may be performed above and under the sacrificial layer 3. The method of removing the sacrificial layer 3 will be described below with reference to FIG. 2J.

In an embodiment of the present disclosure, the sacrificial layer 3 may be formed of GaAs, AlAs, or AlGaAs.

The first conductive semiconductor layer 11 is formed on the sacrificial layer 3. The first conductive semiconductor layer 11 may be formed through the epitaxial growth, and may be formed by a MOCVD method, a MBE method, a VPE method, a LPE method or the like. In an embodiment, an additional semiconductor layer for improving crystallinity, such as a buffer layer and an undoped semiconductor layer, may be further formed between the first conductive semiconductor layer 11 and the sacrificial layer 3.

The first conductive semiconductor layer 11 may include a semiconductor material composed of III(Ga, Al, In)-V(P, As) Groups, and may include a semiconductor layer doped with a first conductive dopant such as Si, Ge, or Sn. For example, the first conductive semiconductor layer 11 may include at least one semiconductor material among GaP, GaAs, GaInP, and AlGaInP doped with Si. In other words, the first conductive semiconductor layer 11 may include at least one n-type semiconductor layer. The material forming the first conductive semiconductor layer 11 is not limited to this, and the first conductive semiconductor layer 11 may be formed of various other materials.

In an embodiment, when the light emitting element LD includes a conductive material layer (not shown) that is in contact with the lower surface 11a of the first conductive semiconductor layer 11, the conductive material layer may be formed before the first conductive semiconductor layer 11 is formed on the sacrificial layer 3.

Referring to FIGS. 1A, 1B, 2A, and 2B, the active layer 12 is formed on the first conductive semiconductor layer 11. The active layer 12 is an area in which electrons and holes are recombined. As the electrons and the holes are recombined, the active layer 12 may be transferred to a low energy level and emit light having a wavelength corresponding thereto. The active layer 12 may be formed on the first conductive semiconductor layer 11 and have a single or multiple quantum well structure. The location of the active layer 12 may be changed in various ways depending on the type of the light emitting element LD. In an embodiment of the present disclosure, the active layer 12 may be positioned in the middle (or the center) along the length L of the light emitting element LD.

The active layer 12 may include at least one of GaInP, AlGaInP, GaAs, AlGaAs, InGaAs, InGaAsP, InP, and InAs. The active layer 12 may emit light having a wavelength of 400 nm to 900 nm. The active layer 12 may use a double heterostructure. In an embodiment, a cladding layer doped with the conductive dopant may be further formed on the upper surface 12b and/or the lower surface 12a of the active layer 12.

Referring to FIGS. 1A, 1B, 2A to 2C, the second conductive semiconductor layer 13 is formed on the active layer 12. The second conductive semiconductor layer 13 may include a semiconductor layer of a type different from that of the first conductive semiconductor layer 11. The second conductive semiconductor layer 13 may include semiconductor material composed of III(Ga, Al, In)-V(P, As) Groups, and may include a semiconductor layer doped with a second conductive dopant such as Mg. For example, the second conductive semiconductor layer 13 may include at least one semiconductor material among GaP, GaAs, GaInP, and AlGaInP doped with Mg. In other words, the second conductive semiconductor layer 13 may include a p-type semiconductor layer. The material forming the second conductive semiconductor layer 13 is not limited to this, and the second conductive semiconductor layer 13 may be formed of various other materials.

Referring to FIGS. 1A, 1B, 2A to 2D, the electrode layer 15 is formed on the second conductive semiconductor layer 13.

The electrode layer 15 may include metal or metal oxide. For example, the electrode layer 15 may use Cr, Ti, Al, Au, Ni, ITO, IZO, ITZO, oxide or alloy thereof alone or in combination. In an embodiment of the present disclosure, the electrode layer 15 may be made of transparent metal oxide such as indium tin oxide (ITO) so as to reduce or minimize the loss of light generated from the active layer 12 and emitted to the outside of the light emitting element LD and improve current spreading effects to the second conductive semiconductor layer 13.

As described above, the first conductive semiconductor layer 11, the active layer 12, the second conductive semiconductor layer 13, and the electrode layer 15 that are sequentially stacked on the substrate 1 may form an emissive stacked body 10'.

The electrode layer 15 may be deposited on the second conductive semiconductor layer 13 by a sputtering method. However, because a nitrogen vacancy may be formed by plasma in the light emitting element LD including a nitride-based semiconductor, the ohmic contact characteristics of the electrode layer 15 deposited by the sputtering method may be deteriorated. Thus, in consideration of the amount of oxygen and the deposition temperature, the electrode layer 15 may be directly deposited on the second conductive semiconductor layer 13 by an e-beam evaporation method to improve the transmittance of the electrode layer 15. However, a method of forming the electrode layer 15 on the second conductive semiconductor layer 13 is not limited to the above-described embodiment, but may employ a conventional deposition method. In an embodiment of the present disclosure, by controlling the amount of oxygen in a chamber where a deposition process is performed, the deposition temperature, and the deposition time when the electrode layer 15 is formed on the second conductive semiconductor layer 13, the electrode layer 15 having the thickness d4 (e.g., a thickness of a predetermined level), for example about 1 μm is formed on the second conductive semiconductor layer 13.

Referring to FIGS. 1A, 1B, 2A to 2E, a mask layer 20 is formed on the electrode layer 15. The mask layer 20 may include an insulating layer and a metal layer. The insulating layer may be formed on the electrode layer 15. The insulating layer may serve as a mask for continuous etching of the emissive stacked body 10'. The insulating layer may be formed of oxide or nitride, and may include, for example, silicon oxide ($SiO_x$) or silicon nitride ($SiN_x$). The thickness of the insulating layer may be about 0.5 μm to 1.5 μm, but is not limited thereto. The metal layer may include a metal such as chromium (Cr) or a metal alloy, but is not limited thereto. The metal layer may have the thickness of about 30 nm to 150 nm.

At least one micro pattern FP may be formed on the mask layer 20. The micro pattern FP may be formed through a polymer layer. The micro pattern FP may be formed by forming the polymer layer on the mask layer 20 and then forming patterns on the polymer layer at an interval from a nanometer scale to a micrometer scale. For example, by patterning the polymer layer on the mask layer 20 through a method such as photolithography, electron-beam lithography, or nanoimprint lithography, the micro pattern FP may be formed at the interval from a nanometer scale to a micrometer scale.

Referring to FIGS. 1A, 1B, 2A to 2F, at least one mask pattern 20' is formed by patterning the mask layer 20 using the micro pattern FP as the mask. The mask pattern 20' may be formed in a shape corresponding to the micro pattern FP. The above-described mask pattern 20' may be used as an etching mask for forming the emission stacked pattern 10 by etching the emissive stacked body 10'. The micro pattern FP may be removed through conventional wet etching or dry etching methods, but may be removed through a conventional removal method without being limited to the above-described methods.

Referring to FIGS. 1A, 1B, 2A to 2G, the etching process is performed using the mask pattern 20' as the etching mask to pattern the emissive stacked body 10' at an interval from a nanometer scale to a micrometer scale, thus forming a plurality of emission stacked patterns 10.

In the above-described etching process, an area of the emissive stacked body 10' that does not correspond to the mask pattern 20' may be etched, thus forming a groove HM that causes the area A of the first conductive semiconductor layer 11 to be exposed to the outside. The area of the emissive stacked body 10' corresponding to the mask pattern 20' is not etched.

The groove HM may have a shape that is recessed from the upper surface 15b of the electrode layer 15 of each emission stacked pattern 10 to the area A of the first conductive semiconductor layer 11 in one direction (e.g. a vertical direction).

The etching for forming the plurality of emission stacked patterns 10 may use a dry etching method such as reactive ion etching (RIE), reactive ion beam etching (RIBE), or inductively coupled plasma reactive ion etching (ICP-RIE). Unlike the wet etching method, the dry etching method is suitable for forming the emission stacked patterns 10 because anisotropic etching is possible. In other words, in the wet etching method, isotropic etching is performed, so that etching is performed in all direction. In contrast, in the dry etching method, etching may be mainly performed in a depth direction to form the groove HM, so that the size and spacing of the groove HM may be formed in a desired pattern.

In an embodiment of the present disclosure, each of the emission stacked patterns 10 may have a size ranging from a nanometer scale to a micrometer scale.

After the above-described etching process is performed, residues remaining on the emission stacked patterns 10, i.e. the mask pattern 20' may be removed through the conventional wet etching or dry etching method. However, the described embodiment of the present disclosure may remove the residues through a conventional removal method without being limited thereto. Here, the mask pattern 20' (or the residues) may include an etching mask, an insulating material and others, that are required in the mask process.

Referring to FIGS. 1A, 1B, 2A to 2H, the insulating material layer 14' is formed on the emission stacked patterns 10 and the area A of the first conductive semiconductor layer 11. The insulating material layer 14' may include an upper insulating material layer, a side insulating material layer, and a lower insulating material layer. The upper insulating material layer may completely cover the upper surface of each of the emission stacked patterns 10. Here, the upper surface of each of the emission stacked patterns 10 may be the upper surface 15b of the electrode layer 15. In other words, the upper insulating material layer may completely cover the upper surface 15b of the electrode layer 15 of each of the emission stacked patterns 10. The side insulating material layer may completely cover a side surface of each of the emission stacked patterns 10. The lower insulating material layer may completely cover the area A of the first conductive semiconductor layer 11 exposed to the outside by the groove HM.

The upper insulating material layer, the side insulating material layer, and the lower insulating material layer may be continuously connected to each other (e.g., may be integrally formed) on the substrate 1.

Although a method of forming the insulating material layer 14' may use a method of applying insulating material onto the emission stacked patterns 10 attached to the substrate 1, the present disclosure is not limited thereto. The material used as the insulating material layer 14' may include any one selected from a group consisting of $SiO_2$, $Si_3N_4$, $Al_2O_3$ and $TiO_2$, but is not limited thereto. For example, an $Al_2O_3$ film may be formed through atomic layer deposition (ALD), and a thin film may be formed using chemical adsorption and desorption by supplying a TMA (trimethyl aluminium) and $H_2O$ source in a pulse form. A thickness of the insulating material layer 14' may range from 30 nm to 150 nm, but is not limited thereto.

Referring to FIGS. 1A, 1B, 2A to 2I, the etching process is performed to remove a portion of the insulating material layer 14' formed on the substrate 1, thus forming the insulating film 14.

In the etching process of forming the insulating film 14, the upper insulating material layer and the lower insulating material layer may be removed to finally form the insulating film 14 including only the side insulating material layer covering the side surface of each emission stacked pattern 10. Through the above-described etching process, the upper insulating material layer may be removed, so that the upper surface 15b of the electrode layer 15 may be exposed to an outside. In this case, the upper surface 14b of the insulating film 14 and the upper surface 15b of the electrode layer 15 may be provided and/or formed at the same surface (or the same line). Furthermore, the lower insulating material layer may be removed through the above-described etching process, so that the area A of the first conductive semiconductor layer 11 may be exposed to the outside.

Through the above-described etching process, the light emitting elements LD including the emission stacked patterns 10 and the insulating film 14 surrounding the outer surface (e.g., an outer peripheral or circumferential surface) (or the surface) of each of the emission stacked patterns 10 may be finally formed. In this case, the upper surface 15b of the electrode layer 15 exposed to the outside may become the upper surface LD_2 of each of the light emitting elements LD.

Referring to FIGS. 1A, 1B, 2A to 2J, the light emitting elements LD are separated from the substrate 1 through a chemical lift-off (CLO) method using an etchant. For example, the sacrificial layer 3 may be removed to separate the light emitting elements LD from the substrate 1.

Generally, the chemical lift-off method may be performed through the wet etching method. In an embodiment, because a portion of the upper surface 15b of the electrode layer 15 exposed to the outside by etching gas used in the chemical lift-off method may be removed. However, because the electrode layer 15 has the thickness d4 (e.g., a thickness of a predetermined level) or more, for example, about 1 μm, the electrode layer 15 may not be directly affected by the etching gas.

The method of separating the light emitting elements LD from the substrate 1 is not limited to the above-described embodiment. In an embodiment, the light emitting elements LD may be separated from the substrate 1 using a laser lift-off (LLO) method using laser, a physical lift-off method of forming an empty space between the light emitting elements LD and the substrate 1 and applying small physical force or impact, or the like.

Through the above-described manufacturing process, each of the finally manufactured light emitting elements LD may include the active layer 12 that is positioned in the middle (or center) of each of the light emitting elements LD or positioned adjacent to the middle (or center) thereof along the length L of each light emitting element LD.

Figure 3A:
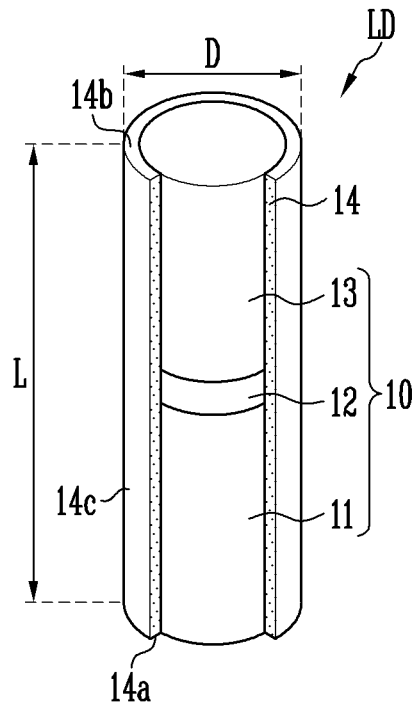
FIG. 3A is a perspective cutaway view schematically illustrating a light emitting element in accordance with an embodiment of the present disclosure.
Figure 3B:
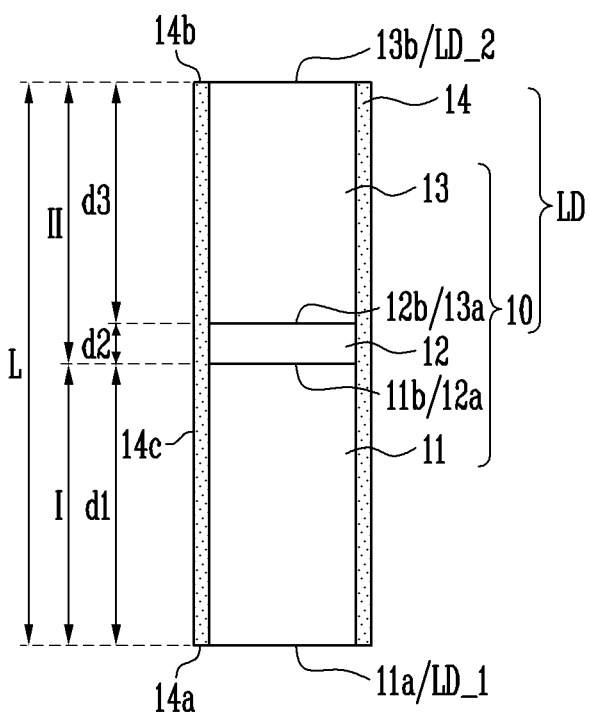
FIG. 3B is a sectional view illustrating the light emitting element of FIG. 3A.

FIG. 3A is a perspective view schematically illustrating a light emitting element in accordance with an embodiment of the present disclosure, and FIG. 3B is a sectional view illustrating the light emitting element of FIG. 3A.

To avoid redundant explanation, the description of the light emitting element of FIGS. 3A and 3B will be focused on differences from that of the foregoing embodiments. Components that are not separately explained in the following description of the present embodiment comply with that of the foregoing embodiments. The same reference numeral will be used to designate the same component, and a similar reference numeral will be used to designate a similar component.

Although FIGS. 3A and 3B illustrate a cylindrical light emitting element for the convenience of illustration, the type and/or shape of the light emitting element in accordance with an embodiment of the present disclosure are not limited thereto.

Referring to FIGS. 3A and 3B, the light emitting element LD in accordance with an embodiment of the present disclosure may include a first conductive semiconductor layer 11, a second conductive semiconductor layer 13, and an active layer 12 interposed between the first and second conductive semiconductor layers 11 and 13.

In an embodiment of the present disclosure, the light emitting element LD may be implemented as the emission stacked pattern 10 formed by successively stacking the first conductive semiconductor layer 11, the active layer 12, and the second conductive semiconductor layer 13 in this order. The light emitting element LD may further include an insulating film 14 configured to enclose an outer surface (e.g., an outer peripheral or circumferential surface) (or a surface) of the emission stacked pattern 10.

The light emitting element LD and/or the emission stacked pattern 10 may be provided in a cylindrical shape, but may be provided in the shape of a polygonal column or a triangular column, without being limited thereto. The light emitting element LD may be provided in the shape of a rod extending in the longitudinal direction L. The light emitting element LD may have a first end (or lower end) or a second end (or upper end) in the longitudinal direction L. One of the first and second conductive semiconductor layers 11 and 13 may be disposed in the first end (or the lower end), and the other one of the first and second conductive semiconductor layers 11 and 13 may be disposed in the second end (or the upper end). In an embodiment of the present disclosure, the first conductive semiconductor layer 11 may be disposed in the first end of the light emitting element LD, and the second conductive semiconductor layer 13 may be disposed in the second end of the light emitting element LD.

The light emitting element LD may include a lower surface 11a of the first conductive semiconductor layer 11 and an upper surface 13b of the second conductive semiconductor layer 13 that are positioned on the opposite ends of the light emitting element and are exposed to an outside. The lower surface 11a of the first conductive semiconductor layer 11 and the upper surface 13b of the second conductive semiconductor layer 13 may be surfaces that are in contact with an external conductive material to be electrically connected thereto.

The first conductive semiconductor layer 11 may be at least one n-type semiconductor layer doped with n-type impurities. The first conductive semiconductor layer 11 may supply electrons to the active layer 12. The first conductive semiconductor layer 11 may include a GaN layer doped with the n-type impurities, for example, Si. However, without being limited thereto, the first conductive semiconductor layer 11 may include various semiconductor materials. The first conductive semiconductor layer 11 may be formed of any one of a GaInP layer, an AlGaN layer, an InAlGaN layer, an AlGaAs layer, a GaP layer, a GaAs layer, a GaAsP layer, and an AlGaInP layer. In an embodiment, the first conductive semiconductor layer 11 may include a lower cladding layer that is in contact with the lower surface 12a of the active layer 12. The lower cladding layer may be formed of a semiconductor layer having a band gap that is larger than an energy band gap of the active layer 12 to restrain electrons or holes.

The active layer 12 may be provided and/or formed on the upper surface 11b of the first conductive semiconductor layer 11, and may include any one of a double hetero structure, a multi well structure, a single quantum well structure, a multi quantum well (MQW) structure, a quantum dot structure, or a quantum wire structure. The active layer 12 may be formed of a well layer and a barrier layer, for example, a pair structure of at least one of AlGaN/AlGaN, InGaN/GaN, InGaN/InGaN, AlGaN/GaN, InAlGaN/GaN, GaAs(InGaAs)/AlGaAs, and GaP(InGaP)/AlGaP, using a compound semiconductor material of Groups III-V elements, but is not limited thereto. The well layer may be formed of a material having an energy band gap smaller than that of the barrier layer.

In an embodiment of the present disclosure, the active layer 12 may emit red-based or infrared-based light in a wavelength range of 580 nm to 900 nm.

The second conductive semiconductor layer 13 may be provided and/or formed on the upper surface 12b of the active layer 12, and may supply holes to the active layer 12. The second conductive semiconductor layer 13 may include a semiconductor layer of a type different from that of the first conductive semiconductor layer 11. For example, the second conductive semiconductor layer 13 may include at least one p-type semiconductor layer. For example, the second conductive semiconductor layer 13 may include at least one semiconductor material among InAlGaN, GaN, AlGaN, InGaN, AlN, and InN. In an embodiment, the second conductive semiconductor layer 13 may include an upper cladding layer that is in contact with the upper surface 12b of the active layer 12. The upper cladding layer may be formed of a semiconductor layer having a band gap larger than a band gap of the active layer 12 to restrain electrons or holes.

The insulating film 14 may prevent the active layer 12 from short-circuiting due to making contact with a conductive material except for the first conductive semiconductor layer 11 and the second conductive semiconductor layer 13 of the same light emitting element LD.

In an embodiment of the present disclosure, the first conductive semiconductor layer 11, the active layer 12, and the second conductive semiconductor layer 13, which are successively stacked in the longitudinal direction L of the light emitting element LD, may have different thicknesses. To be more specific, the thickness d1 of the first conductive semiconductor layer 11, the thickness d2 of the active layer 12, and the thickness d3 of the second conductive semiconductor layer 13 in the longitudinal direction L of the light emitting element LD may be different from each other.

In an embodiment of the present disclosure, the thickness d1 of the first conductive semiconductor layer 11 may represent a distance between the lower surface 11a or LD_1 of the first conductive semiconductor layer 11 and the upper surface 11b thereof in the longitudinal direction L of the light emitting element LD. The thickness of the active layer 12 may represent a distance between the lower surface 12a of the active layer 12 and the upper surface 12b thereof in the longitudinal direction L of the light emitting element LD. The thickness d3 of the second conductive semiconductor layer 13 may represent a distance between the lower surface 13a of the second conductive semiconductor layer 13 and the upper surface 13b thereof in the longitudinal direction L of the light emitting element LD.

In an embodiment of the present disclosure, the thickness d1 of the first conductive semiconductor layer 11 may be greater than each of the thickness d2 of the active layer 12 and the thickness d3 of the second conductive semiconductor layer 13. Furthermore, the thickness d1 of the first conductive semiconductor layer 11 may be equal or similar to the sum of the thickness d2 of the active layer 12 and the thickness d3 of the second conductive semiconductor layer 13. However, the present disclosure is not limited thereto. According to an embodiment, the thickness d1 of the first conductive semiconductor layer 11 may be smaller or greater than the sum of the thickness d2 of the active layer 12 and the thickness d3 of the second conductive semiconductor layer 13. In an embodiment of the present disclosure, the thickness d1 of the first conductive semiconductor layer 11 may be substantially equal or similar to the sum of the thickness d2 of the active layer 12 and the thickness d3 of the second conductive semiconductor layer 13.

The light emitting element LD may include a first area I and a second area II. The first area I and the second area II may be divided based on the lower surface 12a of the active layer 12 that is in contact with the upper surface 11b of the first conductive semiconductor layer 11 in the longitudinal direction L of the light emitting element LD.

In an embodiment of the present disclosure, the first area I may represent an area extending from the lower surface 11a of the first conductive semiconductor layer 11 to the lower surface 12a of the active layer 12 in the longitudinal direction L of the light emitting element LD. The first conductive semiconductor layer 11 may be positioned in the first area I. The second area II may represent an area extending from the lower surface 12a of the active layer 12 to the upper surface 13b of the second conductive semiconductor layer 13 in the longitudinal direction L of the light emitting element LD. The active layer 12 and the second conductive semiconductor layer 13 may be positioned in the second area II.

As described above, because the first conductive semiconductor layer 11 is positioned in the first area I, the width of the first area I in the longitudinal direction L of the light emitting element LD may be substantially equal to the thickness d1 of the first conductive semiconductor layer 11. Furthermore, because components other than the first conductive semiconductor layer 11, for example, the active layer 12 and the second conductive semiconductor layer 13 are positioned in the second area II, the width of the second area II in the longitudinal direction L of the light emitting element LD may be substantially the same as the sum of the thickness d2 of the active layer 12 and the thickness d3 of the second conductive semiconductor layer 13.

In an embodiment of the present disclosure, the first area I and the second area II may have the same width and/or a similar width. In this case, the active layer 12 may be closer to the upper surface 13b of the second conductive semiconductor layer 13 than the lower surface 11a of the first conductive semiconductor layer 11 in the longitudinal direction L of the light emitting element LD and/or the emission stacked pattern 10.

In an embodiment of the present disclosure, the active layer 12 may be positioned in the middle (or the center) of the light emitting element LD or may be positioned adjacent to the middle (or the center) of the light emitting element LD in the longitudinal direction L of the light emitting element LD. When seen in a sectional view, the upper surface 12b of the active layer 12 may not be positioned at a point corresponding to a half of the length L of the light emitting element LD. Similarly, when seen in a sectional view, the upper surface 12b of the active layer 12 may not be positioned at a point corresponding to a half of the length L of the emission stacked pattern 10.

When seen in a sectional view, a ratio of a distance from the upper surface 12b of the active layer 12 to the upper surface 13b of the second conductive semiconductor layer 13 to the length L of each of the light emitting element LD and/or the emission stacked pattern 10 may be 0.5 or less. In other words, when seen in a sectional view, the thickness d3 of the second conductive semiconductor layer 13 in the longitudinal direction L of the light emitting element LD may be equal to or less than a half of the length L of each of the light emitting element LD and/or the emission stacked pattern 10. For example, when the length L of each of the light emitting element LD and/or the emission stacked pattern 10 is 3 μm, the thickness d3 of the second conductive semiconductor layer 13 may be equal to or less than 1.5 μm.

In an embodiment of the present disclosure, a point corresponding to the half of the length L of each of the light emitting element LD and/or the emission stacked pattern 10 may be positioned between the lower surface 12a of the active layer 12 and the upper surface 12b of the active layer 12. However, the present disclosure is not limited to this. In an embodiment, a point corresponding to the half of the length L of each of the light emitting element LD and/or the emission stacked pattern 10 may correspond to the lower surface 12a of the active layer 12 or the upper surface 12b of the active layer 12.

When seen in a sectional view, a distance from the lower surface 12a of the active layer 12 to the upper surface 13b of the second conductive semiconductor layer 13, i.e. the sum of the thickness d2 of the active layer 12 and the thickness d3 of the second conductive semiconductor layer 13 may be equal to or less than the thickness d1 (or the distance) from the lower surface 11a of the first conductive semiconductor layer 11 to the upper surface 11b thereof.

In an embodiment of the present disclosure, the second conductive semiconductor layer 13 provided and/or formed on the active layer 12 may have a thickness d3 (e.g., a thickness of a predetermined level) or more. For example, the second conductive semiconductor layer 13 may have the thickness d3 of about 1.8 μm, but the present disclosure is not limited thereto. The second conductive semiconductor layer 13 may have the thickness d3 of about 1 μm to 2 μm. The second conductive semiconductor layer 13 may be designed to have the thickness d3 of about 1 μm to 2 μm by increasing the thickness of at least one p-type semiconductor layer included in the second conductive semiconductor layer 13 to desired level (e.g., a predetermined level) or more when the light emitting element LD is independently grown on the substrate. The at least one p-type semiconductor layer described above may be a transmissive conductive layer doped with a conductive dopant such as Mg, and may be, for example, a GaP layer.

As described above, when the second conductive semiconductor layer 13 has the thickness d3 (e.g., a thickness of a predetermined level) or more, the length L of the light emitting element LD and/or the emission stacked pattern 10 may be increased. Thus, the active layer 12 may be positioned substantially in the middle (or center) of the light emitting element LD and/or the emission stacked pattern 10 in the longitudinal direction L of the light emitting element LD, or be positioned adjacent to the middle (or center) of the light emitting element LD and/or the emission stacked pattern 10.

For example, when the light emitting element LD has the length L of about 4.5 µm, the lower surface 12a of the active layer 12 may come into contact with the middle (or the center) of the light emitting element LD corresponding to the point of 2.25 µm that is the half of the length L of the light emitting element LD from the lower surface 11a of the first conductive semiconductor layer 11 in the longitudinal direction L of the light emitting element LD. In an embodiment, when the light emitting element LD has the length L of about 4.5 µm, the lower surface 12a of the active layer 12 may come into contact with an area adjacent to the middle (or the center) of the light emitting element LD that is within a range of −20% to +20% from the point of 2.25 µm that is the half of the length L of the light emitting element LD from the lower surface 11a of the first conductive semiconductor layer 11 in the longitudinal direction L of the light emitting element LD. In other words, when the light emitting element LD and/or the emission stacked pattern 10 has the length L of 4.5 µm, the lower surface 12a of the active layer 12 may be positioned at a point of 1.8 µm to 2.7 µm in the longitudinal direction L within the light emitting element LD and/or the emission stacked pattern 10.

However, an area where the active layer 12 is positioned in the longitudinal direction L of the light emitting element LD in the light emitting element LD and/or the emission stacked pattern 10 is not limited to the above-described embodiments. The location of the active layer 12 may be changed in various ways depending on the design condition, size and/or length of the light emitting element LD, and the requirements of an electronic device to which the light emitting element LD is applied.

As described above, when the active layer 12 is positioned in the middle (or the center) of the light emitting element LD and/or the emission stacked pattern 10 in the longitudinal direction L of the light emitting element LD or is adjacent to the middle (or the center) of the light emitting element LD and/or the emission stacked pattern 10, light emitted from the active layer 12 may uniformly (or evenly) travel to both ends (e.g., LD_1 and LD_2) of the light emitting element LD and/or the emission stacked pattern 10 without being biased in one direction. Thus, the intensity of the light emitted from both ends of the light emitting element LD and/or the emission stacked pattern 10 becomes uniform, so that the light efficiency of the light emitting element LD and/or the emission stacked pattern 10 may be improved.

FIGS. 4A to 4I are sectional views sequentially illustrating a method of manufacturing the light emitting element of FIGS. 3A and 3B.

Figure 4A:
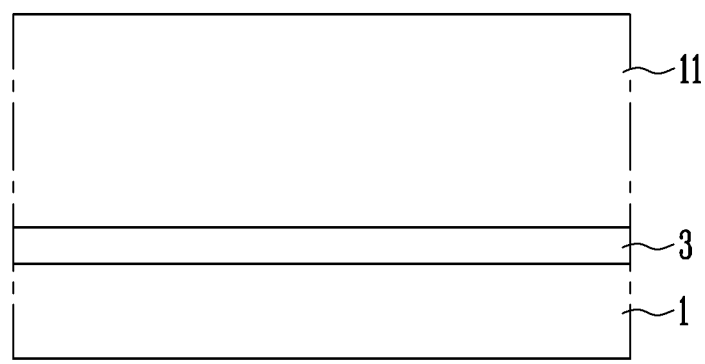
FIGS. 4A to 4I are sectional views sequentially illustrating a method of manufacturing the light emitting element of FIGS. 3A and 3B.
Figure 4B:
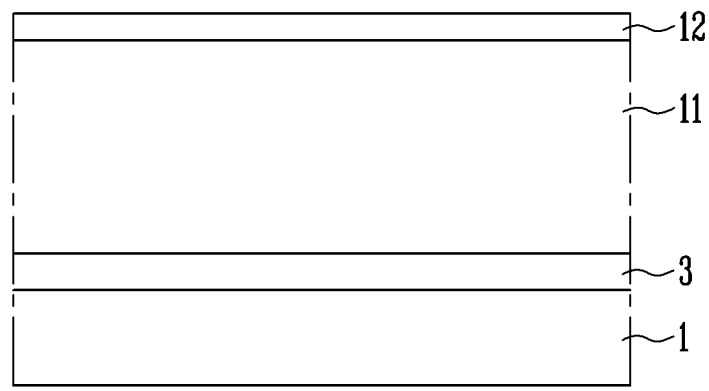
Figure 4C:
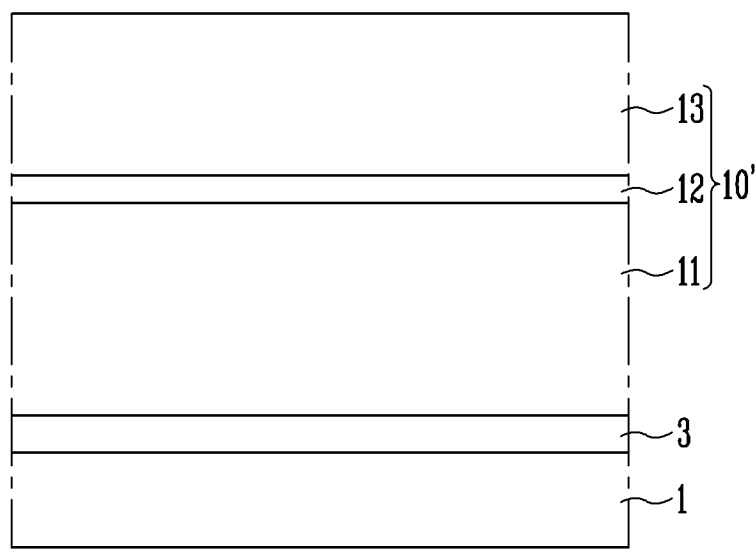
Figure 4D:
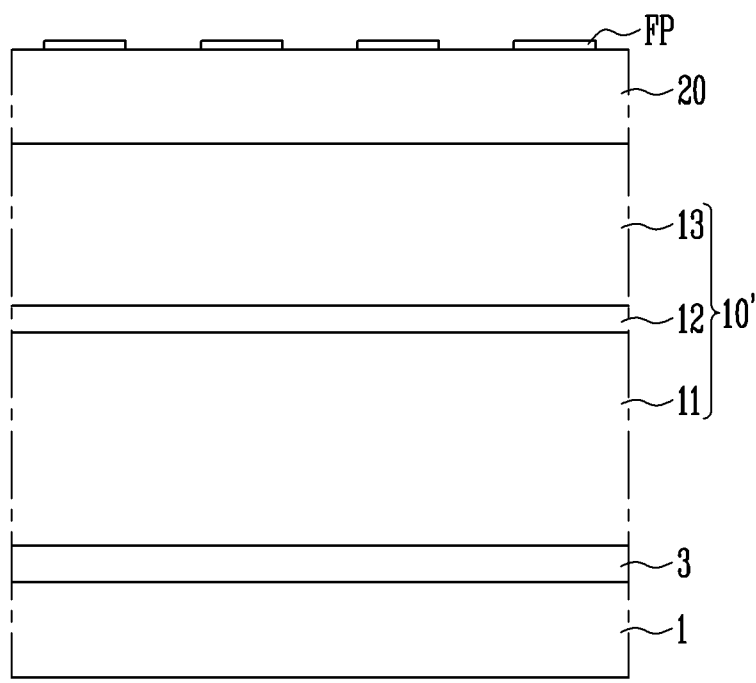
Figure 4E:
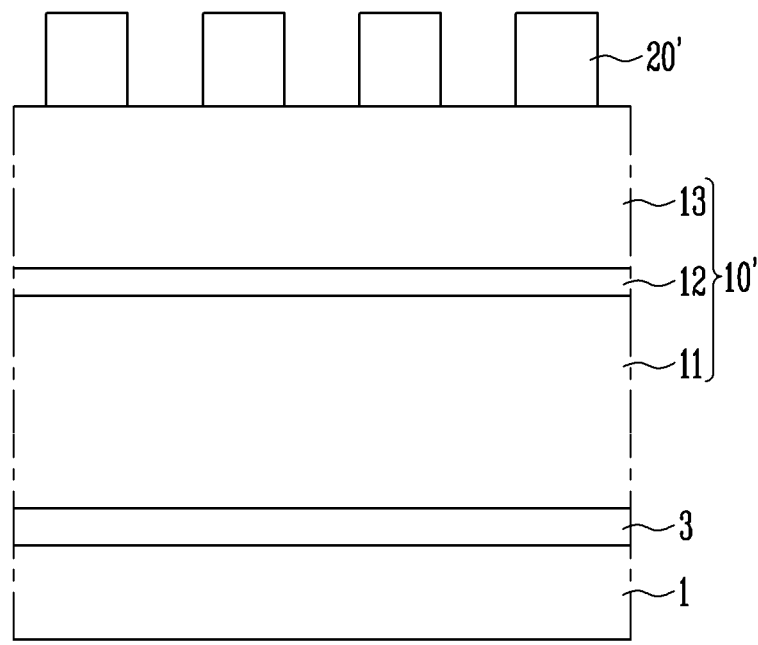
Figure 4F:
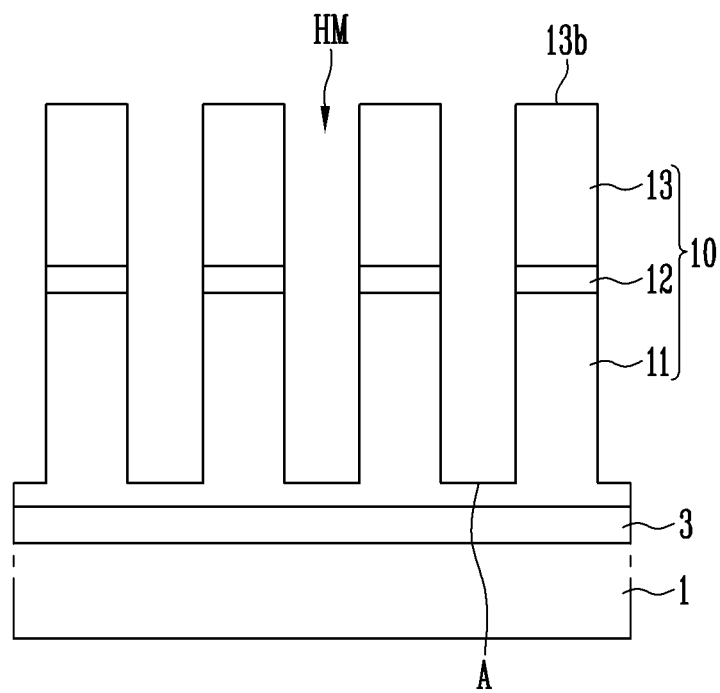
Figure 4G:
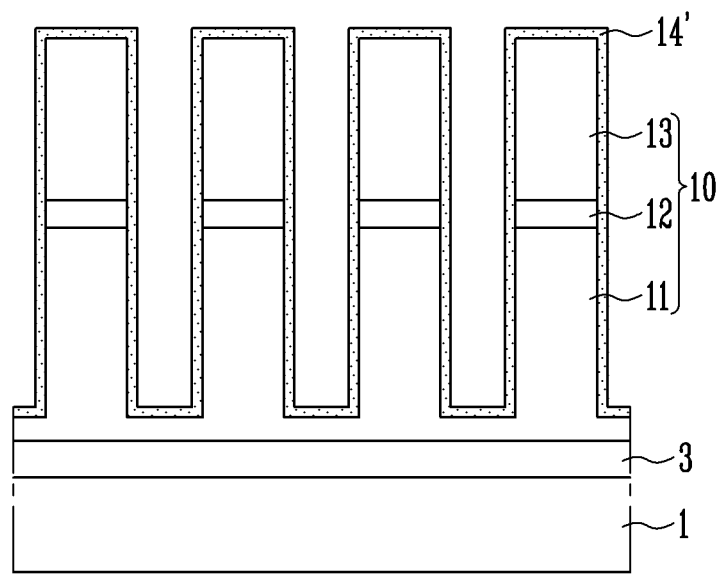
Figure 4H:
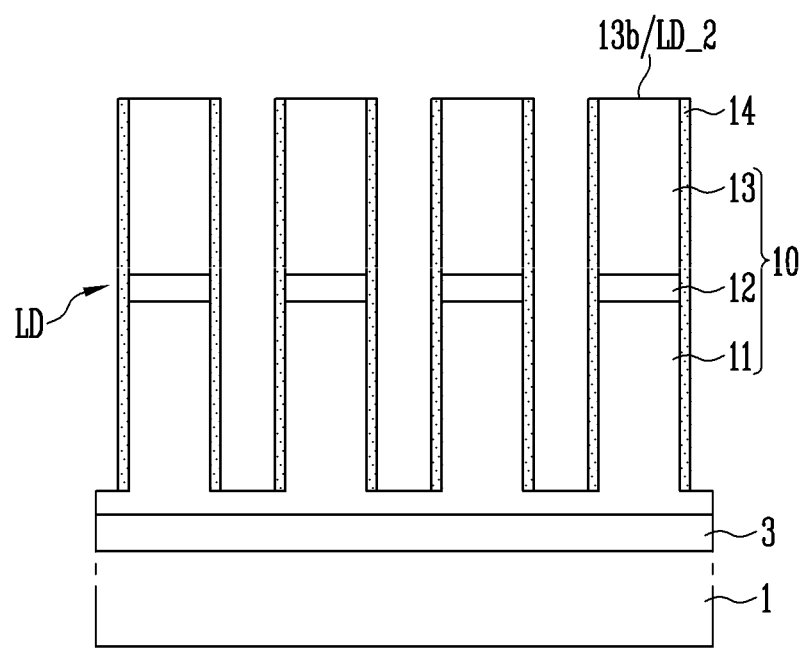
Figure 4I:
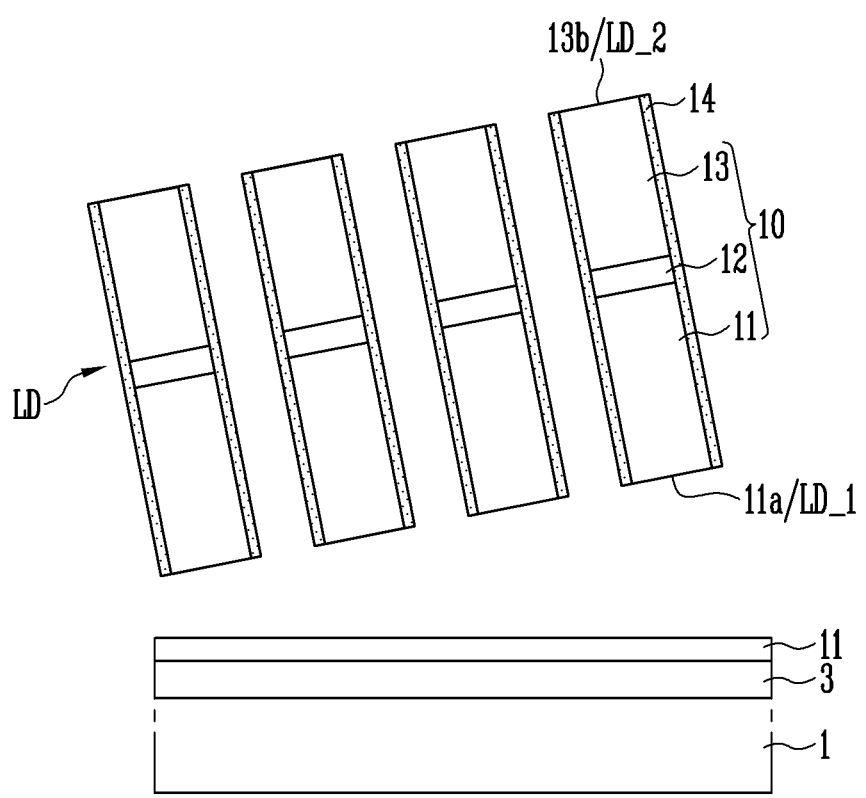

Referring to FIGS. 3A, 3B, and 4A, a sacrificial layer 3 is formed on a substrate 1, and a first conductive semiconductor layer 11 is formed.

The substrate 1 may include a GaAs substrate made of GaAs. The sacrificial layer may be formed of GaAs.

The first conductive semiconductor layer 11 may be formed on the sacrificial layer 3, and may be formed in a multilayer structure including at least one n-type semiconductor layer. The above-described n-type semiconductor layer may include at least one of GaAs, GaInP, AlGaInP, and AlInP.

Referring to FIGS. 3A, 3B, 4A, and 4B, the active layer 12 is formed on the first conductive semiconductor layer 11. The active layer 12 may be formed on the first conductive semiconductor layer 11, and may be an intrinsic semiconductor layer that is not doped with impurities. The active layer 12 may be formed in a single or multi well structure.

In an embodiment of the present disclosure, the active layer 12 may include at least one of GaInP, AlGaInP, GaAs, AlGaAs, InGaAs, InGaAsP, InP, and InAs. Furthermore, the active layer 12 may emit light in a red or infrared band having a wavelength of 580 nm to 900 nm.

Referring to FIGS. 3A, 3B, 4A to 4C, the second conductive semiconductor layer 13 is formed on the active layer 12. The second conductive semiconductor layer 13 may be formed in a multiple layer structure including at least one p-type semiconductor layer. The above-described p-type semiconductor layer may include at least one of AlInP, GaInP, and GaP.

In an embodiment of the present disclosure, the second conductive semiconductor layer 13 may be a transparent conductive layer doped with a conductive dopant, such as Mg, and may include a GaP layer. The transparent conductive layer may include a low-concentration layer doped with Mg and having the thickness of several micrometers, and a high-concentration layer doped with carbon and having the thickness of several hundreds of nanometers, which are sequentially stacked. By controlling the stack thickness (or distance) of the low-concentration layer and the high-concentration layer of the above-described transparent conductive layer when the second conductive semiconductor layer 13 is formed through the epitaxial growth, the second conductive semiconductor layer 13 having the thickness d3 (e.g., a thickness of a predetermined level) or more, for example, about 1.8 µm is formed on the active layer 12. However, a method of forming the second conductive semiconductor layer 13 on the active layer 12 is not limited to the above-described embodiments, but may employ a conventional formation method. For example, the second conductive semiconductor layer 13 may be formed on the active layer 12 using any one method selected from a MOCVD method, a MBE method, a VPE method, and a LPE method.

As described above, the first conductive semiconductor layer 11, the active layer 12, and the second conductive semiconductor layer 13 that are sequentially stacked on the substrate 1 may form an emissive stacked body 10'.

Referring to FIGS. 3A, 3B, 4A to 4D, the mask layer 20 is formed on the second conductive semiconductor layer 13. The mask layer 20 may serve as a mask for continuous etching of the emissive stacked body 10'.

At least one micro pattern FP may be formed on the mask layer 20. The micro pattern FP may be formed by forming the polymer layer on the mask layer 20 and then forming patterns on the polymer layer at an interval from a nanometer scale to a micrometer scale.

Referring to FIGS. 3A, 3B, 4A to 4E, at least one mask pattern 20' is formed by patterning the mask layer 20 using the micro pattern FP as the mask. The mask pattern 20' may be formed in a shape corresponding to the micro pattern FP. The mask pattern 20' may be used as an etching mask for forming the emission stacked pattern 10 by etching the emissive stacked body 10'. After the mask pattern 20' is formed, the micro pattern FP may be removed through the conventional etching method.

Referring to FIGS. 3A, 3B, 4A to 4F, the etching process is performed using the mask pattern 20' as the etching mask to pattern the emissive stacked body 10' at an interval from a nanometer scale to a micrometer scale, thus forming a plurality of emission stacked patterns 10.

In the above-described etching process, an area of the emissive stacked body 10' that does not correspond to the mask pattern 20' may be etched, thus forming a groove HM that causes the area A of the first conductive semiconductor layer 11 to be exposed to the outside. The area of the emissive stacked body 10' corresponding to the mask pattern 20' is not etched.

The groove HM may have a shape that is recessed from the upper surface 13b of the second conductive semiconductor layer 13 of each emission stacked pattern 10 to the area A of the first conductive semiconductor layer 11 in one direction (e.g. a vertical direction).

In an embodiment of the present disclosure, each of the emission stacked patterns 10 may have a size ranging from a nanometer scale to a micrometer scale.

After the above-described etching process is performed, the mask pattern 20' remaining on the emission stacked patterns 10 may be removed through the conventional wet etching or dry etching method. However, the present disclosure may remove the mask pattern through a conventional removal method without being limited thereto.

Referring to FIGS. 3A, 3B, 4A to 4G, the insulating material layer 14' is formed on the emission stacked patterns 10 and the area A of the first conductive semiconductor layer 11. The insulating material layer 14' may completely cover an upper surface of each of the emission stacked patterns 10 and a side surface of each of the emission stacked patterns 10. Furthermore, the insulating material layer 14' may completely cover the area A of the first conductive semiconductor layer 11 exposed to the outside.

The material used as the insulating material layer 14' may include any one selected from a group consisting of $SiO_2$, $Si_3N_4$, $Al_2O_3$ and $TiO_2$, but is not limited thereto.

Referring to FIGS. 3A, 3B, 4A to 4H, the etching process is performed to remove a portion of the insulating material layer 14' formed on the substrate 1, thus forming the insulating film 14. The insulating film 14 may be finally formed to cover the side surface of each emission stacked pattern 10.

Due to the above-described etching process, the upper surface 13b of the second conductive semiconductor layer 13 may be exposed to an outside. In this case, the upper surface 14b of the insulating film 14 and the upper surface 13b of the second conductive semiconductor layer 13 may be provided and/or formed at the same surface (or the same line). Furthermore, the area A of the first conductive semiconductor layer 11 may be exposed to the outside through the above-described etching process.

Through the above-described etching process, the light emitting elements LD including the emission stacked pattern 10 and the insulating film 14 surrounding the outer surface (e.g., an outer peripheral or circumferential surface) (or the surface) of each of the emission stacked patterns 10 may be finally formed. In this case, the upper surface 13b of the second conductive semiconductor layer 13 exposed to the outside may become the upper surface LD_2 of each of the light emitting elements LD.

Referring to FIGS. 3A, 3B, 4A to 4I, the light emitting elements LD are separated from the substrate 1 through the chemical lift-off (CLO) method. For example, the sacrificial layer 3 may be removed to separate the light emitting elements LD from the substrate 1.

Through the above-described manufacturing process, each of the finally manufactured light emitting elements LD may include the active layer 12 that is positioned in the middle (or center) of each of the light emitting elements LD or positioned adjacent to the middle (or center) thereof along the length L of each light emitting element LD.

Figure 5:
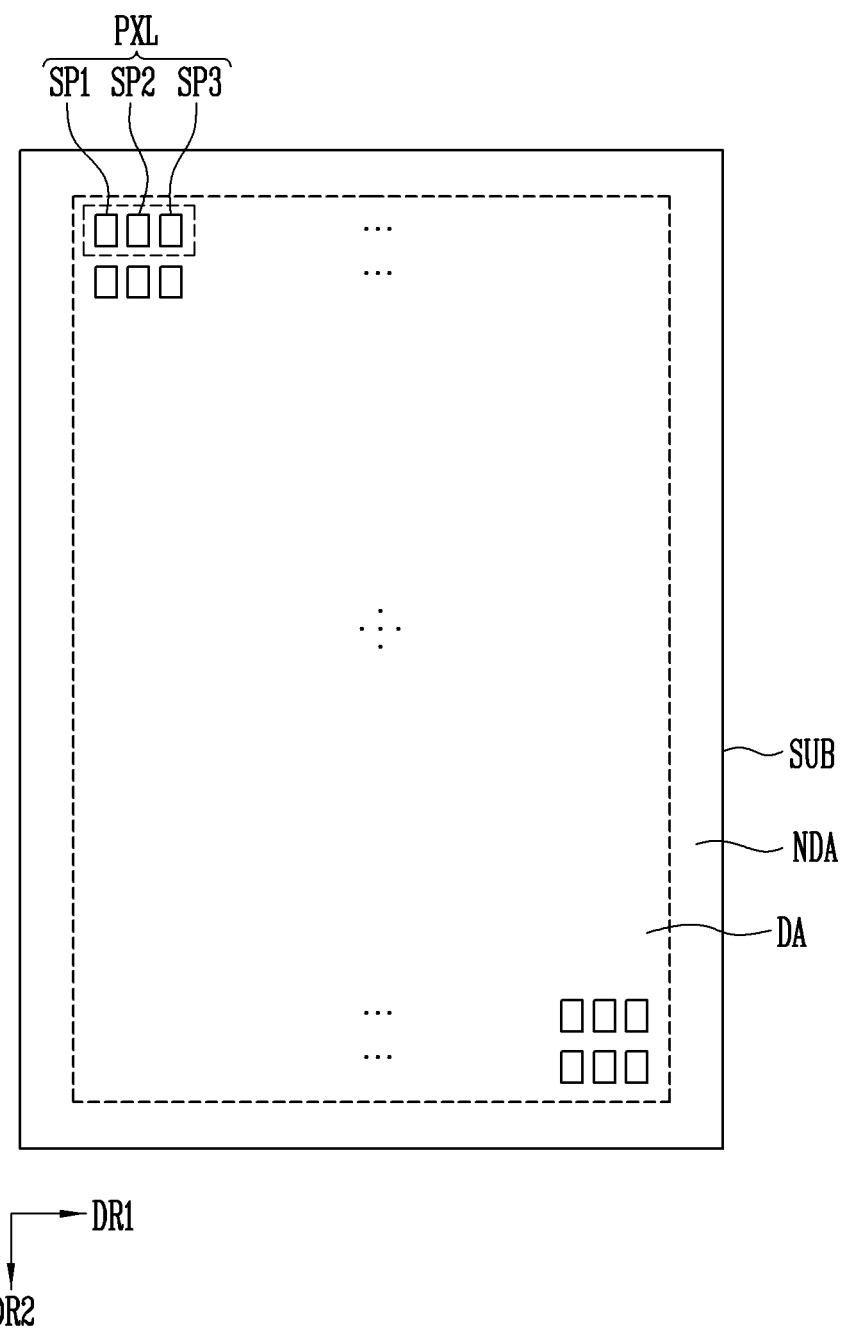
FIG. 5 is a schematic plan view illustrating a display device in accordance with an embodiment of the present disclosure, for example, the display device that uses the light emitting element shown in FIGS. 1A and 1B or FIGS. 3A and 3B as a light emitting source.

FIG. 5 is a schematic plan view illustrating a display device in accordance with an embodiment of the present disclosure, for example, the display device that uses the light emitting element shown in FIGS. 1A and 1B or FIGS. 3A and 3B as a light emitting source.

For the sake of explanation, FIG. 5 schematically illustrates the structure of the display device, focused on a display area on which an image is displayed. In some embodiments, although not illustrated, at least one driving circuit (e.g., a scan driver and a data driver) and/or a plurality of signal lines may be further provided in the display device.

Referring to FIGS. 1A, 1B, 3A, 3B, and 5, the display device in accordance with an embodiment of the present disclosure may include a substrate SUB, a plurality of pixels PXL provided on the substrate SUB and including at least one light emitting element LD, a driver provided in the substrate SUB and driving the pixels PXL, and a line component coupling the pixels PXL with the driver.

The display device may be classified into a passive-matrix type display device and an active-matrix type display device according to a method of driving the light emitting element LD. For example, in the case where the display device is implemented as the active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the present disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA around (e.g., surrounding) the display area DA along the edge or periphery of the display area DA.

In an embodiment, the display area DA may be disposed in a central portion of the display device, and the non-display area NDA may be disposed in a perimeter portion of the display device to enclose the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and a portion of the line component for coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided at at least one side of the display area DA. In an embodiment of the present disclosure, the non-display area NDA may enclose the perimeter of the display area DA.

In some embodiments, the substrate SUB may include a transparent insulating material to allow light transmission. The substrate SUB may be a rigid substrate. For example, the substrate SUB may be one of a glass substrate, a quartz substrate, a glass ceramic substrate, and a crystalline glass substrate.

In some embodiments, the substrate SUB may be a flexible substrate. Here, the substrate SUB may be either a film substrate or a plastic substrate that includes polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials forming the substrate SUB may be changed in various ways, and may include, for example, fiber reinforced plastic (FRP).

The pixels PXL may be provided in the display area DA on the substrate SUB. Each of the pixels PXL displays an image, and a plurality of pixels may be provided.

Each pixel PXL may include the light emitting element LD configured to be driven in response to a corresponding scan signal and a corresponding data signal. The light emitting element LD may have a small size ranging from a micrometer scale to a nanometer scale and may be connected in parallel to light emitting elements LD disposed adjacent thereto. The light emitting element LD may form a light source of each pixel PXL.

Furthermore, each of the pixels PXL may include a plurality of sub-pixels. For example, each pixel PXL may include a first sub-pixel SP1, a second sub-pixel SP2, and a third sub-pixel SP3. In an embodiment, the first sub-pixel SP1, the second sub-pixel SP2, and the third sub-pixel SP3 may emit light of different colors. For instance, the first sub-pixel SP1 may be a first color sub-pixel for emitting light of a first color, the second sub-pixel SP2 may be a second color sub-pixel for emitting light of a second color, and the third sub-pixel SP3 may be a third color sub-pixel for emitting light of a third color. Here, the light of the first color may be red light, the light of the second color may be green light, and the light of the third color may be blue light, but the present disclosure is not limited thereto. However, the colors, types and/or number of sub-pixels forming each pixel PXL are not particularly limited. For example, the color of light that is emitted from each sub-pixel may be changed in various ways. Although in FIG. 5 there is illustrated an embodiment where the pixels PXL are arranged in the display area DA in a stripe shape or in a matrix shape, the present disclosure is not limited thereto. For instance, the display area DA of the display device may have various well-known pixel arrangement shapes.

The driver may provide a signal to each pixel PXL through the line component and thus control the operation of each pixel PXL. In FIG. 5, the line component is omitted for the sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 6A:
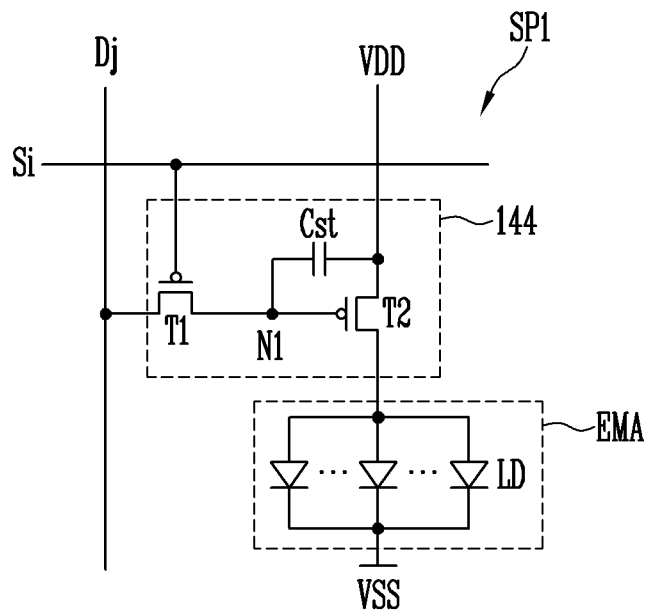
FIGS. 6A to 6C are circuit diagrams illustrating a pixel area of a first sub-pixel included in one of the pixels illustrated in FIG. 5, in accordance with various embodiments.
Figure 6B:
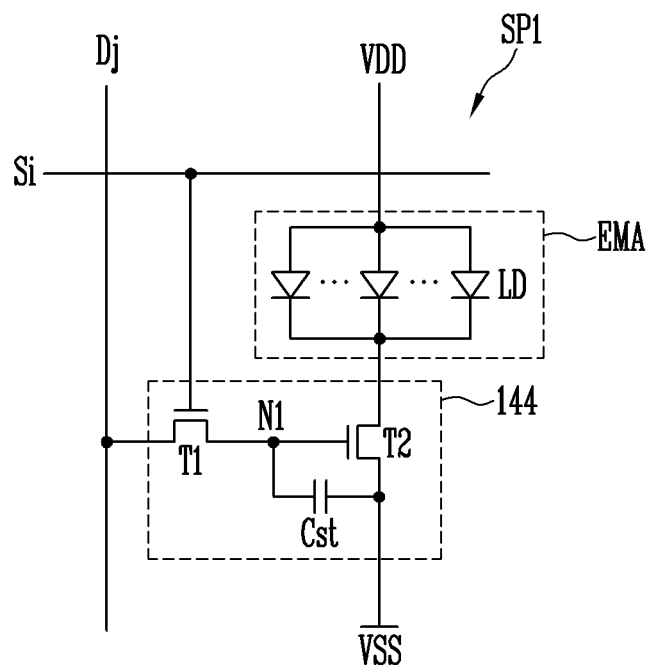
Figure 6C:
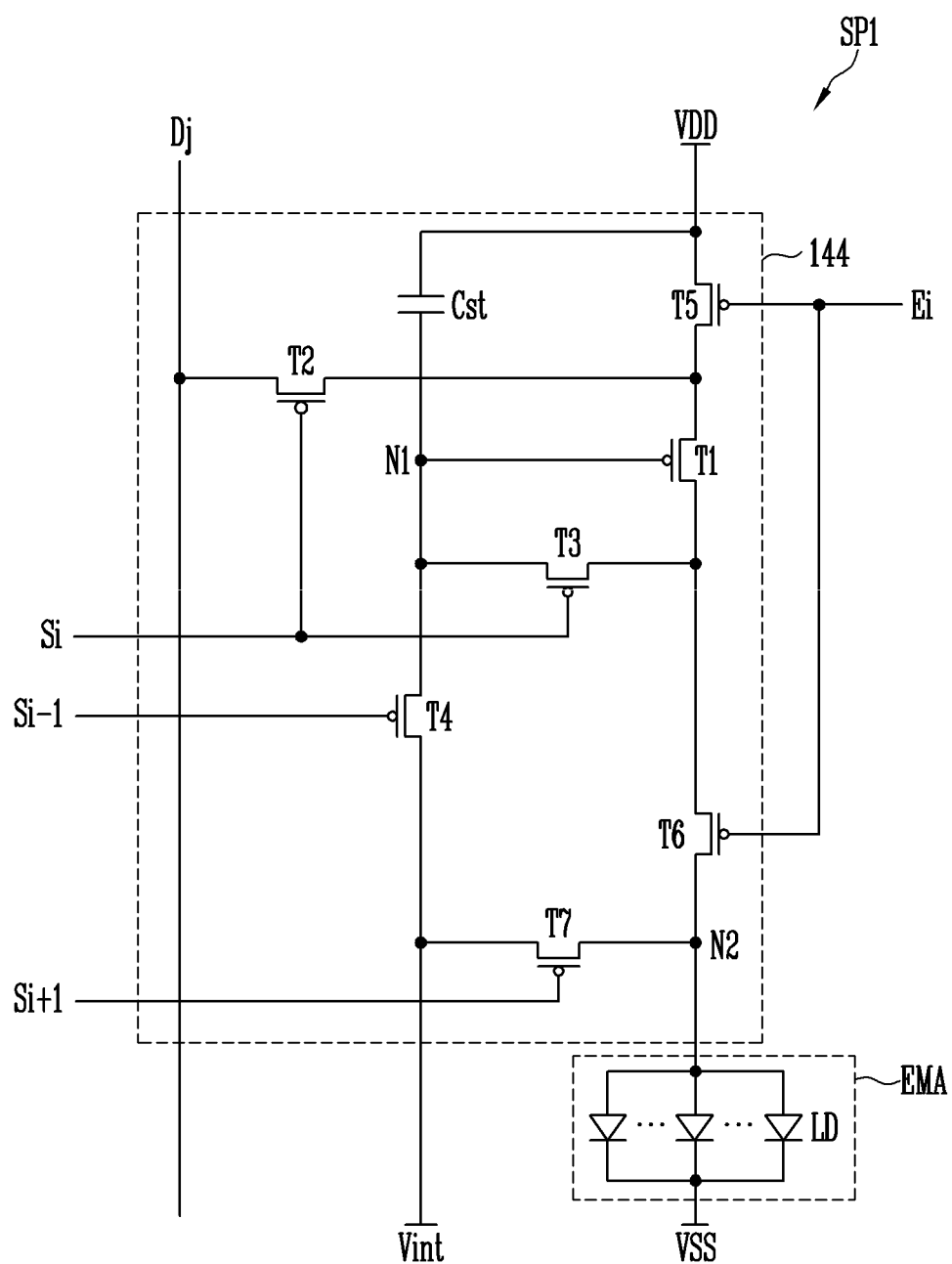

FIGS. 6A to 6C are circuit diagrams illustrating a pixel area of a first sub-pixel included in one of the pixels illustrated in FIG. 5, in accordance with various embodiments.

In FIGS. 6A to 6C, each of the first to third sub-pixels included in one pixel may be configured as an active pixel. However, the type, structure and/or driving method of each of the first to third sub-pixels is not particularly limited. For example, each of the first to third sub-pixels may be configured as a pixel of a passive or active display device of various known structures.

In FIGS. 6A to 6C, the first to third sub-pixels included in one pixel may have substantially the same or similar structure. Hereinafter, for convenience, the first sub-pixel among the first to third sub-pixels will be described as a representative.

First, referring to FIGS. 1A, 5, and 6A, the first sub-pixel SP1 may include a light emitting component (hereinafter, also referred to as emission area) EMA that generates light of a luminance corresponding to a data signal and a pixel driving circuit 144 that drives the light emitting component EMA.

In an embodiment, the light emitting component EMA may include a plurality of light emitting elements LD connected in parallel to each other between a line to which first driving power supply VDD is applied (e.g., via the pixel driving circuit 144) and a line to which second driving power supply VSS is applied. Here, the first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during a light emitting period of the first sub-pixel SP1. A first electrode (e.g., an anode electrode) of each of the light emitting elements LD may be connected to the first driving power supply VDD via the pixel driving circuit 144, and a second electrode (e.g., a cathode electrode) of each of the light emitting elements LD may be connected to the second driving power supply VSS.

Each of the light emitting elements LD may emit light at a luminance corresponding to driving current that is controlled by the pixel driving circuit 144.

Although FIGS. 6A to 6C illustrate an embodiment in which the light emitting elements LD are connected in parallel to each other in the same direction (e.g. forward direction) between the first and second driving power supplies VDD and VSS, the present disclosure is not limited thereto. For example, in another embodiment, some of the light emitting elements LD may be connected to each other in the forward direction between the first and second driving power supplies VDD and VSS, and the other light emitting elements LD may be connected to each other in the reverse direction. One of the first and second driving power supplies VDD and VSS may be supplied in the form of AC voltage. In this case, the light emitting elements LD may alternately emit light for each group having the same coupling direction. Alternatively, in an embodiment, the first sub-pixel SP1 may include only a single light emitting element LD.

In an embodiment of the present disclosure, the pixel driving circuit 144 may include a first transistor T1, a second transistor T2, and a storage capacitor Cst. However, the structure of the pixel driving circuit 144 is not limited to the embodiment illustrated in FIG. 6A.

A first terminal of the first transistor (e.g., switching transistor) T1 is connected to a data line Dj, and a second terminal thereof is connected to a first node N1. Here, the first terminal and the second terminal of the first transistor T1 are different from each other. For example, if the first terminal is a source electrode, the second terminal may be a drain electrode. A gate electrode of the first transistor T1 is connected to the scan line Si.

When a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 is charged in the storage capacitor Cst. For example, the storage capacitor may hold a charge corresponding to the data signal transmitted to the first node N1.

The first terminal of the second transistor T2 (e.g., driving transistor) is connected to the first driving power supply VDD, and the second terminal thereof is electrically connected to the first electrode of each of the light emitting elements LD. A gate electrode of the second transistor T2 is connected to a first node Ni. Such a second transistor T2 controls the amount of driving current to be supplied to the light emitting elements LD in response to the voltage of the first node N1.

One electrode of the storage capacitor Cst is connected to the first driving power supply VDD, and the other electrode thereof is connected to the first node N1. The storage capacitor Cst charges a voltage corresponding to the data signal supplied to the first node N1, and maintains the charged voltage until a data signal of a subsequent frame is supplied.

For the sake of explanation, FIG. 6A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting element LD.

However, the present disclosure is not limited thereto, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 6A, the transistors, e.g., the first and second transistors T1 and T2, included in the pixel driving circuit 144 have been illustrated as being formed of P-type transistors, the present disclosure is not limited to this. In other words, at least one of the first and second transistors T1 and T2 included in the pixel driving circuit 144 may be changed to an N-type transistor.

Next, referring to FIGS. 1A, 5, and 6B, the first and second transistors T1 and T2 in accordance with an embodiment of the present disclosure may be formed of N-type transistors. The configuration and operation of the pixel driving circuit 144 illustrated in FIG. 6B, other than a change in connection positions of some components due to a change in the type of transistor, are similar to those of the pixel driving circuit 144 of FIG. 6A. Therefore, detailed descriptions pertaining to this will be omitted.

In an embodiment of the present disclosure, the configuration of the pixel driving circuit 144 is not limited to the embodiments illustrated in FIGS. 6A and 6B. For example, the pixel driving circuit 144 may be configured in the same manner as that of an embodiment shown in FIG. 6C.

Referring to FIGS. 1A, 5, and 6C, the pixel driving circuit 144 may be connected to the scan line Si and the data line Dj of the first sub-pixel SP1. For example, if the first sub-pixel SP1 is disposed in an i-th row and a j-th column of the display area DA, the pixel driving circuit 144 of the first sub-pixel SP1 may be connected to an i-th scan line Si and a j-th data line Dj of the display area DA.

In an embodiment, the pixel driving circuit 144 may further be connected to at least one different scan line. For example, the first sub-pixel SP1 disposed in the i-th row of the display area DA may also be connected to an i−1-th scan line Si−1 (e.g., a preceding scan line) and/or an i+1-th scan line Si+1 (e.g., a scan line of a subsequent stage).

In an embodiment, the pixel driving circuit 144 may be connected not only to the first and second driving power supplies VDD and VSS but also to a third power supply. For example, the pixel driving circuit 144 may also be connected to an initialization power supply Vint.

The pixel driving circuit 144 may include first to seventh transistors T1 to T7, and a storage capacitor Cst.

The first transistor (e.g., driving transistor) T1 may include a first terminal, e.g., a source electrode, connected to the first driving power supply VDD via the fifth transistor T5, and a second terminal, e.g., a drain electrode, connected to first ends of light emitting elements LD via the sixth transistor T6. A gate electrode of the first transistor T1 may be connected to a first node N1. The first transistor T1 controls driving current flowing between the first driving power supply VDD and the second driving power supply VSS via the light emitting elements LD in response to the voltage of the first node N1.

The second transistor (e.g., switching transistor) T2 is connected between the j-th data line Dj connected to the first sub-pixel SP1 and the first terminal (e.g., a source electrode) of the first transistor T1. A gate electrode of the second transistor T2 is connected to the i-th scan line Si connected to the first sub-pixel SP1. When a scan signal having a gate-on voltage (e.g., a low-level voltage) is supplied from the i-th scan line Si, the second transistor T2 is turned on to electrically connect the j-th data line Dj to the first terminal of the first transistor Ti. Hence, if the second transistor T2 is turned on, a data signal supplied from the j-th data line Dj is transmitted to the first transistor T1.

The third transistor T3 is connected between the second terminal (e.g., a drain electrode) of the first transistor T1 and the first node N1. A gate electrode of the third transistor T3 is connected to the i-th scan line Si. When a scan signal having a gate-on voltage (e.g., a low-level voltage) is supplied from the i-th scan line Si, the third transistor T3 is turned on to electrically connect the drain electrode of the first transistor T1 to the first node N1. Therefore, when the third transistor T3 is turned on, the first transistor T1 is connected in the form of a diode (i.e., the first transistor T1 is diode-connected).

The fourth transistor T4 is connected between the first node N1 and the initialization power supply Vint. A gate electrode of the fourth transistor T4 is connected to a preceding scan line, e.g., an i−1-th scan line Si−1. When a scan signal of a gate-on voltage (e.g., a low-level voltage) is supplied to the i−1-th scan line Si−1, the fourth transistor T4 is turned on so that the voltage of the initialization power supply Vint is transmitted to the first node N1. Here, the initialization power supply Vint may have a voltage equal to or less than the minimum voltage of the data signal.

The fifth transistor T5 is connected between the first driving power supply VDD and the first transistor T1 (e.g., the first terminal or the source electrode of the first transistor T1). A gate electrode of the fifth transistor T5 is connected to a corresponding emission control line, e.g., an i-th emission control line Ei. The fifth transistor T5 is turned off when an emission control signal having a gate-off voltage (e.g., a high-level voltage) is supplied to the i-th emission control line Ei, and is turned on in other cases.

The sixth transistor T6 is connected between the first transistor T1 (e.g., the second terminal or the drain electrode of the first transistor T1) and first ends of the light emitting elements LD or a second node N2. A gate electrode of the sixth transistor T6 is connected to the i-th emission control line Ei. The sixth transistor T6 is turned off when an emission control signal having a gate-off voltage (e.g., a high-level voltage) is supplied to the i-th emission control line Ei, and is turned on in other cases.

The seventh transistor T7 is connected between the first ends of the light emitting elements LD or the second node N2 and the initialization power supply Vint. A gate electrode of the seventh transistor T7 is connected to any one of scan lines of a subsequent stage, e.g., to the i+1-th scan line Si+1. When a scan signal having a gate-on voltage (e.g., a low-level voltage) is supplied to the i+1-th scan line Si+1, the seventh transistor T7 is turned on so that the voltage of the initialization power supply Vint is supplied to the first ends of light emitting elements LD.

The storage capacitor Cst is connected between the first driving power supply VDD and the first node N1. The storage capacitor Cst stores the data signal supplied to the first node N1 during each frame period and a voltage corresponding to the threshold voltage of the first transistor T1.

For convenience, all of the first to seventh transistors T1 to T7 are illustrated in FIG. 6C as the P-type transistor, but the present disclosure is not limited thereto. For example, at least one of the first to seventh transistors T1 to T7 included in the pixel driving circuit 144 may be changed to the N-type transistor, or all of the first to seventh transistors T1 to T7 may be changed to the N-type transistor.

Furthermore, the structure of the first sub-pixel SP1 that may be applied to the present disclosure is not limited to the embodiments shown in FIGS. 6A to 6C, and each sub-pixel may have various well-known structures. For example, the pixel driving circuit 144 included in each sub-pixel may be formed of a well-known pixel circuit which may have various structures and/or may be operated by various driving schemes. In another embodiment of the present disclosure, each sub-pixel may be configured in a passive light emitting display device, or the like. In this case, the pixel driving circuit 144 may be omitted, and the opposite ends of the light emitting elements LD included in the emission area EMA may be directly connected to the scan line Si, the data line Dj, the line to which the first driving power supply VDD is to be applied, the line to which the second driving power supply VSS is to be applied, and/or a control line (e.g., a predetermined control line).

Figure 7:
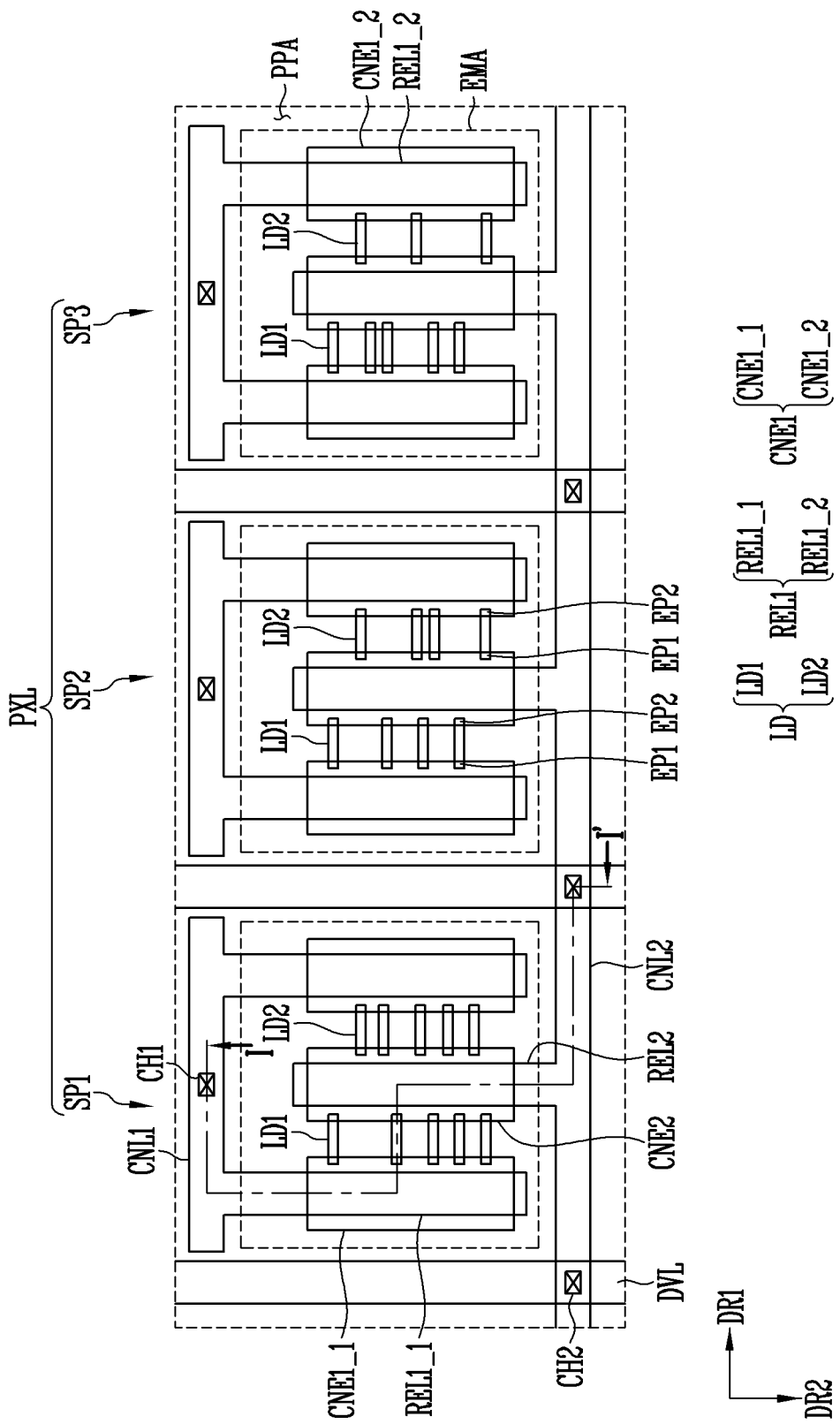
FIG. 7 is a plan view schematically illustrating first to third sub-pixels included in one of the pixels illustrated in FIG. 5.
Figure 8:
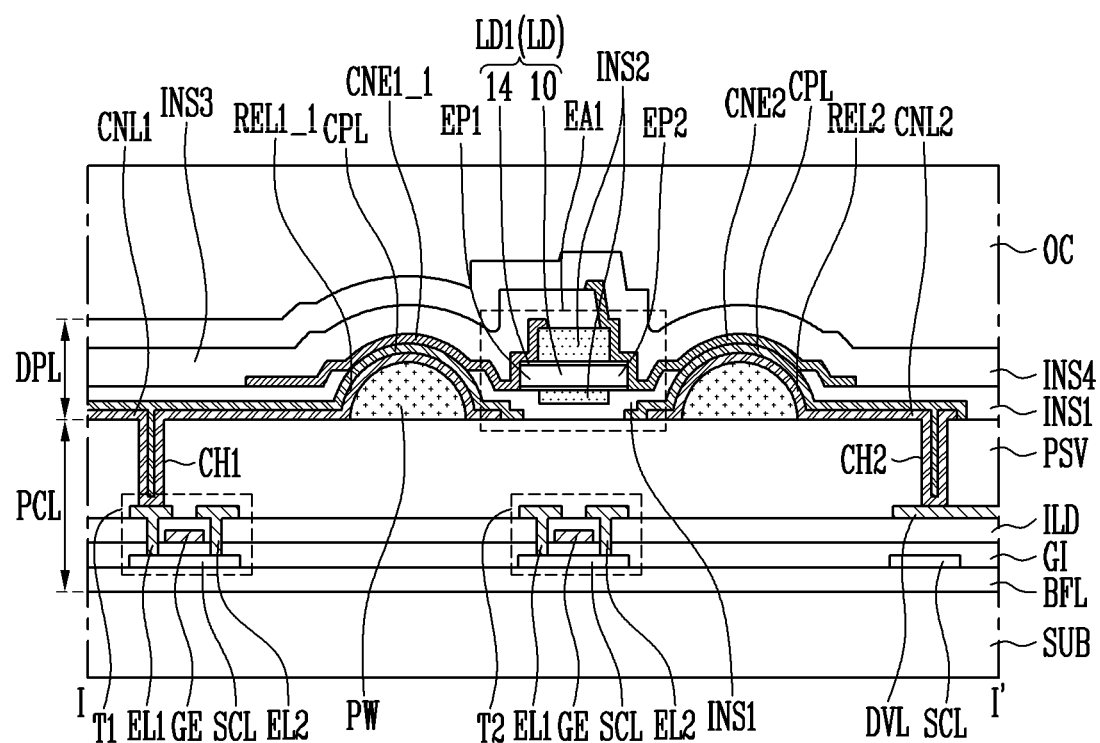
FIG. 8 is a sectional view taken along the line I-I' of FIG. 7.
Figure 9A:
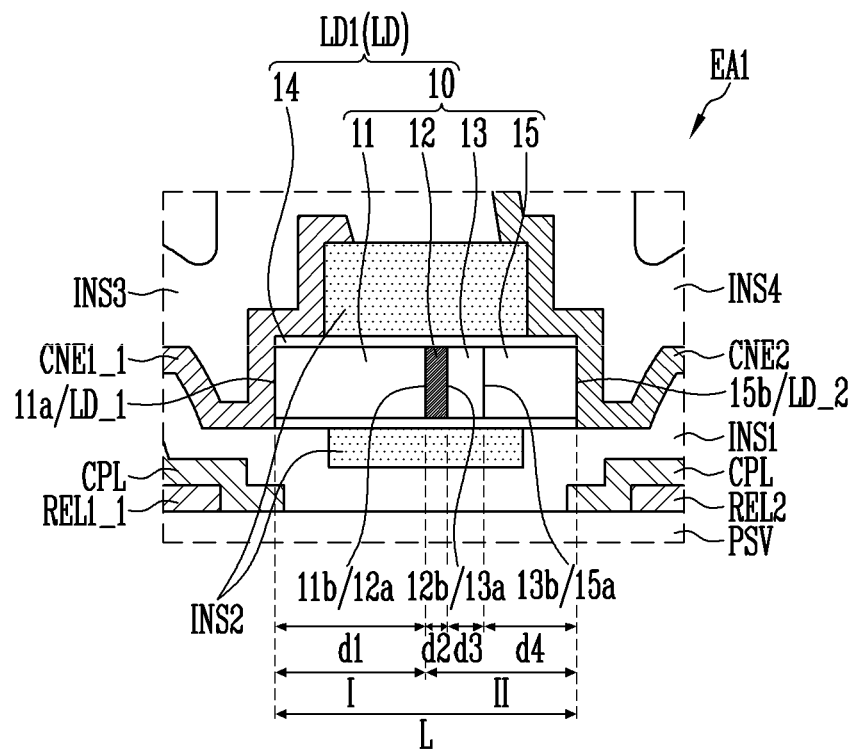
FIG. 9A is an enlarged sectional view of portion EA1 of FIG. 8.
Figure 9B:
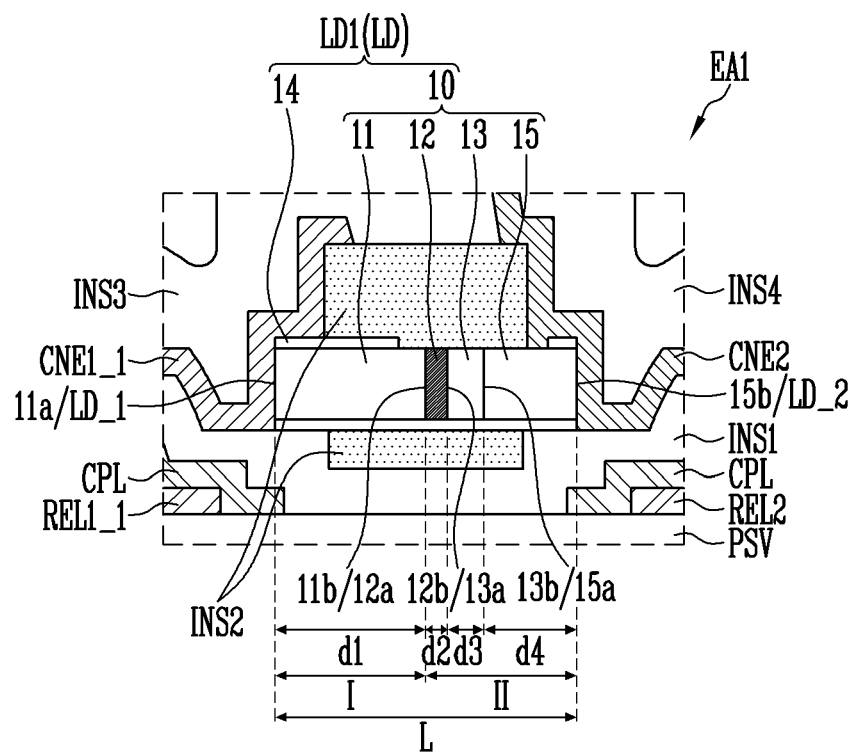
FIG. 9B is an enlarged sectional view illustrating a state in which a portion of an insulating film of a light emitting element of FIG. 9A is detached.
Figure 10:
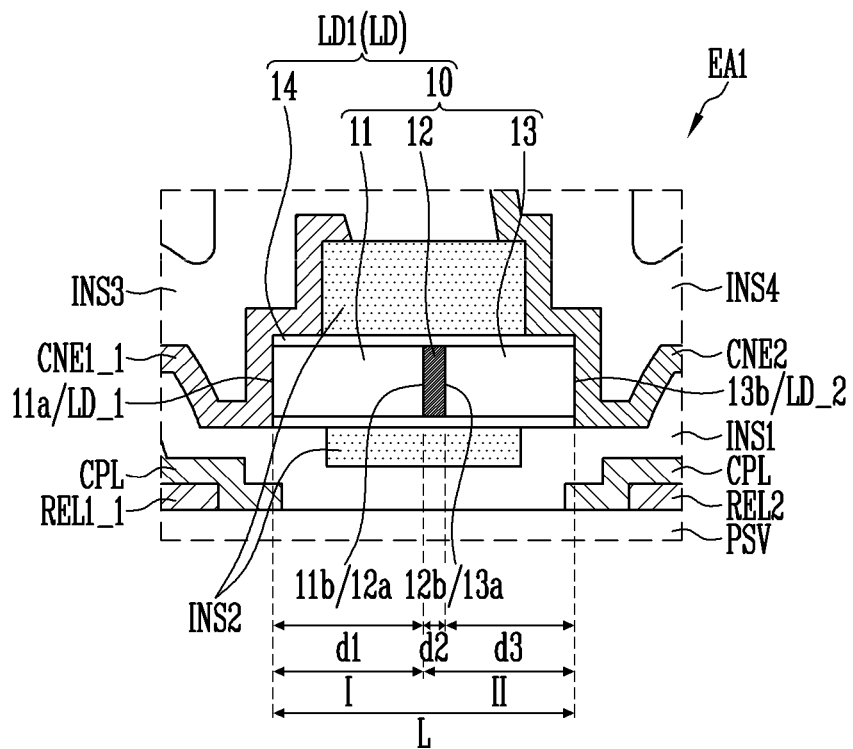
FIG. 10 shows a portion of a display element layer including the light emitting element illustrated in FIG. 3A, and is an enlarged sectional view corresponding to portion EA1 of FIG. 8.
Figure 11:
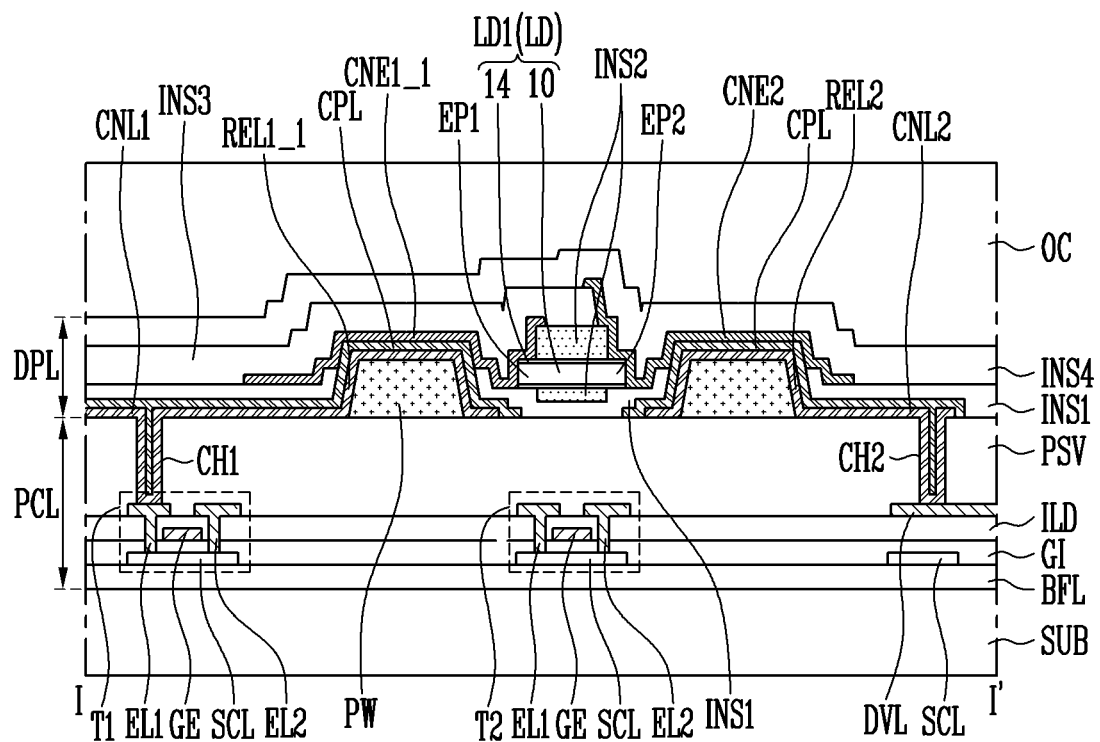
FIG. 11 is a sectional view taken along the line I-I' of FIG. 7, in which a partition wall shown in FIG. 8 is implemented in a different form.

FIG. 7 is a plan view schematically illustrating first to third sub pixels included in one pixel among pixels shown in FIG. 5, FIG. 8 is a sectional view taken along the line I-I' of FIG. 7, FIG. 9A is an enlarged sectional view of portion EA1 of FIG. 8, FIG. 9b is an enlarged sectional view illustrating a state in which a portion of an insulating film of a light emitting element of FIG. 9A is detached, FIG. 10 shows a portion of a display element layer including the light emitting element illustrated in FIG. 3A, and is an enlarged sectional view corresponding to portion EA1 of FIG. 8, and FIG. 11 is a sectional view taken along the line I-I' of FIG. 7, in which a partition wall shown in FIG. 8 is implemented in a different form.

For convenience, illustration of transistors connected to the light emitting elements, and signal lines connected to the transistors has been omitted in FIG. 7.

In addition, FIGS. 7, 8, 9A, 9b, 10, and 11 simplify and show the structure of one pixel, for example, show each electrode as a single electrode layer and each insulating layer as a single insulating layer. However, the present disclosure is not limited thereto.

Further, although FIGS. 8, 9A, 9b, 10, and 11 show only one first light emitting element aligned between a 1-1-th electrode and a second electrode among the light emitting elements for convenience, the one first light emitting element may replace each of the plurality of light emitting elements shown in FIG. 7.

Referring to FIGS. 5, 7, 8, 9A, 9b, 10, and 11, the display device in accordance with an embodiment of the present disclosure may include a substrate SUB on which a plurality of pixels PXL is provided.

Each of the pixels PXL may include a first sub-pixel SP1, a second sub-pixel SP2, and a third sub-pixel SP3 that are provided in the substrate SUB. In an embodiment of the present disclosure, the first sub-pixel SP1 may be a red sub-pixel, the second sub-pixel SP2 may be a green sub-pixel, and the third sub-pixel SP3 may be a blue sub-pixel. However, the present disclosure is not limited thereto. In an embodiment, the first sub-pixel SP1 may be a green sub-pixel or a blue sub-pixel, the second sub-pixel SP2 may be a blue sub-pixel or a red sub-pixel, and the third sub-pixel SP3 may be a red sub-pixel or a green sub-pixel.

Each of the first to third sub-pixels SP1 to SP3 may include an emission area EMA that emits light, and a peripheral area PPA that is positioned around the emission area EMA. The emission area EMA may represent an area in which light is emitted from the light emitting elements LD arranged (or disposed) in each sub-pixel, and the peripheral area PPA may represent an area in which light is not emitted.

In an embodiment of the present disclosure, the pixel area of each of the first to third sub-pixels SP1 to SP3 may include an emission area EMA and a peripheral area PPA of a corresponding sub-pixel. To be more specific, the pixel area of the first sub-pixel SP1 may include the emission area EMA of the first sub-pixel SP1 and the peripheral area PPA positioned around the emission area EMA. The pixel area of the second sub-pixel SP2 may include the emission area EMA of the second sub-pixel SP2 and the peripheral area PPA positioned around the emission area EMA. The pixel area of the third sub-pixel SP3 may include the emission area EMA of the third sub-pixel SP3 and the peripheral area PPA positioned around the emission area EMA.

In the pixel area of each of the first to third sub-pixels SP1 to SP3, the substrate SUB, a pixel circuit layer PCL, and a display element layer DPL may be provided.

The pixel circuit layer PCL of each of the first to third sub-pixels SP1 to SP3 may include a buffer layer BFL disposed on the substrate SUB, at least one transistor disposed on the buffer layer BFL, and a driving voltage line DVL. Furthermore, the pixel circuit layer PCL of each of the first to third sub-pixels SP1 to SP3 may further include a passivation layer PSV provided on the transistor and the driving voltage line DVL.

The substrate SUB may include transparent insulating material to allow light transmission.

The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate that includes polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, material forming the substrate SUB is not limited to the above-described embodiments, and may be changed in various ways.

The buffer layer BFL may be provided on the substrate SUB, and may prevent impurities from diffusing into the transistor. The buffer layer BFL may be omitted depending on the material of the substrate SUB or processing conditions.

The transistor may include a driving transistor T1 that is electrically connected to some of the light emitting elements LD provided in each display element layer DPL of each sub-pixel to drive the light emitting elements LD, and a switching transistor T2 that switches the driving transistor T1. In an embodiment, the transistor included in the pixel circuit layer PCL may further include an additional transistor such as a transistor for compensating for the threshold voltage of the switching transistor T2 in addition to the above-described driving transistor T1 and switching transistor T2, or a transistor for controlling the emission time of each of the light emitting elements LD.

Each of the driving transistor T1 and the switching transistor T2 may include a semiconductor layer SCL, a gate electrode GE, a first terminal EL1 and a second terminal EL2. The first terminal EL1 may be any one of a source electrode and a drain electrode, and the second terminal EL2 may be a remaining electrode of the source electrode and the drain electrode. For example, when the first terminal EL1 is a drain electrode, the second terminal EL2 may be a source electrode, and when the first terminal EL1 is a source electrode, the second terminal EL2 may be a drain electrode.

The semiconductor layer SCL may be disposed on the buffer layer BFL. The semiconductor layer SCL may include a first area that is in contact with the first terminal EL1, and a second area that is in contact with the second terminal EL2. An area between the first area and the second area may be a channel area.

The semiconductor layer SCL may be a semiconductor pattern formed of polysilicon, amorphous silicon, an oxide semiconductor, etc. The channel area may be an intrinsic semiconductor, which is a semiconductor pattern which is not doped with impurities. Each of the source area and the drain area may be a semiconductor pattern doped with impurities.

The gate electrode GE may be provided on the semiconductor layer SCL with a gate insulating layer GI interposed therebetween. For example, the gate insulating layer GI may be provided on the semiconductor layer SCL and the buffer layer BFL.

The first terminal EL1 and the second terminal EL2 may respectively come into contact with the first area and the second area of the semiconductor layer SCL through corresponding contact holes that pass through the interlayer insulating layer ILD and the gate insulating layer GI.

In an embodiment of the present disclosure, at least one transistor included in the pixel circuit layer PCL of each sub-pixel, e.g. the driving and switching transistors T1 and T2 may be formed of a LTPS thin-film transistor. However, without being limited thereto, the transistor may be formed of an oxide semiconductor thin-film transistor according to an embodiment. Further, in an embodiment of the present disclosure, there has been illustrated the case where the driving and switching transistors T1 and T2 are a thin-film transistor having a top gate structure, but the present disclosure is not limited to this. According to an embodiment, the driving and switching transistors T1 and T2 may be a thin-film transistor having a bottom gate structure.

In some embodiments, the interlayer insulating layer ILD may be provided on the gate electrode GE and the gate insulating layer GI. The driving voltage line DVL may be provided on the interlayer insulating layer ILD, but the present disclosure is not limited thereto. In an embodiment, the driving voltage line DVL may be provided on any one of the insulating layers included in the pixel circuit layer PCL. The second driving power supply VSS (FIG. 6A) may be applied to the driving voltage line DVL.

In some embodiments, the passivation layer PSV may be provided on the driving voltage line DVL and the first and second terminals EL1 and EL2 of the transistors T1 and T2. The passivation layer PSV may include a first contact hole CH1 that exposes a portion of the first terminal EL1 of the driving transistor T1, and a second contact hole CH2 that exposes a portion of the driving voltage line DVL. The passivation layer PSV may include at least one of an inorganic insulating layer formed of inorganic material, and/or an organic insulating layer formed of organic material. In an embodiment, the passivation layer PSV may be provided in a form including an inorganic insulating layer covering the driving and switching transistors T1 and T2 and an organic insulating layer disposed on the inorganic insulating layer. Here, the inorganic insulating layer may include at least one of silicon oxide ($SiO_x$) and silicon nitride ($SiN_x$). The organic insulating layer may include organic insulating material that may transmit light. The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

Next, the display element layer DPL of each of the first to third sub-pixels SP1, SP2, and SP3 will be described.

The display element layer DPL of each sub-pixel may include a bank pattern (or partition wall) PW, first and second electrodes REL1 and REL2, first and second connection lines CNL1 and CNL2, first and second contact electrodes CNE1 and CNE2, and a plurality of light emitting elements LD.

The partition wall PW may be provided on the passivation layer PSV in the emission area EMA of each of the first to third sub-pixels SP1, SP2, and SP3. Although not directly shown in the drawings, a dam portion (or a bank) made of the same material as the partition wall PW may be formed and/or provided in the peripheral area PPA between adjacent sub-pixels to define the emission area EMA of each of the first to third sub-pixels SP1, SP2, and SP3.

The partition wall PW may be spaced (e.g., spaced by a predetermined distance) from the adjacent partition wall PW on the passivation layer PSV. Two adjacent partition walls PW may be disposed on the passivation layer PSV to be spaced from each other by a length L or more of one light emitting element LD. As illustrated in FIG. 8, the partition wall PW may include a curved surface having a cross-section such as a semicircle or a semi-ellipse whose width is narrowed from one surface of the passivation layer PSV toward the top, but the present disclosure is not limited thereto.

In an embodiment, as illustrated in FIG. 11, the partition wall PW may have a cross-section of a trapezoid whose width is narrowed from one surface of the passivation layer PSV toward the top. When viewed in a cross-section, the shape of the partition wall PW is not limited to the above-described embodiments, and may be variously changed within a range capable of improving the efficiency of light emitted from each of the light emitting elements LD. Two adjacent partition walls PW may be disposed at the same plane of the passivation layer PSV, and may have the same height (or substantially the same height).

Each of the first and second electrodes REL1 and REL2 may be provided in the emission area EMA of each of the first to third sub-pixels SP1, SP2, and SP3, and may extend in the second direction DR2 (e.g. the 'vertical direction'). The first electrode REL1 and the second electrode REL2 may be provided at the same plane and may be spaced from each other.

The first electrode REL1 may be connected to the first connection line CNL1. To be more specific, the first electrode REL1 may be integrally connected to the first connection line CNL1. In an embodiment of the present disclosure, the first electrode REL1 may include a 1-1-th electrode REL1_1 and a 1-2-th electrode REL1_2 branched along the second direction DR2 from the first connection line CNL1 that is extended in the first direction DR1. The 1-1-th electrode REL1_1, the 1-2-th electrode REL1_2, and the first connection line CNL1 may be integrally provided to be electrically and/or physically connected to each other. In the case where the first electrode REL1 and the first connection line CNL1 are integrally provided and/or formed, the first connection line CNL1 may be regarded as an area of the first electrode REL1. However, the present disclosure is not limited thereto. In an embodiment, the first electrode REL1 and the first connection line CNL1 may be individually formed, so that they may be electrically connected to each other through a contact hole.

The second electrode REL2 may extend in the second direction DR2, and may be electrically connected to the second connection line CNL2 that is extended in the first direction DR1. In an embodiment of the present disclosure, the second electrode REL2 may be branched from the second connection line CNL2 along the second direction DR2. Thus, the second electrode REL2 and the second connection line CNL2 may be integrally provided to be electrically and/or physically connected to each other. In the case where the second electrode REL2 and the second connection line CNL2 are integrally formed and/or provided, the second connection line CNL2 may be regarded as an area of the second electrode REL2. However, the present disclosure is not limited thereto. In an embodiment, the second electrode REL2 and the second connection line CNL2 may be individually formed, so that they may be electrically connected to each other through a contact hole.

As illustrated in FIG. 7, the first electrode REL1 may be electrically and/or physically connected to any one of both ends EP1 and EP2 of each of the light emitting elements LD through the first contact electrode CNE1. However, the present disclosure is not limited thereto. In an embodiment, the first electrode REL1 may be in direct contact with any one of both ends EP1 and EP2 of each of the light emitting elements LD to be electrically and/or physically connected to each of the light emitting elements LD.

Furthermore, as illustrated in FIG. 7, the second electrode REL2 may be electrically and/or physically connected to a remaining one of both ends EP1 and EP2 of each of the light emitting elements LD through the second contact electrode CNE2. However, the present disclosure is not limited thereto. In an embodiment, the second electrode REL2 may be in direct contact with any one of both ends EP1 and EP2 of each of the light emitting elements LD to be electrically and/or physically connected to each of the light emitting elements LD.

Each of the first and second electrodes REL1 and REL2 may function as an alignment electrode for aligning the light emitting elements LD in the emission area EMA of each of the first to third sub-pixels SP1, SP2, and SP3.

Before the light emitting elements LD are aligned in the emission area EMA of each of the first to third sub-pixels SP1, SP2, and SP3, a first alignment voltage may be applied through the first connection line CNL1 to the first electrode REL1, and a second alignment voltage may be applied through the second connection line CNL2 to the second electrode REL2. The first alignment voltage and the second alignment voltage may have different voltage levels. As suitable alignment voltages (e.g., predetermined alignment voltages) having different voltage levels are applied to the first electrode REL1 and the second electrode REL2, respectively, an electric field may be formed between the first electrode REL1 and the second electrode REL2. The light emitting elements LD may be aligned between the first electrode REL1 and the second electrode REL2 by the electric field.

In a plan view, the second electrode REL2 may be provided between the 1-1-th electrode REL1_1 and the 1-2-th electrode REL1_2, and may be spaced (e.g., spaced by a predetermined distance) from each of the 1-1-th electrode REL1_1 and the 1-2-th electrode REL1_2.

After the light emitting elements LD are aligned in the emission area EMA of each of the first to third sub-pixels SP1, SP2, and SP3, each of the first and second electrodes REL1 and REL2 may function as a driving electrode for driving the light emitting elements LD.

Each of the first electrode REL1 and the second electrode REL2 may include a material having reflectivity (e.g., a predetermined reflectivity) so that light emitted from both ends EP1 and EP2 of each of the light emitting elements LD travels in a direction in which an image of the display device is displayed. In an embodiment of the present disclosure, the first electrode REL1, the second electrode REL2, the first connection line CNL1, and the second connection line CNL2 may be provided at the same layer, and may be made of the same material.

Each of the first electrode REL1, the second electrode REL2, the first connection line CNL1, and the second connection line CNL2 may be made of a conductive material reflectivity (e.g., a having predetermined reflectivity). The conductive material may include metal such as Ag, Mg, Al, Pt, Pd, Au, Ni, Nd, Ir, Cr, Ti, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT. The material of each of the first electrode REL1, the second electrode REL2, the first connection line CNL1, and the second connection line CNL2 is not limited to the above-described materials.

Furthermore, each of the first electrode REL1, the second electrode REL2, the first connection line CNL1, and the second connection line CNL2 may be formed of a single layer, but the present disclosure is not limited thereto. In an embodiment, each of the first electrode REL1, the second electrode REL2, the first connection line CNL1, and the second connection line CNL2 may be formed as a multilayer structure in which two or more of metals, alloys, conductive oxides, and conductive polymers are stacked. Each of the first electrode REL1, the second electrode REL2, the first connection line CNL1, and the second connection line CNL2 may be formed in a multilayer structure having at least two layers so as to reduced or minimize a voltage drop due to signal delay when a signal is transmitted to both ends EP1 and EP2 of each of the light emitting elements LD. When each of the first electrode REL1, the second electrode REL2, the first connection line CNL1, and the second connection line CNL2 is formed in the multilayer structure, each of the first electrode REL1, the second electrode REL2, the first connection line CNL1, and the second connection line CNL2 may include first to third conductive layers that are sequentially stacked, for example. Here, the first conductive layer may be formed of ITO, the second conductive layer may be formed of Ag, and the third conductive layer may be formed of ITO. However, the present disclosure is not limited thereto. According to an embodiment, materials of each of the first to third conductive layers may be changed in any way.

In an embodiment of the present disclosure, each of the first electrode REL1 and the second electrode REL2 may be provided and/or formed on the partition wall PW to have a shape corresponding to the shape of the partition wall PW. Thus, light emitted from both ends EP1 and EP2 of each of the light emitting elements LD may be reflected by the first electrode REL1 and the second electrode REL2 to further move in the display direction of the display device. Consequently, the efficiency of light emitted from each of the light emitting elements LD may be further enhanced.

In an embodiment of the present disclosure, the partition wall PW, the first electrode REL1, and the second electrode REL2 may serve as a reflective member that causes light emitted from each of the light emitting elements LD to travel in the display direction of the display device, thus improving the light emission efficiency of the light emitting elements LD.

Any one of the first and second electrodes REL1 and REL2 may be an anode electrode, and the other one may be a cathode electrode. In an embodiment of the present disclosure, the first electrode REL1 may be an anode electrode, and the second electrode REL2 may be a cathode electrode.

In the above-described embodiment, the first electrode REL1 is configured to include two electrodes branched from the first connection line CNL1 along the second direction DR2, for example, the 1-1-th electrode REL1_1 and the 1-2-th electrode REL1_2. However, the present disclosure is not limited thereto. In an embodiment, the first electrode REL1 may include at least one electrode branched from the first connection line CNL1 in the second direction DR2.

A first contact electrode CNE1 may be provided on the first electrode REL1 to stably electrically and/or physically connect the first electrode REL1 and one of both ends EP1 and EP2 of each of the light emitting elements LD.

The first contact electrode CNE1 may be made of a transparent conductive material so that light emitted from each of the light emitting elements LD and reflected to the display direction of the display device by the first electrode REL1 may move in the display direction without loss. The first contact electrode CNE1 may cover the first electrode REL1 and overlap with the first electrode REL1 REL1 in the thickness direction of the substrate SUB. Furthermore, the first contact electrode CNE1 may cover and overlap with one of both ends EP1 and EP2 of each of the light emitting elements LD. The first contact electrode CNE1 may include a 1-1-th contact electrode CNE1_1 provided and/or formed on the 1-1-th electrode REL1_1, and a 1-2-th contact electrode CNE1_2 provided and/or formed on the 1-2-th electrode REL1_2.

A third insulating layer INS3 may be provided on the first contact electrode CNE1 to cover the first contact electrode CNE1. The third insulating layer INS3 may prevent the first contact electrode CNE1 from being exposed to the outside, thus preventing the first contact electrode CNE1 from being corroded. The third insulating layer INS3 may include an inorganic insulating layer made of inorganic material or an organic insulating layer made of organic material. Although the third insulating layer INS3 may be formed of a single layer as shown in the drawing, the present disclosure is not limited thereto. In an embodiment, the third insulating layer INS3 may be formed in a multilayer structure. When the third insulating layer INS3 is formed in the multilayer structure, the third insulating layer INS3 may have a structure formed by alternately stacking at least one inorganic insulating layer or at least one organic insulating layer.

A second contact electrode CNE2 may be provided on the second electrode REL2 to stably electrically and/or physically connect the second electrode REL2 and a remaining one of both ends EP1 and EP2 of each of the light emitting elements LD. In a plan view, the second contact electrode CNE2 may cover the second electrode REL2 and overlap with the second electrode REL2 in the thickness direction of the substrate SUB. Furthermore, the second contact electrode CNE2 may overlap with a remaining one of both ends EP1 and EP2 of each of the light emitting elements LD. The second contact electrode CNE2 may be made of the same material as that of the first contact electrode CNE1, but the present disclosure is not limited thereto.

A fourth insulating layer INS4 may be provided on the second contact electrode CNE2 to cover the second contact electrode CNE2. The fourth insulating layer INS4 may prevent the second contact electrode CNE2 from being exposed to the outside, thus preventing the second contact electrode CNE2 from being corroded. The fourth insulating layer INS4 may be formed of either of an inorganic insulating layer or an organic insulating layer.

An overcoat layer OC may be provided on the fourth insulating layer INS4. The overcoat layer OC may be an encapsulation layer that reduces steps generated by the partition wall PW disposed under the overcoat layer, the first and second electrodes REL1 and REL2, and the first and second contact electrodes CNE1 and CNE2, and prevents oxygen and moisture from entering the light emitting elements LD. In an embodiment, the overcoat layer OC may be omitted in consideration of the design conditions of the display device and the like.

In an embodiment, a capping layer CPL may be formed and/or provided in the emission area EMA of each sub-pixel.

The capping layer CPL may be disposed between the first electrode REL1 and the first contact electrode CNE1 and between the second electrode REL2 and the second contact electrode CNE2, respectively. The capping layer CPL may prevent damage to a corresponding electrode due to failure occurring during a manufacturing process of the display device, and may further enhance adhesion between the corresponding electrode and the passivation layer PSV. The capping layer CPL may be formed of a transparent conductive material such as indium zinc oxide (IZO) to reduce or minimize loss of light that is emitted from each of the light emitting elements LD and then is reflected in the display direction of the display device by the corresponding electrode.

Each of the light emitting elements LD may be a light emitting diode that is made of material having an inorganic crystal structure and has a subminiature size, e.g., corresponding to a range from a nanometer scale to a micrometer scale.

In an embodiment of the present disclosure, the light emitting elements LD may include first light emitting elements LD1 and second light emitting elements LD2. The first light emitting elements LD1 may be aligned between the 1-1-th electrode REL1_1 and the second electrode REL2 in the emission area EMA of each sub-pixel, and the second light emitting elements LD2 may be aligned between the second electrode REL2 and the 1-2-th electrode REL1_2 in the emission area EMA of each sub-pixel.

As illustrated in FIGS. 9A and 9b, each of the light emitting elements LD may include an emission stacked pattern 10 formed by sequentially stacking a first conductive semiconductor layer 11, an active layer 12, a second conductive semiconductor layer 13, and an electrode layer 15 in the longitudinal direction L of each light emitting element LD, and an insulating film 14 surrounding the outer surface (e.g., outer peripheral or circumferential surface) (or surface) of the emission stacked pattern 10. In this case, the first conductive semiconductor layer 11, the active layer 12, the second conductive semiconductor layer 13, and the electrode layer 15, which are successively stacked in the longitudinal direction L of each light emitting element LD, may have different thicknesses. In an embodiment of the present disclosure, the thickness d1 of the first conductive semiconductor layer 11 may be substantially equal or similar to the sum of the thickness d2 of the active layer 12, the thickness d3 of the second conductive semiconductor layer 13, and the thickness d4 of the electrode layer 15. The longitudinal direction L of each light emitting element LD may be the first direction DR1 in a plan view, and may be a horizontal direction in a sectional view.

In an embodiment, as illustrated in FIG. 10, each of the light emitting elements LD may include an emission stacked pattern 10 formed by sequentially stacking a first conductive semiconductor layer 11, an active layer 12, and a second conductive semiconductor layer 13 in the longitudinal direction L of each light emitting element LD, and an insulating film 14 surrounding the outer surface (e.g., outer peripheral or circumferential surface) (or surface) of the emission stacked pattern 10. In this case, the first conductive semiconductor layer 11, the active layer 12, and the second conductive semiconductor layer 13 that are successively stacked in the longitudinal direction L of each light emitting element LD, may have different thicknesses. In an embodiment of the present disclosure, the thickness d1 of the first conductive semiconductor layer 11 may be substantially equal or similar to the sum of the thickness d2 of the active layer 12 and the thickness d3 of the second conductive semiconductor layer 13. The longitudinal direction L of each light emitting element LD may be the first direction DR1 in a plan view, and may be a horizontal direction in a sectional view.

Each of the light emitting elements LD may have a first end EP1 and a second end EP2 in the longitudinal direction L.

As illustrated in FIGS. 9A and 9b, the first conductive semiconductor layer 11 may be disposed in the first end EP1 of each light emitting element LD, and the electrode layer 15 may be disposed in the second end EP2 thereof. In an embodiment, as illustrated in FIG. 10, the first conductive semiconductor layer 11 may be disposed in the first end EP1 of each light emitting element LD, and the second conductive semiconductor layer 13 may be disposed in the second end EP2 thereof.

Each light emitting element LD may include a first area I and a second area II. The first area I and the second area II of each light emitting element LD may be divided based on the lower surface 12a of the active layer 12 that is in contact with the upper surface 11b of the first conductive semiconductor layer 11 in the longitudinal direction L of the light emitting element LD.

The first area I of each light emitting element LD may refer to an area extending from the lower surface 11a of the first conductive semiconductor layer 11 to the lower surface 12a of the active layer 12 in the longitudinal direction L of each light emitting element LD. The first conductive semiconductor layer 11 may be positioned in the first area I. As described above, because the first conductive semiconductor layer 11 is positioned in the first area I, the width of the first area I in the longitudinal direction L of each light emitting element LD may be substantially equal to the thickness d1 of the first conductive semiconductor layer 11.

As illustrated n FIGS. 9A and 9b, the second area II of each light emitting element LD may refer to an area extending from the lower surface 12a of the active layer 12 to the upper surface 15b of the electrode layer 15 in the longitudinal direction L of each light emitting element LD. The active layer 12, the second conductive semiconductor layer 13, and the electrode layer 15 may be positioned in the second area II. Because the active layer 12, the second conductive semiconductor layer 13, and the electrode layer 15 are positioned in the second area II, the width of the second area II in the longitudinal direction L of each light emitting element LD may be substantially the same as the sum of the thickness d2 of the active layer 12, the thickness d3 of the second conductive semiconductor layer 13, and the thickness d4 of the electrode layer 15.

In an embodiment, as illustrated in FIG. 10, the second area II of each light emitting element LD may refer to an area extending from the lower surface 12a of the active layer 12 to the upper surface 13b of the second conductive semiconductor layer 13 in the longitudinal direction L of each light emitting element LD. In this case, the active layer 12 and the second conductive semiconductor layer 13 may be positioned in the second area II. Because the active layer 12 and the second conductive semiconductor layer 13 are positioned in the second area II, the width of the second area II in the longitudinal direction L of each light emitting element LD may be substantially the same as the sum of the thickness d2 of the active layer 12 and the thickness d3 of the second conductive semiconductor layer 13.

In an embodiment of the present disclosure, when seen in a sectional view, the upper surface 12b of the active layer 12 may not be positioned at a point corresponding to a half of the length L of each light emitting element LD. Similarly, when seen in a sectional view, the upper surface 12b of the active layer 12 may not be positioned at a point corresponding to a half of the length L of the emission stacked pattern 10 of each light emitting element LD. When seen in a sectional view, as illustrated in FIGS. 9A and 9b, a ratio of a distance from the upper surface 12b of the active layer 12 to the upper surface 15b of the electrode layer 15 to the length L of each light emitting element LD may be 0.5 or less. In other words, when seen in a sectional view, a sum of the thickness d3 of the second conductive semiconductor layer 13 and the thickness d4 of the electrode layer 15 in the longitudinal direction L of each light emitting element LD may be equal to or less than a half of the length L of each light emitting element LD. In an embodiment, as illustrated in FIG. 10, when seen in a sectional view, a ratio of a distance from the upper surface 12b of the active layer 12 to the upper surface 13b of the second conductive semiconductor layer 13 to the length L of each light emitting element LD may be 0.5 or less. In other words, when seen in a sectional view, the thickness d3 of the second conductive semiconductor layer 13 in the longitudinal direction L of each light emitting element LD may be equal to or less than a half of the length L of each light emitting element LD.

In an embodiment of the present disclosure, a point corresponding to the half of the length L of each light emitting element LD may be positioned between the lower surface 12a of the active layer 12 and the upper surface 12b of the active layer 12, but the present disclosure is not limited thereto.

In a sectional view, when the sum of the thickness d3 of the second conductive semiconductor layer 13 and the thickness d4 of the electrode layer 15 is equal to or less than a half of the length L of each light emitting element LD as illustrated in FIGS. 9A and 9B, or the thickness d3 of the second conductive semiconductor layer 13 is equal to or less than a half of the length L of each light emitting element LD as illustrated in FIG. 10, the active layer 12 in the longitudinal direction L of each light emitting element LD may be located in the middle (or center) of each light emitting element LD or be located adjacent to the middle (or center) of each light emitting element LD. In this case, light emitted from the active layer 12 of each light emitting element LD may travel uniformly (or evenly) to both ends EP1 and EP2 of each light emitting element LD without being biased in one direction. Thus, the intensity of the light emitted from both ends EP1 and EP2 of each light emitting element LD becomes uniform, so that the light emission efficiency of each light emitting element LD may be enhanced.

A suitable voltage (e.g., a predetermined voltage) may be applied to both ends EP1 and EP2 of each of the light emitting elements LD through the first electrode REL1 and the second electrode REL2. Thus, each of the light emitting elements LD may emit light while electron-hole pairs are combined in the active layer 12 of each of the light emitting elements LD. Here, the active layer 12 may emit light having a wavelength range of 400 nm to 900 nm.

A first insulating layer INS1 may be provided between each light emitting element LD and the passivation layer PSV.

The first insulating layer INS1 may be formed and/or provided under each of the light emitting elements LD between the first electrode REL1 and the second electrode REL2 in the emission area EMA of each sub-pixel. In the emission area EMA of each sub-pixel, the first insulating layer INS1 may fill a space between each of the light emitting elements LD and the passivation layer PSV to stably support the light emitting elements LD, and may prevent the light emitting elements LD from being removed from the passivation layer PSV.

Furthermore, in the emission area EMA of each sub-pixel, the first insulating layer INS1 may expose an area of the first electrode REL1 and cover areas other than the area, thus protecting the other areas of the first electrode REL1. Furthermore, the first insulating layer INS1 may expose an area of the second electrode REL2 and cover areas other than the area, thus protecting the other areas of the second electrode REL2. Here, when the display element layer DPL of each sub-pixel includes the first and second contact electrodes CNE1 and CNE2, an area of the first electrode REL1 may refer to an area where it electrically and/or physically comes into contact with the first contact electrode CNE1, and an area of the second electrode REL2 may refer to an area where it electrically and/or physically comes into contact with the second contact electrode CNE2.

In addition, the first insulating layer INS1 may be formed and/or provided on each of the first connection line CNL1 and the second connection line CNL2 in the peripheral area PPA of each sub-pixel to cover the first and second connection lines CNL1 and CNL2 and protect the first and second connection lines CNL1 and CNL2.

The first insulating layer INS1 may include an inorganic insulating layer made of inorganic material or an organic insulating layer made of organic material. In an embodiment of the present disclosure, the first insulating layer INS1 may be formed of the inorganic insulating layer that is suitable to protect the light emitting elements LD from the pixel circuit layer PCL, but the present disclosure is not limited thereto. In an embodiment, the first insulating layer INS1 may be formed of the organic insulating layer that is suitable to planarize a support surface of the light emitting elements LD.

In the emission area EMA of each sub-pixel, the second insulating layer INS2 may be provided on each light emitting element LD.

The second insulating layer INS2 may be provided on each light emitting element LD to cover a portion of a surface of each light emitting element LD and expose both ends EP1 and EP2 of each light emitting element LD to the outside. For example, the second insulating layer INS2 may include an inorganic insulating layer containing an inorganic material or an organic insulating layer including an organic material, and may fix each of the light emitting elements LD aligned in the emission area EMA of each of the first to third sub-pixels SP1, SP2, and SP3. In an embodiment of the present disclosure, the second insulating layer INS2 may include an inorganic insulating layer that is suitable to protect the active layer 12 of each light emitting element LD from external oxygen or moisture. However, the present disclosure is not limited to this. The second insulating layer INS2 may include an organic insulating layer containing organic material depending on design conditions of the display device to which each light emitting element LD is applied.

In an embodiment of the present disclosure, after the arrangement of the light emitting elements LD has been completed in the emission area EMA of each sub-pixel, the second insulating layer INS2 is formed on each light emitting element LD so that the light emitting element LD may be prevented from being removed from the arranged position. In some embodiments, when space exists between the first insulating layer INS1 and the light emitting elements LD before the second insulating layer INS2 is formed, the space may be filled with the second insulating layer INS2 in the process of forming the second insulating layer INS2. Consequently, the light emitting elements LD may be reliably supported.

In some embodiments, when the second insulating layer INS2 is formed, a portion of the insulating film 14 of each light emitting element LD is detached as illustrated in FIG. 9B, so that a portion of the outer surface (e.g., outer peripheral or circumferential surface) (or surface) of the emission stacked pattern 10 may be exposed to the outside. When the active layer 12 of the emission stacked pattern 10 is exposed to the outside, so that the active layer 12 comes into contact with an external conductive material, e.g. the first and/or second contact electrode CNE1 and CNE2, each light emitting element LD is not driven normally.

In an embodiment of the present disclosure, the second insulating layer INS2 may be formed on each light emitting element LD to prevent the active layer 12 of each light emitting element LD from coming into contact with the external conductive material. The second insulating layer INS2 may cover only a portion of a surface of each light emitting element LD, and may expose both ends EP1 and EP2 of each light emitting element LD to the outside.

If the first conductive semiconductor layer 11 in each light emitting element LD occupies ⅔ or more of the length L of each light emitting element LD, the second insulating layer INS2 may expose a portion of the first conductive semiconductor layer 11 and a portion of the second conductive semiconductor layer 13 to the outside without covering a portion of the first conductive semiconductor layer 11 located in the first end EP1 of each light emitting element LD and a portion of the second conductive semiconductor layer 13 located in the second end EP2 of each light emitting element LD (see, for example, FIG. 10). When the first conductive semiconductor layer 11 in each light emitting element LD occupies ⅔ or more of the length L of each light emitting element LD, the first conductive semiconductor layer 11 may also be located in the second end EP2 (e.g., extends from the first end EP1 to more than halfway point) of each light emitting element LD.

In this case, when the insulating film 14 is detached in the second end EP2 of each light emitting element LD in the process of forming the second insulating layer INS2, the second conductive semiconductor layer 13, the active layer 12, and the first conductive semiconductor layer 11 located in the second end EP2 of each light emitting element LD may be exposed to the outside. If the insulating film 14 is detached from the second end EP2 of each light emitting element LD when the electrode layer 15 is located in the second end EP2 of each light emitting element LD (see, for example, FIG. 9B), the electrode layer 15, the second conductive semiconductor layer 13, the active layer 12, and the first conductive semiconductor layer 11 located in the second end EP2 of each light emitting element LD may be exposed to the outside. When the second contact electrode CNE2 is formed on the second conductive semiconductor layer 13 through a subsequent process, the second contact electrode CNE2 may be electrically connected to the second conductive semiconductor layer 13 exposed to the outside as well as the active layer 12 and the first conductive semiconductor layer 11. Thus, the first conductive semiconductor layer 11 and the second conductive semiconductor layer 13 of each light emitting element LD are electrically connected to each other, so that a short-circuit failure occurs, and thereby each light emitting element LD is not normally driven.

Thus, in an embodiment of the present disclosure, the active layer 12 of each light emitting element LD may be located in the middle (or center) of each light emitting element LD or be located adjacent to the middle (or center) of each light emitting element LD, thus causing only one conductive semiconductor layer to correspond to each of both ends EP1 and EP2 of each light emitting element LD, and thereby preventing short-circuit failure caused by the detachment of the insulating film 14.

Figure 12:
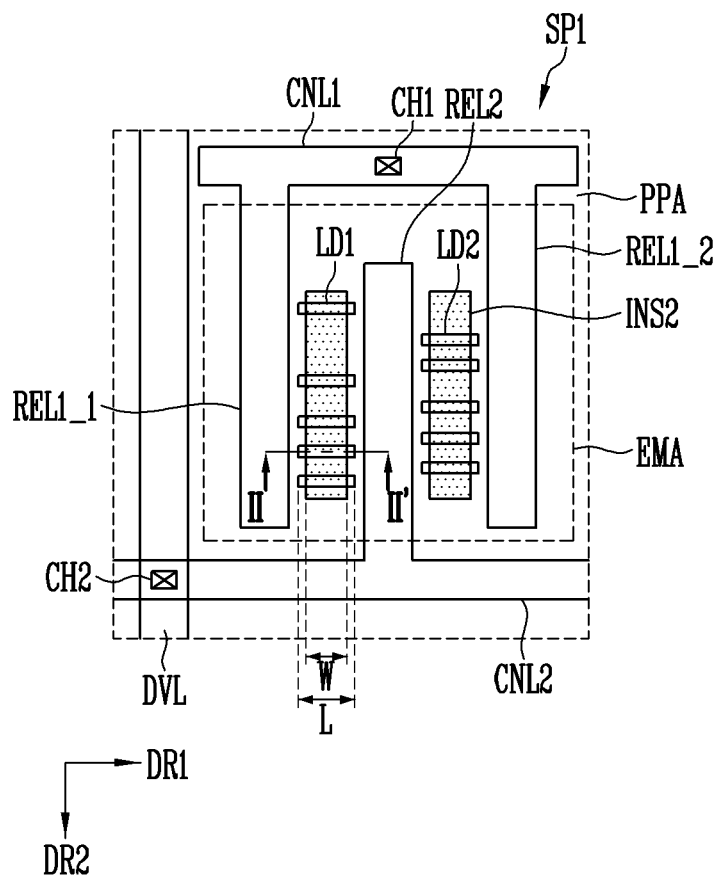
FIG. 12 shows the first sub-pixel of FIG. 7, and is a schematic plan view of the first sub-pixel including only some components of a display element layer.
Figure 13:
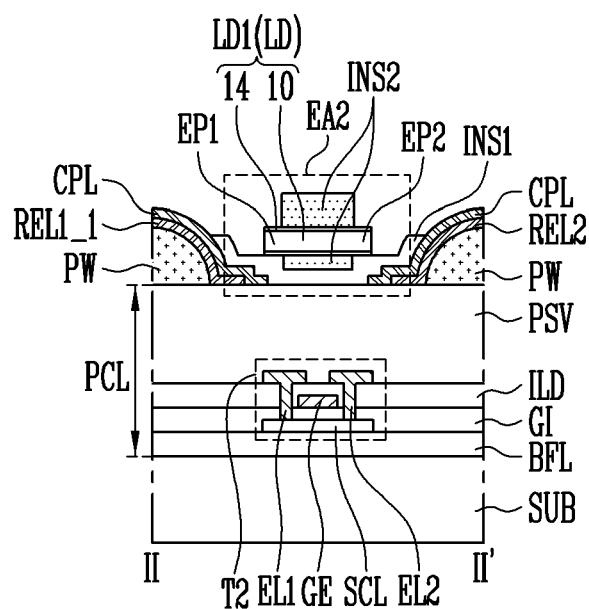
FIG. 13 is a sectional view taken along the line II-II' of FIG. 12.
Figure 14:
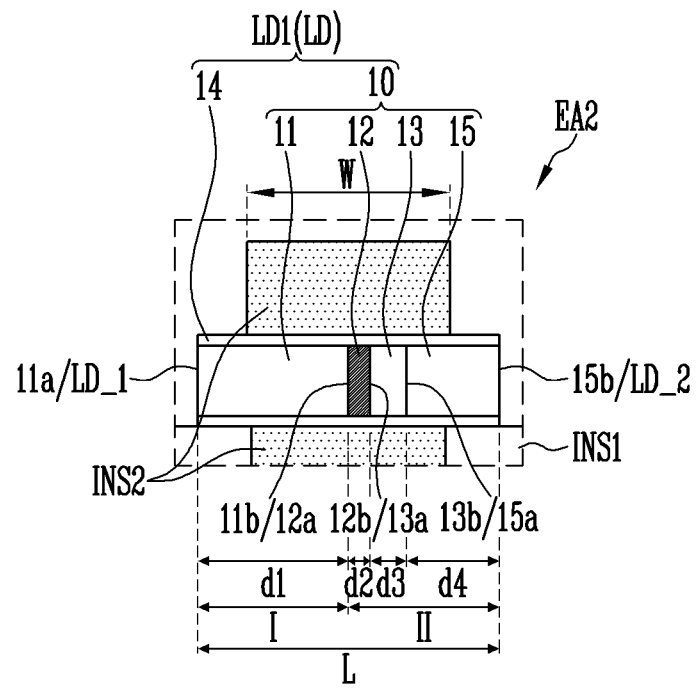
FIG. 14 is an enlarged sectional view of portion EA2 of FIG. 13.
Figure 15:
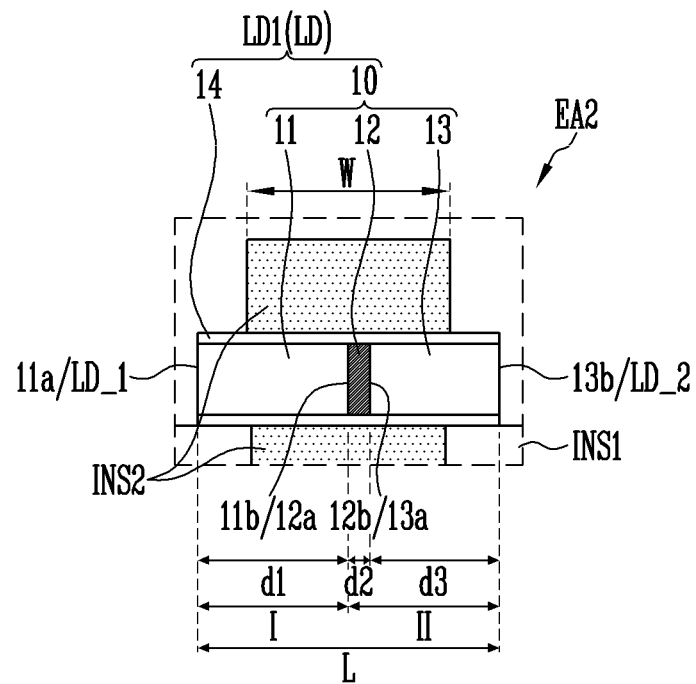
FIG. 15 shows a portion of the display element layer including the light emitting element illustrated in FIG. 3A, and is an enlarged sectional view corresponding to portion EA2 of FIG. 13.

FIG. 12 shows the first sub-pixel of FIG. 7 and is a schematic plan view of the first sub-pixel including only some components of a display element layer, FIG. 13 is a sectional diagram taken along the line II-II' of FIG. 12, FIG. 14 is an enlarged sectional view of portion EA2 of FIG. 13, and FIG. 15 shows a portion of the display element layer including the light emitting element illustrated in FIG. 3A, and is an enlarged sectional view corresponding to portion EA2 of FIG. 13.

For convenience, FIG. 12 illustrates only a driving voltage line, first and second electrodes, first and second connection lines, and a second insulating layer.

In addition, although FIGS. 12-15 more simply illustrate the structure of a first sub-pixel, e.g., illustrating that each electrode is formed of a single electrode layer and each insulating layer is formed of a single insulating layer, the present disclosure is not limited thereto.

To avoid redundant explanation, the description of the first sub-pixel of FIGS. 12-15 will be focused on differences from that of the foregoing embodiments. Components that are not separately explained in the following description of the present embodiment comply with that of the foregoing embodiments. The same reference numeral will be used to designate the same component, and a similar reference numeral will be used to designate a similar component.

Referring to FIGS. 5, 7, 8, and 12-15, the first sub-pixel SP1 in accordance with an embodiment of the present disclosure may include the substrate SUB having the emission area EMA and the peripheral area PPA. Furthermore, the first sub-pixel SP1 may include a pixel circuit layer PCL provided on the substrate SUB, and a display element layer DPL provided on the pixel circuit layer PCL.

As illustrated in FIG. 14, each of the light emitting elements LD may include an emission stacked pattern 10 formed by sequentially stacking a first conductive semiconductor layer 11, an active layer 12, a second conductive semiconductor layer 13, and an electrode layer 15 in the longitudinal direction L of each light emitting element LD, and an insulating film 14 surrounding the outer surface (e.g., outer peripheral or circumferential surface) (or surface) of the emission stacked pattern 10. In an embodiment, as illustrated in FIG. 15, each of the light emitting elements LD may include an emission stacked pattern 10 formed by sequentially stacking a first conductive semiconductor layer 11, an active layer 12, and a second conductive semiconductor layer 13 in the longitudinal direction L of each light emitting element LD, and an insulating film 14 surrounding the outer surface (e.g., outer peripheral or circumferential surface) (or surface) of the emission stacked pattern 10.

The display element layer DPL may include a partition wall PW, first and second electrodes REL1 and REL2, a capping layer CPL, light emitting elements LD, and at least one insulating layer.

In an embodiment of the present disclosure, at least one insulating layer may include a first insulating layer INS1 and a second insulating layer INS2. However, the present disclosure is not limited thereto. The at least one insulating layer may further include third and fourth insulating layers INS3 and INS4 that are sequentially stacked on the second insulating layer INS2 (see, for example, FIG. 11).

The first insulating layer INS1 may fill space between each of the light emitting elements LD and the pixel circuit layer PCL in the emission area EMA of the first sub-pixel SP1, thus reliably supporting the light emitting elements LD.

The second insulating layer INS2 may overlap the light emitting elements LD in the emission area EMA, and may expose both ends EP1 and EP2 of each light emitting element LD. In a plan view, the width W of the second insulating layer INS2 in the horizontal direction, e.g. the first direction DR1 may be smaller than the length L of each light emitting element LD. The width W of the second insulating layer INS2 in the horizontal direction may be the same as the thickness d1 of the first conductive semiconductor layer 11 of each light emitting element LD. In an embodiment, the width W of the second insulating layer INS2 in the horizontal direction may be smaller than the thickness d1 of the first conductive semiconductor layer 11 of each light emitting element LD.

In an embodiment of the present disclosure, the width W of the second insulating layer INS2 in the horizontal direction may be changed in any way within a range where only one conductive semiconductor layer corresponding to each of both ends EP1 and EP2 of each light emitting element LD, respectively, may be exposed to the outside and may sufficiently cover the active layer 12 of each light emitting element LD. For example, as illustrated in FIG. 14, the second insulating layer INS2 may have the horizontal width W of 3.5 μm or less, for example, so as to cover the active layer 12 located in the middle (or center) in the longitudinal direction L of each light emitting element LD while exposing, to the outside, a portion of the first conductive semiconductor layer 11 and a portion of the electrode layer 15 that are correspondingly located in the first and second ends EP1 and EP2 of each light emitting element LD. In an embodiment, as illustrated in FIG. 15, the second insulating layer INS2 may have the horizontal width W of 3.5 μm or less, for example, so as to cover the active layer 12 located in the middle (or center) in the longitudinal direction L of each light emitting element LD while exposing, to the outside, a portion of the first conductive semiconductor layer 11 and a portion of the second conductive semiconductor layer 13 that are correspondingly located in the first and second ends EP1 and EP2 of each light emitting element LD.

Figure 16:
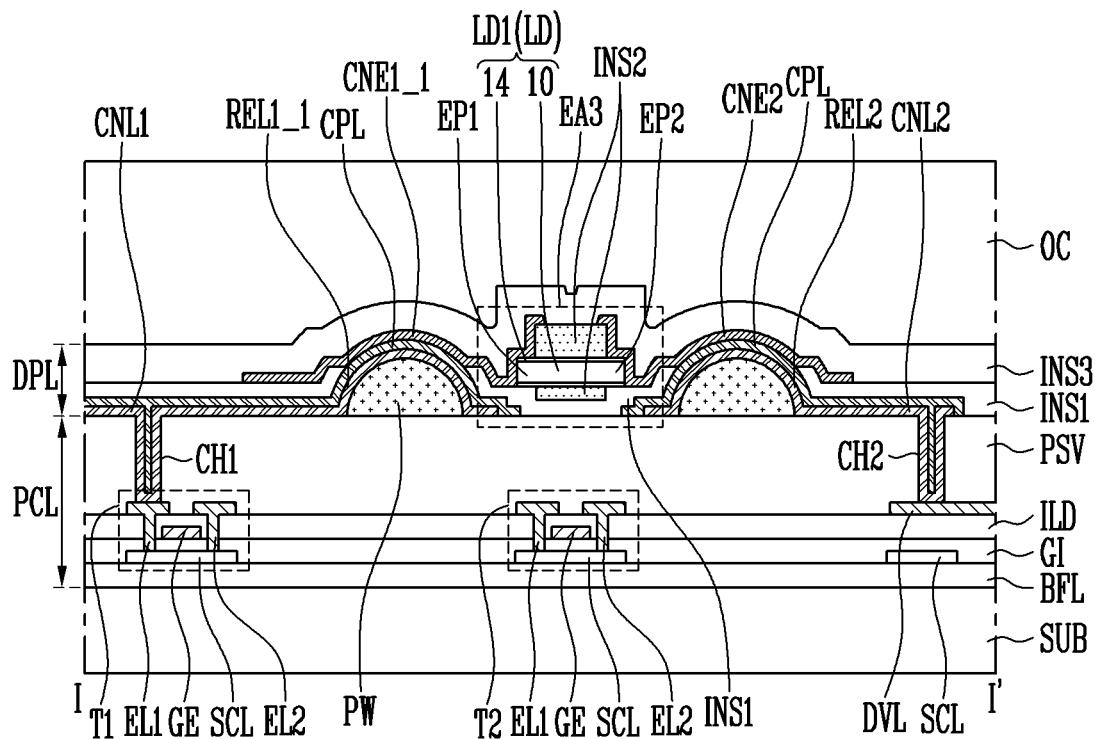
FIG. 16 shows first and second contact electrodes illustrated in FIG. 8 in accordance with another embodiment, and is a sectional view taken along the line I-I' of FIG. 7.
Figure 17:
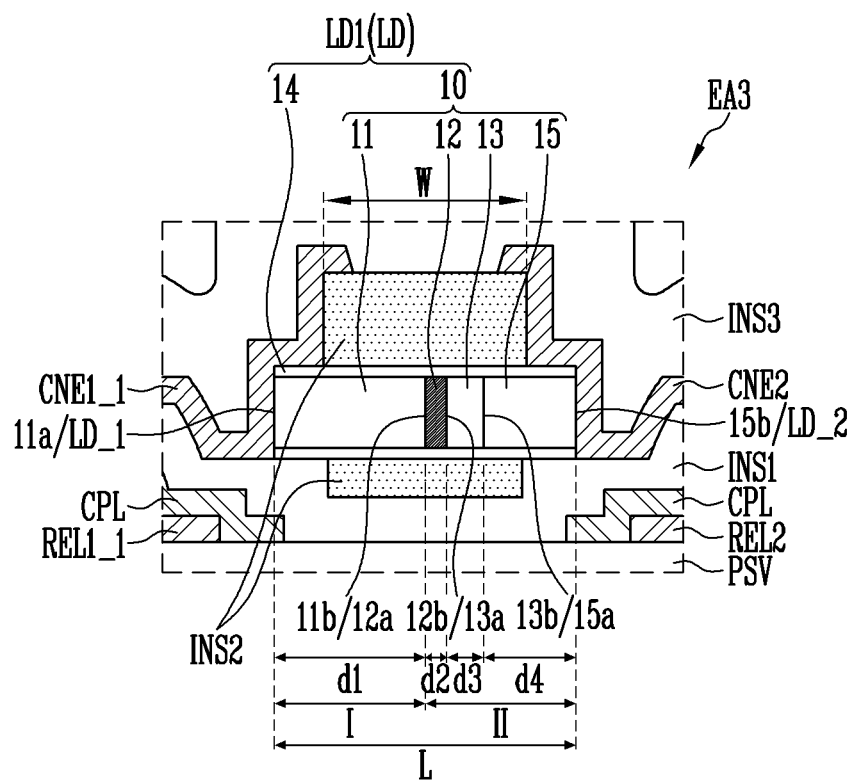
FIG. 17 is an enlarged sectional view of portion EA3 of FIG. 16.
Figure 18:
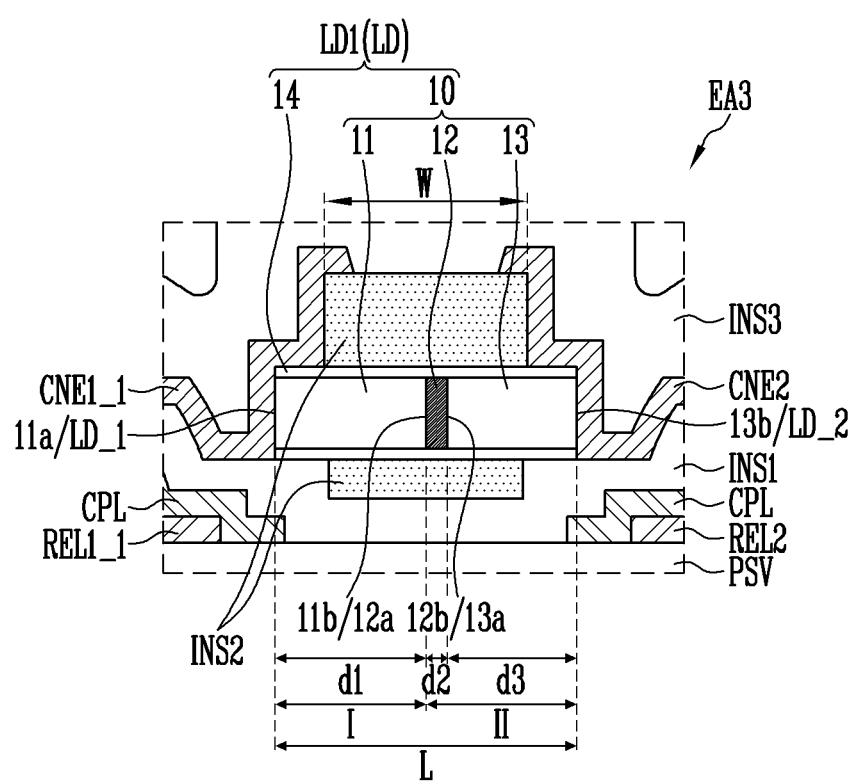
FIG. 18 shows a portion of the display element layer including the light emitting element illustrated in FIG. 3A, and is an enlarged sectional view corresponding to portion EA3 of FIG. 16.

FIG. 16 shows first and second contact electrodes illustrated in FIG. 8 in accordance with another embodiment, and is a sectional view taken along the line I-I' of FIG. 7, FIG. 17 is an enlarged sectional view of portion EA3 of FIG. 16, and FIG. 18 shows a portion of the display element layer including the light emitting element illustrated in FIG. 3A, and is an enlarged sectional view corresponding to portion EA3 of FIG. 16.

The display device illustrated in FIG. 16 may have a configuration that is substantially the same as or similar to that of the display device illustrated in FIG. 8 except that the first contact electrode CNE1 and the second contact electrode CNE2 are provided at the same layer.

Therefore, to avoid redundant explanation, the description of the display device of FIGS. 16-18 will be focused on differences from that of the foregoing embodiments. Components that are not separately explained in the following description of the embodiment of the present disclosure comply with that of the foregoing embodiments. The same reference numeral will be used to designate the same component, and a similar reference numeral will be used to designate a similar component.

Although FIGS. 16-18 illustrate only one first light emitting element LD1 aligned between the 1-1-th electrode REL1_1 and the second electrode REL2 among the light emitting elements, one first light emitting element LD1 will be described on behalf of the plurality of light emitting elements, for convenience.

In addition, although FIGS. 16-18 simply illustrate the structure of the display device, e.g., illustrating that each electrode is formed of a single insulating layer and each insulating layer is formed of a single electrode layer, the present disclosure is not limited thereto.

Referring to FIGS. 5, 7, and 16-18, the display device in accordance with another embodiment of the present disclosure may include a substrate SUB on which a plurality of pixels PXL is provided. Each of the pixels PXL may include first to third sub-pixels SP1, SP2, and SP3.

Each of the first to third sub-pixels SP1, SP2, and SP3 may include an emission area EMA that emits light, and a peripheral area PPA that is positioned around the emission area EMA. Further, each of the first to third sub-pixels SP1, SP2, and SP3 may include a pixel circuit layer PCL provided on the substrate SUB, and a display element layer DPL provided on the pixel circuit layer PCL.

The pixel circuit layer PCL of each of the first to third sub-pixels SP1, SP2, and SP3 may include a driving transistor T1 and a switching transistor T2 provided on the substrate SUB, a driving voltage line DVL, and a passivation layer PSV having first and second contact holes CH1 and CH2.

The display element layer DPL of each of the first to third sub-pixels SP1, SP2, and SP3 may include a partition wall PW, first and second connection lines CNL1 and CNL2, first and second electrodes REL1 and REL2, a capping layer CPL, a plurality of light emitting elements LD, and first and second contact electrodes CNE1 and CNE2.

As illustrated in FIG. 17, each of the light emitting elements LD may include an emission stacked pattern 10 formed by sequentially stacking a first conductive semiconductor layer 11, an active layer 12, a second conductive semiconductor layer 13, and an electrode layer 15 in the longitudinal direction L of each light emitting element LD, and an insulating film 14 surrounding the outer surface (e.g., outer peripheral or circumferential surface) (or surface) of the emission stacked pattern 10. In an embodiment, as illustrated in FIG. 18, each of the light emitting elements LD may include an emission stacked pattern 10 formed by sequentially stacking a first conductive semiconductor layer 11, an active layer 12, and a second conductive semiconductor layer 13 in the longitudinal direction L of each light emitting element LD, and an insulating film 14 surrounding the outer surface (e.g., outer peripheral or circumferential surface) (or surface) of the emission stacked pattern 10.

In an embodiment of the present disclosure, the active layer 12 may be positioned in the middle (or the center) of each light emitting element LD or may be positioned adjacent to the middle (or the center) of each light emitting element LD in the longitudinal direction L of each light emitting element LD. In this case, light emitted from the active layer 12 of each light emitting element LD may travel uniformly (or evenly) to both ends EP1 and EP2 of each light emitting element LD without being biased in one direction. Thus, the intensity of the light emitted from both ends EP1 and EP2 of each light emitting element LD becomes uniform, so that the light emission efficiency of each light emitting element LD may be enhanced.

In an embodiment of the present disclosure, the first contact electrode CNE1 and the second contact electrode CNE2 may be provided on corresponding electrodes to be electrically and/or physically connected to the corresponding electrodes. For instance, the first contact electrode CNE1 may be provided on the first electrode REL1 to be electrically and/or physically connected to the first electrode REL1. The second contact electrode CNE2 may be provided on the second electrode REL2 to be electrically and/or physically connected to the second electrode REL2. To be more specific, the first contact electrode CNE1 may be directly provided on the capping layer CPL on the first electrode REL1 to be electrically and/or physically connected to the first electrode REL1 through the capping layer CPL. The second contact electrode CNE2 may be directly provided on the capping layer CPL on the second electrode REL2 to be electrically and/or physically connected to the second electrode REL2 through the capping layer CPL.

In an embodiment of the present disclosure, the first contact electrode CNE1 and the second contact electrode CNE2 may be provided at the same plane, and may be spaced from each other on the second insulating layer INS2 to be electrically and/or physically separated from each other. In other words, the first contact electrode CNE1 and the second contact electrode CNE2 may be provided at the same layer and may be formed through the same manufacturing process.

A third insulating layer INS3 may be provided on the first and second contact electrodes CNE1 and CNE2 to cover the first and second contact electrodes CNE1 and CNE2. The third insulating layer INS3 may correspond to the fourth insulating layer INS4 shown in FIG. 8. The third insulating layer INS3 may prevent the first and second contact electrodes CNE1 and CNE2 from being exposed to the outside, thus preventing the first and second contact electrodes CNE1 and CNE2 from being corroded.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical scope of the present disclosure. The scope of the present disclosure may be defined by the accompanying claims and their equivalents.

The invention claimed is:

1. A light emitting element assembly, comprising:
a light emitting element comprising an emission stacked pattern comprising a first semiconductor layer, an active layer, a second semiconductor layer, and an electrode layer that are sequentially stacked in a longitudinal direction of the emission stacked pattern,
an insulating layer on the light emitting element, a width of the insulating layer in the longitudinal direction of the emission stacked pattern is less than or equal to a thickness of the first semiconductor layer in the longitudinal direction of the emission stacked pattern,
wherein the active layer comprises a first surface that is in contact with the first semiconductor layer in the longitudinal direction of the emission stacked pattern, and a second surface that is opposite the first surface and is in contact with the second semiconductor layer,
wherein the first semiconductor layer comprises at least one n-type semiconductor layer, and the second semiconductor layer comprises at least one p-type semiconductor layer,
wherein the first surface of the active layer is located at a point corresponding to −20% to +20% of half of a total length of the emission stacked pattern in the longitudinal direction of the emission stacked pattern,
wherein the electrode layer is thicker than the second semiconductor layer in the longitudinal direction of the emission stacked pattern, and
wherein the electrode layer is thinner than the first semiconductor layer in the longitudinal direction of the emission stacked pattern.

2. The light emitting element assembly according to claim 1, wherein a point corresponding to half of the total length of the emission stacked pattern is located between the first and second surfaces of the active layer.

3. The light emitting element assembly according to claim 2, wherein, in a sectional view, a distance from the first surface of the active layer to an upper surface of the second semiconductor layer is different from a distance from a lower surface of the first semiconductor layer to an upper surface of the first semiconductor layer that is in contact with the first surface of the active layer.

4. The light emitting element assembly according to claim 2, wherein, in a sectional view, a distance from the first surface of the active layer to an upper surface of the electrode layer is the same as a distance from a lower surface of the first semiconductor layer to an upper surface of the first semiconductor layer that is in contact with the first surface of the active layer.

5. The light emitting element assembly according to claim 1, wherein the emission stacked pattern has a shape of a cylinder.

6. The light emitting element assembly according to claim 5, wherein, in a sectional view, a ratio of a distance from the second surface of the active layer to an upper surface of the second semiconductor layer to the total length of the emission stacked pattern is 0.5 or less.

7. The light emitting element assembly according to claim 5,
wherein, in a sectional view, a ratio of a distance from the second surface of the active layer to an upper surface of the electrode layer to the total length of the emission stacked pattern is 0.5 or less.

8. The light emitting element assembly according to claim 1, wherein, in a sectional view, a distance from the first surface of the active layer to an upper surface of the electrode layer is different from a distance from a lower surface of the first semiconductor layer to an upper surface of the first semiconductor layer that is in contact with the first surface of the active layer.

9. The light emitting element assembly according to claim 7, wherein the electrode layer comprises a transparent metal oxide, and has a thickness of 0.5 μm to 1 μm in the longitudinal direction of the emission stacked pattern.

10. The light emitting element assembly according to claim 1, further comprising an insulating film enclosing an outer periphery of the emission stacked pattern.

11. A display device, comprising:
a substrate including a display area and a non-display area; and
a plurality of pixels in the display area of the substrate, and comprising a plurality of sub-pixels, respectively,
wherein each of the sub-pixels comprises a pixel circuit layer comprising at least one transistor, and a display element layer comprising at least one light emitting element that emits light,
wherein the display element layer further comprises:
a first electrode and a second electrode that are spaced from each other in a longitudinal direction of the at least one light emitting element, and
an insulating layer on the at least one light emitting element, the at least one light emitting element having a first end and a second end in the longitudinal direction and connected to each of the first and second electrodes, and wherein the at least one light emitting element comprises:
an emission stacked pattern comprising a first semiconductor layer, an active layer, a second semiconductor layer, and an electrode layer that are sequentially stacked in the longitudinal direction, and the emission stacked pattern being located on the pixel circuit layer; and
an insulating film configured to enclose an outer periphery of the emission stacked pattern,
wherein the active layer comprises a first surface that is in contact with the first semiconductor layer in the longitudinal direction, and a second surface that is opposite the first surface and is in contact with the second semiconductor layer,
wherein the first semiconductor layer comprises at least one n-type semiconductor layer, and the second semiconductor layer comprises at least one p-type semiconductor layer,
wherein the first surface of the active layer is located at a point corresponding to −20% to +20% of half of a total length of the emission stacked pattern in the longitudinal direction,
wherein the electrode layer is thicker than the second semiconductor layer in the longitudinal direction of the emission stacked pattern,
wherein the electrode layer is thinner than the first semiconductor layer in the longitudinal direction of the emission stacked pattern, and
wherein a width of the insulating layer in the longitudinal direction is less than or equal to a thickness of the first semiconductor layer in the longitudinal direction.

12. The display device according to claim 11, wherein, in a sectional view, a distance from the first surface of the active layer to an upper surface of the second semiconductor layer is different from a distance from a lower surface of the first semiconductor layer to an upper surface of the first semiconductor layer that is in contact with the first surface of the active layer.

13. The display device according to claim 11, wherein, in a sectional view, a ratio of a distance from the second surface of the active layer to an upper surface of the second semiconductor layer to the total length of the emission stacked pattern is 0.5 or less.

14. The display device according to claim 11, wherein the electrode layer comprises a transparent metal oxide, and has a thickness of 0.5 µm to 1µm in the longitudinal direction of the emission stacked pattern.

15. The display device according to claim 11, wherein, in a sectional view, a ratio of a distance from the second surface of the active layer to an upper surface of the electrode layer to the total length of the emission stacked pattern is 0.5 or less.

16. The display device according to claim 11, wherein, in a sectional view, a distance from the first surface of the active layer to an upper surface of the electrode layer is different from a distance from a lower surface of the first semiconductor layer to an upper surface of the first semiconductor layer coming into contact with the first surface of the active layer.

17. The display device according to claim 11,
wherein the insulating layer is on the light emitting element to expose the first and second ends of the light emitting element, and
wherein the insulating layer has a width that is equal to or smaller than a distance from a lower surface of the first semiconductor layer to an upper surface of the first semiconductor layer in the longitudinal direction of the light emitting element.

18. The display device according to claim 17, wherein the display element layer further comprises:
a first contact electrode electrically connecting one of the first and second ends of the light emitting element to the first electrode; and
a second contact electrode electrically connecting a remaining one of the first and second ends of the light emitting element to the second electrode, and wherein the first contact electrode and the second contact electrode are on the insulating layer.

* * * * *